US012701688B2

(12) United States Patent
Wang et al.

(10) Patent No.: US 12,701,688 B2
(45) Date of Patent: Aug. 4, 2026

(54) MEMORY STRUCTURE AND METHOD FOR MANUFACTURING THE SAME

(71) Applicant: Taiwan Semiconductor Manufacturing Company, Ltd., Hsinchu (TW)

(72) Inventors: Cheng-Yin Wang, Taipei City (TW); Szuya Liao, Zhubei Hsinchu (TW); Tsung-Kai Chiu, Hsinchu County (TW); Shao-Tse Huang, Hsinchu City (TW); Ting-Yun Wu, Taipei City (TW); Wen-Yuan Chen, Yangmei City (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 606 days.

(21) Appl. No.: 18/182,743

(22) Filed: Mar. 13, 2023

(65) Prior Publication Data

US 2024/0314998 A1     Sep. 19, 2024

(51) Int. Cl.
*H10B 10/00*          (2023.01)
*H10D 30/01*          (2025.01)
(Continued)

(52) U.S. Cl.
CPC ......... *H10B 10/125* (2023.02); *H10D 30/014* (2025.01); *H10D 30/43* (2025.01); (Continued)

(58) Field of Classification Search
CPC ... H10D 84/40–409; H10D 84/80–859; H10D 84/0109; H10D 84/0123–0195; H10D 30/501–509; H10D 30/019–0198; H10D 62/121; H10D 30/43–435; H10D 62/119–123; H10D 30/014; H10D 30/6735; H10B 10/00–18; (Continued)

(56) References Cited

U.S. PATENT DOCUMENTS 9,209,247 B2    12/2015  Colinge et al.
9,236,267 B2    1/2016   De et al.
(Continued)

*Primary Examiner* — Matthew C Landau
*Assistant Examiner* — Nora T. Nix
(74) *Attorney, Agent, or Firm* — McClure, Qualey & Rodack, LLP

(57)          ABSTRACT

A memory structure includes a pull-down transistor and a pull-up transistor stacked vertically in a Z-direction, a pass-gate transistor and a dummy transistor stacked vertically in the Z-direction, a dielectric structure, a connection structure, and a butt contact. The pull-down transistor and the pull-up transistor share a first gate structure. The pass-gate transistor and the dummy transistor share a second gate structure. The dielectric structure is between the first gate structure and the second gate structure in a Y-direction. The connection structure is over and electrically connected to the first gate structure and is over and electrically isolated from the second gate structure. The connection structure is an L-shape in a Y-Z cross-sectional view. The butt contact is directly over the connection structure and the second gate structure. The butt contact is electrically connected to the connection structure and a source/drain feature of the pass-gate transistor.

20 Claims, 49 Drawing Sheets

(51) Int. Cl.

| | |
|---|---|
| *H10D 30/43* | (2025.01) |
| *H10D 30/67* | (2025.01) |
| *H10D 62/10* | (2025.01) |
| *H10D 64/01* | (2025.01) |
| *H10W 20/41* | (2026.01) |

(52) U.S. Cl.
CPC ..... *H10D 30/6735* (2025.01); *H10D 30/6757* (2025.01); *H10D 62/121* (2025.01); *H10D 64/017* (2025.01); *H10W 20/435* (2026.01)

(58) Field of Classification Search
CPC . G11C 11/41–419; G11C 11/411–4125; Y10S 977/938
See application file for complete search history.

(56) References Cited

U.S. PATENT DOCUMENTS

| | | | |
|---|---|---|---|
| 9,412,817 B2 | 8/2016 | Yang et al. | |
| 9,412,828 B2 | 8/2016 | Ching et al. | |
| 9,472,618 B2 | 10/2016 | Oxland | |
| 9,502,265 B1 | 11/2016 | Jiang et al. | |
| 9,520,482 B1 | 12/2016 | Chang et al. | |
| 9,536,738 B2 | 1/2017 | Huang et al. | |
| 9,576,814 B2 | 2/2017 | Wu et al. | |
| 9,608,116 B2 | 3/2017 | Ching et al. | |
| 10,840,146 B1 * | 11/2020 | Paul ................... | H10D 84/038 |

* cited by examiner

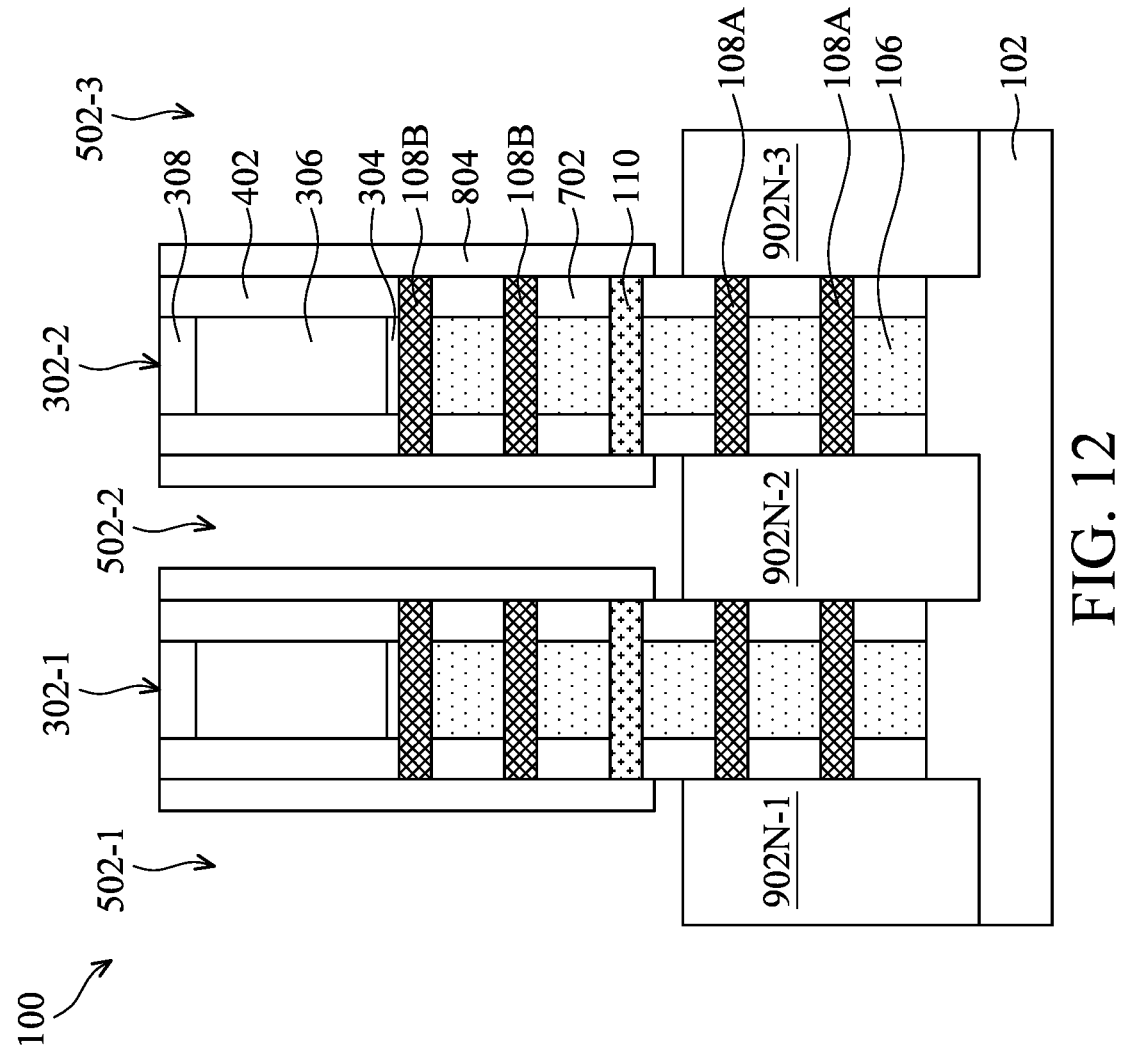
FIG. 12
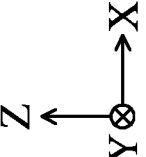

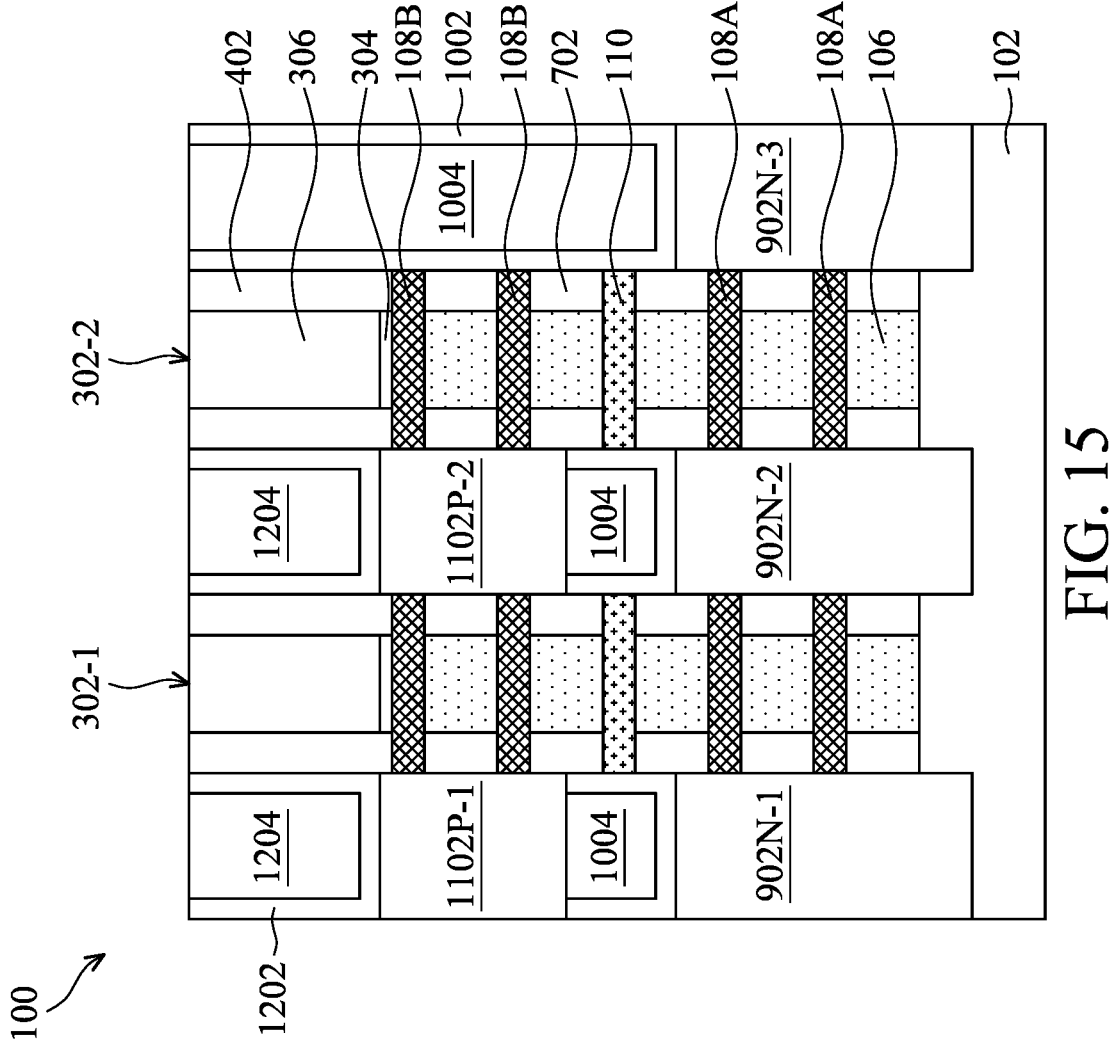
FIG. 15
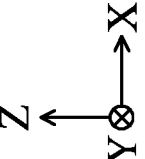

MEMORY STRUCTURE AND METHOD FOR MANUFACTURING THE SAME

BACKGROUND

The semiconductor integrated circuit (IC) industry has experienced exponential growth. Technological advances in IC materials and design have produced generations of ICs where each generation has smaller and more complex circuits than the previous generation. In the course of IC evolution, functional density (i.e., the number of interconnected devices per chip area) has generally increased while geometry size (i.e., the smallest component (or line) that can be created using a fabrication process) has decreased. This scaling down process generally provides benefits by increasing production efficiency and lowering associated costs. Such scaling down has also increased the complexity of processing and manufacturing ICs and, for these advancements to be realized, similar developments in IC processing and manufacturing are needed.

Complementary field effect transistors (CFETs) may be utilized to increase the density of transistors in an IC. A CFET may include an N-type transistor and a P-type transistor stacked vertically. Static random access memory (SRAM) cells may be formed utilizing CFETs. The layout area or footprint of such SRAM cells is reduced with respect to non-CFET layouts of SRAM cells.

However, although existing technologies for SRAM constructed by CFETs have been generally adequate for their intended purposes, they have not been entirely satisfactory in all respects.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 8, 9, 10, 11, 12, 13, 14, and 15 are X-Z cross-sectional views of the SRAM cell at various fabrication stages along a line A-A' of FIG. 5, in accordance with some embodiments of the present disclosure.

DETAILED DESCRIPTION

Figure 1:
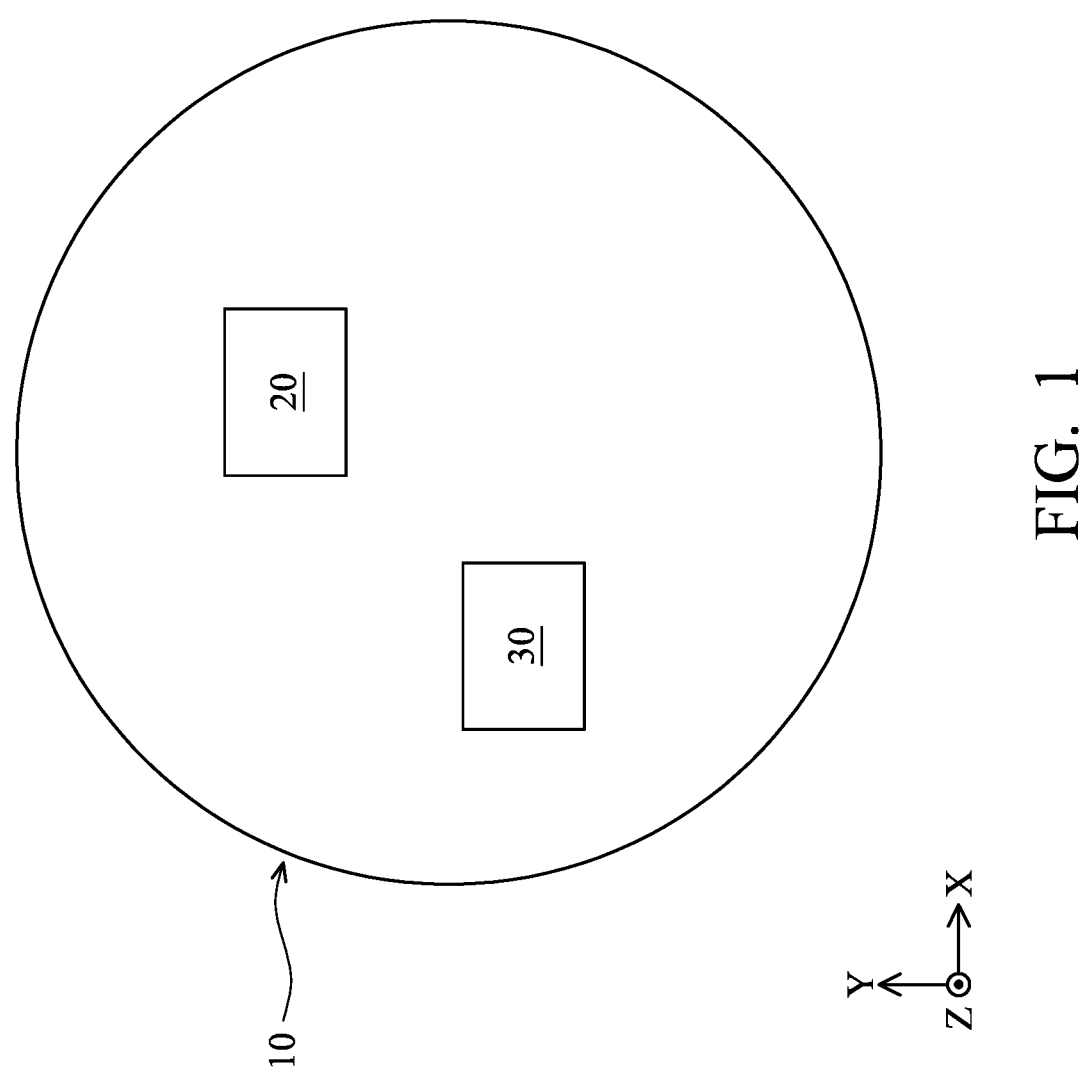
FIG. 1 is a fragmentary diagrammatic top view of an integrated circuit (IC) chip, in portion or entirety, in accordance with some embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

The present disclosure is generally related to semiconductor devices, and more particularly to static random access memory (SRAM) cell with field-effect transistors (FETs), such as three-dimensional complementary field effect transistors (CFETs) with gate-all-around (GAA) structures. Generally, a CFET may include a n-type FET (NFET) and a p-type FET (PFET) disposed vertically with a plurality of vertically stacked sheets (e.g., nanosheets), wires (e.g., nanowires), or rods (e.g., nanorods) in a channel region of the CFET, thereby allowing better gate control, lowered leakage current, and improved scaling capability for various IC applications. While existing technologies for fabricating CFETs have been generally adequate for their intended applications, they have not been entirely satisfactory in all aspects.

The gate-all-around (GAA) structures may be patterned by any suitable method. For example, the structures may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer is formed over a substrate and patterned using a photolithography process. Spacers are formed alongside the patterned sacrificial layer using a self-aligned process. The sacrificial layer is then removed, and the remaining spacers may then be used to pattern the GAA structure.

Embodiments of the present disclosure offer advantages over the existing art, though it is understood that other embodiments may offer different advantages, not all advantages are necessarily discussed herein, and no particular advantage is required for all embodiments. For example, embodiments discussed herein include methods and structures including connection structures that enable butt contacts to be formed over gate structures of pass-gate transistors in an SRAM cell constructed by CFETs, thereby decreasing layout area or footprint of the SRAM cell. The details of the structure and fabrication methods of the present disclosure are described below in conjunction with the accompanying drawings, which illustrate the process of making an SRAM cell constructed by CFET structures, according to some embodiments.

FIG. 1 is a fragmentary diagrammatic top view of an integrated circuit (IC) chip 10, in portion or entirety, in accordance with some embodiments of the present disclosure. The IC chip 10 may include various passive microelectronic devices and active microelectronic devices, such as resistors, capacitors, inductors, diodes, p-type field effect transistors (PFETs), n-type field effect transistors (NFETs), metal-oxide semiconductor field effect transistors (MOSFETs), CMOS transistors, bipolar junction transistors (BJTs), laterally diffused MOS (LDMOS) transistors, high voltage transistors, high frequency transistors, other suitable components, or combinations thereof. The various microelectronic devices can be configured to provide the IC chip 10 with functionally distinct regions, such as a core region (also referred to as a logic region), a memory region (e.g., a static random access memory (SRAM) region), an analog region, a peripheral region (also referred to as an input/ output (I/O) region), a dummy region, and/or other suitable region. In some embodiments, the IC chip 10 includes a memory region 20 and a logic region 30. The memory region 20 can include an array of memory cells, each of which includes transistors and interconnection structures (also referred to as routing structures) that combine to provide a storage device and/or a storage function, such as a flip flop, a latch, other suitable memory devices, or combinations thereof. In some embodiments, the memory region 20 is configured with static random-access memory (SRAM) cells, dynamic random-access memory (DRAM) cells, non-volatile random-access memory (NVRAM) cells, flash memory cells, other suitable memory cells, or combinations thereof. The logic region 30 can include an array of standard cells, each of which includes transistors and interconnection structures that combine to provide a logic device and/or a logic function, such as an inverter, an AND gate, an NAND gate, an OR gate, an NOR gate, a NOT gate, an XOR gate, an XNOR gate, other suitable logic devices, or combinations thereof. FIG. 1 has been simplified for the sake of clarity to better understand the inventive concepts of the present disclosure. Additional features can be added in IC chip 10, and some of the features described herein can be replaced, modified, or eliminated in other embodiments of the IC chip 10.

Figures 2, 3:
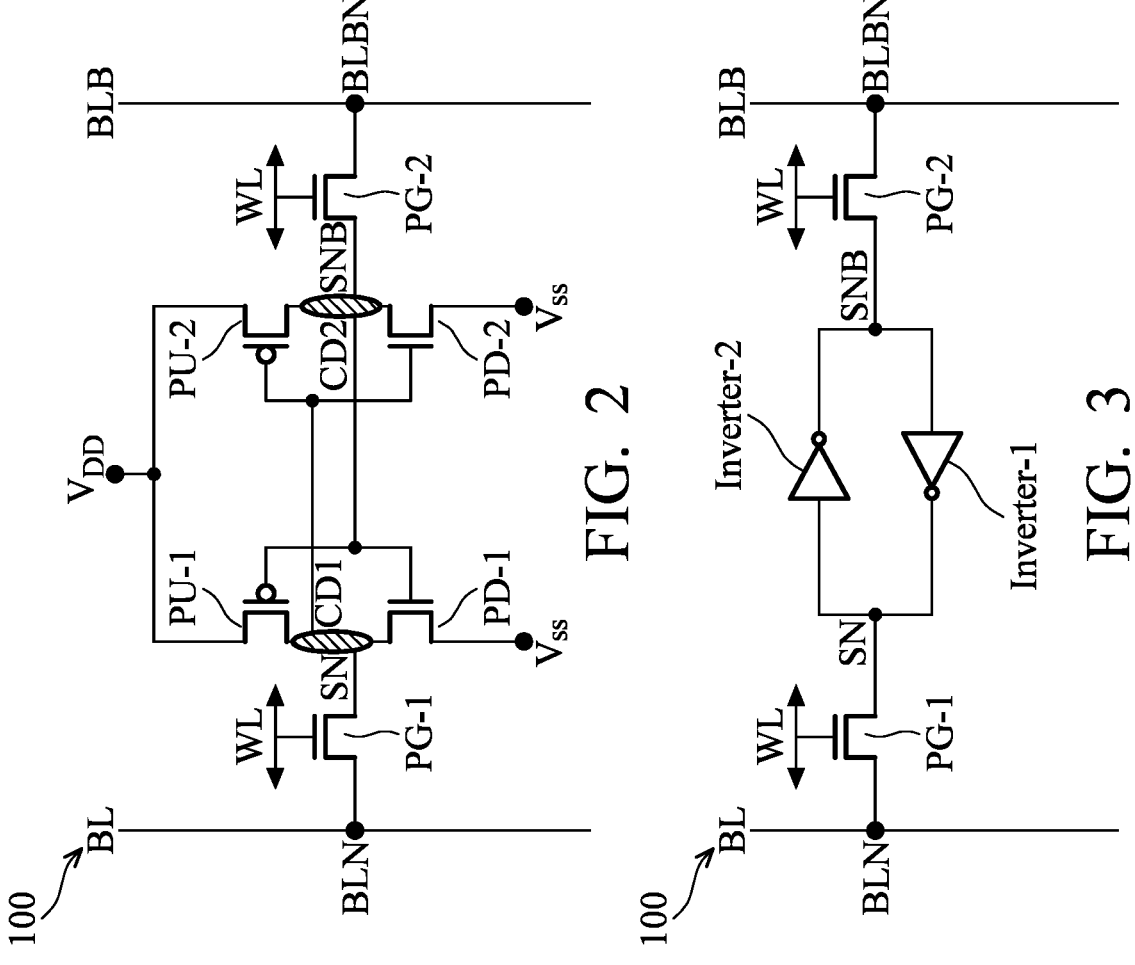
FIGS. 2 and 3 are circuit diagrams of an SRAM circuit that can be implemented in an SRAM cell of an array in the memory region of FIG. 1, in accordance with some embodiments of the present disclosure.

FIGS. 2 and 3 are circuit diagrams of an SRAM circuit that can be implemented in an SRAM cell (e.g., an SRAM cell 100 described in FIGS. 4 to 27D) of an array in the memory region 20 of FIG. 1, in accordance with some embodiments of the present disclosure. The circuit diagram of SRAM cell is merely exemplary, and in some embodiments, each of SRAM cells in the array is configured with an SRAM circuit similar to the SRAM cell 100 and as shown in FIGS. 2 and 3. For example, each of SRAM cells has a storage portion that includes a cross-coupled pair of inverters (also referred to as a latch), such as an Inverter-1 and an Inverter-2. Inverter-1 includes pull-up transistor PU-1 and pull-down transistor PD-1, and Inverter-2 includes pull-up transistor PU-2 and pull-down transistor PD-2. Pass-gate transistor PG-1 is connected to an output of Inverter-1 and an input of Inverter-2, and pass-gate transistor PG-2 is connected to an output of Inverter-2 and an input of Inverter-1. In operation, pass-gate transistor PG-1 and pass-gate transistor PG-2 provide access to the storage portion of their respective SRAM cell (i.e., Inverter-1 and Inverter-2) and can also be referred to as access transistors of their respective SRAM cell. Each of SRAM cells (e.g., the SRAM cell 100 described in FIGS. 4 to 27D) is connected to and powered through a first power supply voltage, such as a positive power supply voltage, and a second power supply voltage, such as a ground voltage or a reference voltage (which can be an electrical ground). A gate of pull-up transistor PU-1 interposes a source, which is electrically coupled to the first power supply voltage via a voltage node (or voltage source) $V_{DD}$, and a first common drain (CD1) (i.e., a drain of pull-up transistor PU-1 and a drain of pull-down transistor PD-1). A gate of pull-down transistor PD-1 interposes a source, which is electrically coupled to the second power supply voltage via a voltage node (or voltage source) $V_{SS}$, and the first common drain. A gate of pull-up transistor PU-2 interposes a source, which is electrically coupled to the first power supply voltage via voltage node $V_{DD}$, and a second common drain (CD-2) (i.e., a drain of pull-up transistor PU-2 and a drain of pull-down transistor PD-2). A gate of pull-down transistor PD-2 interposes a source, which is electrically coupled to the second power supply voltage via voltage node $V_{SS}$, and the second common drain. The first common drain provides a storage node SN that stores data in true form, and the second common drain provides a storage node SNB that stores data in complementary form, or vice versa, in some embodiments. The gate of pull-up transistor PU1 and the gate of pull-down transistor PD-1 are coupled together and to the second common drain SD2, and the gate of pull-up transistor PU-2 and the gate of pull-down transistor PD-2 are coupled together and to the first common drain SD1. A gate of pass-gate transistor PG-1 interposes a drain connected to a bit line node BLN, which is electrically coupled to a bit line BL, and a source, which is electrically coupled to the first common drain SD1. A gate of pass-gate transistor PG-2 interposes a drain connected to a complementary bit line node BLBN, which is electrically coupled to a complementary bit line BLB, and a source, which is electrically coupled to the second common drain SD2. Gates of pass-gate transistors PG-1, PG-2 are connected to and controlled by a word line WL, which allows selection of a respective SRAM cell, such as the SRAM cell 101A, for reading and/or writing. In some embodiments, pass-gate transistors PG-1, PG-2 provide access to storage nodes SN, SNB, respectively, each of which can store a bit (e.g., a logical 0 or a logical 1), during read operations and/or write operations. For example, pass-gate transistors PG-1, PG-2 couple storage nodes SN, SNB, respectively, to bit line BL and bit line bar BLB in response to voltage applied to the gates of the pass-gate transistors PG-1, PG-2 by the word line WL. In some embodiments, SRAM cells are single-port SRAMs. In some embodiments, SRAM cells are configured as multi-port SRAMs, such as dual-port SRAMs, and/or with more or less transistors than depicted, such as 8T SRAMs. FIGS. 2 and 3 have been simplified for the sake of clarity to better understand the inventive concepts of the present disclosure. Additional features can be added in the SRAM circuits of FIGS. 2 and 3, and some of the features described herein can be replaced, modified, or eliminated in other embodiments of the SRAM circuits of FIGS. 2 and 3.

Figure 4:
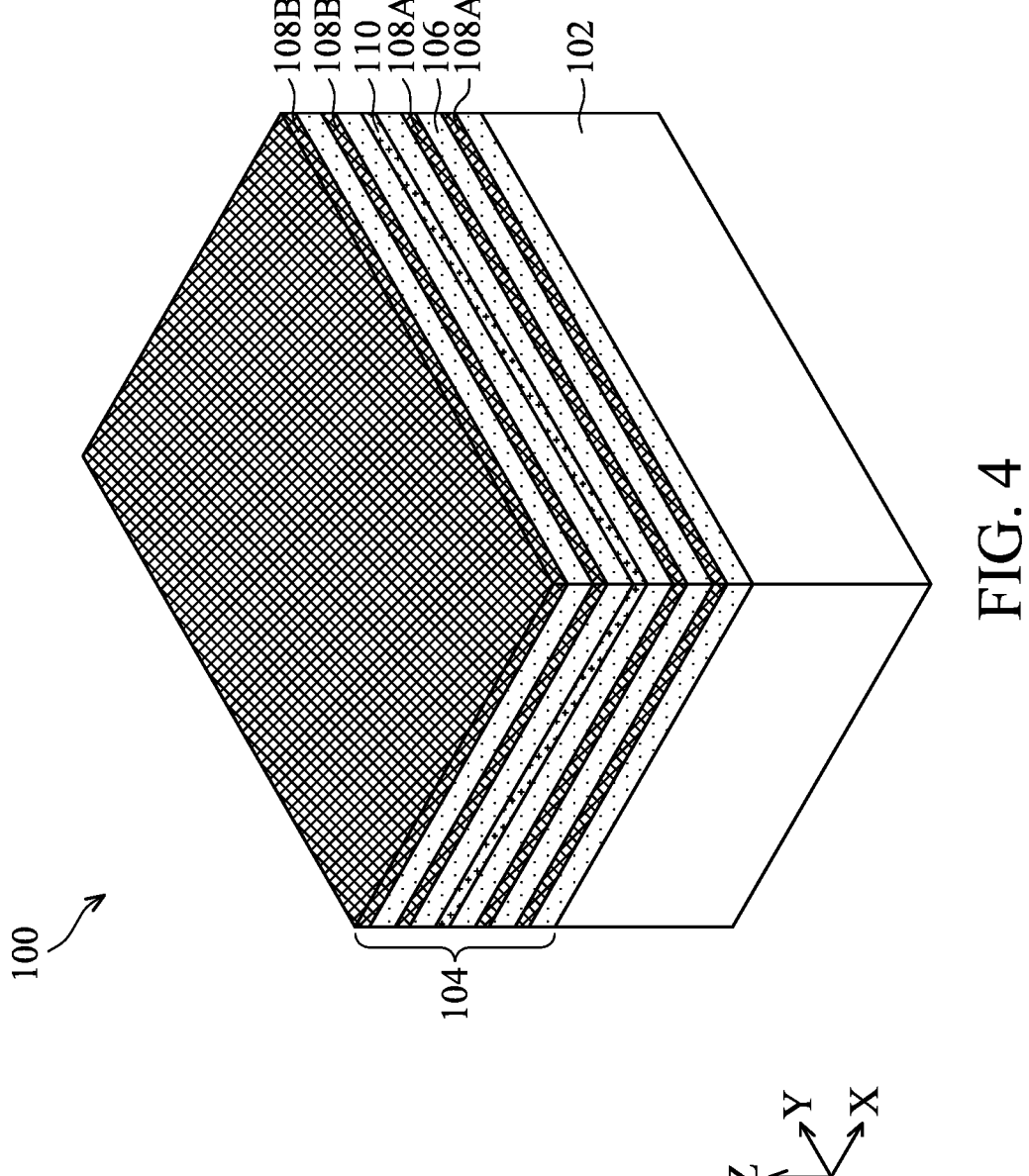
FIGS. 4 and 5 are isometric views of the SRAM cell at various fabrication stages, in accordance with some embodiments of the present disclosure.
Figure 5:
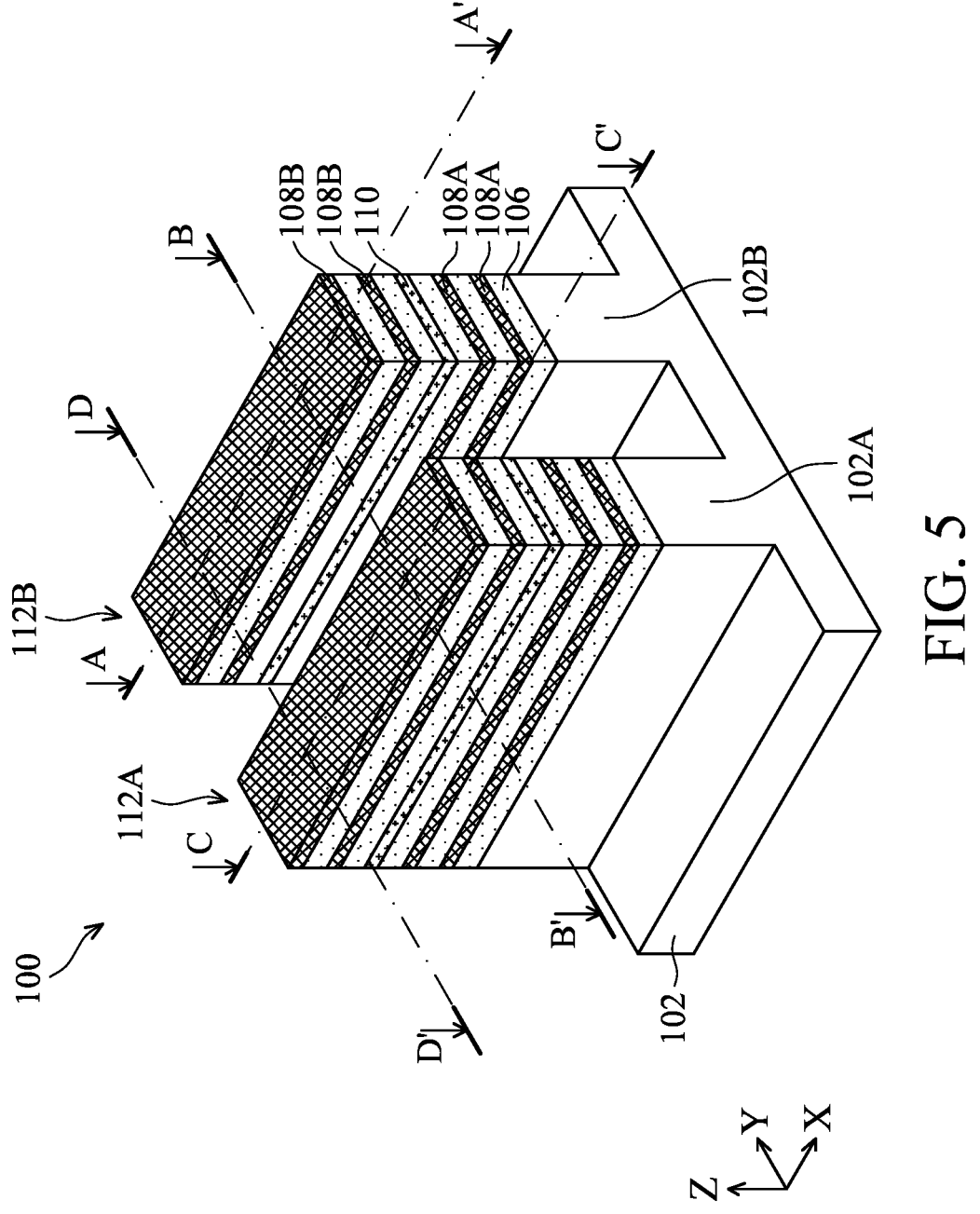

FIGS. 4 and 5 are isometric views of the SRAM cell 100 at various fabrication stages, in accordance with some embodiments of the present disclosure. Referring to FIG. 4, a substrate 102 is provided. A stack 104 is formed over the substrate 102. In some embodiments, the substrate 102 contains a semiconductor material, such as bulk silicon (Si). In some other embodiments, the substrate 102 may include other semiconductors such as germanium (Ge), silicon germanium (SiGe), or a III-V semiconductor material. Example III-V semiconductor materials may include gallium arsenide (GaAs), indium phosphide (InP), gallium phosphide (GaP), gallium nitride (GaN), gallium arsenide phosphide (GaAsP), aluminum indium arsenide (AlInAs), aluminum gallium arsenide (AlGaAs), gallium indium phosphide (GaInP), and indium gallium arsenide (InGaAs). The substrate 102 may also include an insulating layer, such as a silicon oxide layer, to have a silicon-on-insulator (SOI) structure or a germanium-on-insulator (GOI) structure. In some embodiments, the substrate 102 may include one or more well regions, such as n-type well regions doped with an n-type dopant (i.e., phosphorus (P) or arsenic (As)) or p-type well regions doped with a p-type dopant (i.e., boron (B)), for forming different types of devices. The doping the n-type wells and the p-type wells may be formed using ion implantation or thermal diffusion.

The stack 104 includes semiconductor layers 106 and 108 (including semiconductor layers 108A and semiconductor layers 108B), and a dielectric layer 110. The semiconductor layers 106, the dielectric layer 110, and the semiconductor layers 108 are alternately stacked in the Z-direction. The semiconductor layers 106 and the semiconductor layers 108 may have different semiconductor compositions. In some embodiments, semiconductor layers 106 are formed of silicon germanium (SiGe) and the semiconductor layers 108 are formed of silicon (Si). In these embodiments, the additional germanium content in the semiconductor layers 106 allow selective removal or recess of the semiconductor layers 106 without substantial damages to the semiconductor layers 108, so that the semiconductor layers 106 are also referred to as sacrificial layers.

In some embodiments, the semiconductor layers 106 and 108 are epitaxially grown over (on) the semiconductor substrate 102 using a deposition technique such as epitaxial growth, vapor-phase epitaxy (VPE), molecular beam epitaxy (MBE), although other deposition processes, such as chemical vapor deposition (CVD), low pressure CVD (LPCVD), atomic layer deposition (ALD), ultrahigh vacuum CVD (UHVCVD), reduced pressure CVD (RPCVD), a combination thereof, or the like, may also be utilized. The semiconductor layers 106 and the semiconductor layers 108 are deposited alternatingly, one-after-another, to form the stack 104.

The two (2) semiconductor layers 108A are used for the n-type FET (NFET) of the CFET (e.g., pull-down transistors PD-1 and PD-2, and pass-gate transistors PG-1 and PG-2 shown in FIGS. 26 and 27A to 27D) and the two (2) semiconductor layers 108B are used for the p-type FET (PFET) of the CFET (e.g., dummy transistors DM1 and DM2, and pull-up transistors PU-1 and PU-2 shown in FIGS. 26 and 27A to 27D). It should be noted that five (5) layers of the semiconductor layers 106 and four (4) layers of the semiconductor layers 108 are alternately and vertically arranged (or stacked) as shown in FIG. 4, which are for illustrative purposes only and not intended to be limiting beyond what is specifically recited in the claims. The number of the layers depends on the desired number of channels members for the semiconductor device.

As shown in FIG. 4, the dielectric layer 110 is form vertically between a group of the semiconductor layers 108A and a group of the semiconductor layers 108B. The dielectric layer 110 is formed by performing a deposition process, such as CVD, PVD, ALD, HDPCVD, MOCVD, RPCVD, PECVD, LPCVD, ALCVD, APCVD, other suitable methods, or combinations thereof. In some embodiments, the dielectric material of the dielectric layer 110 includes silicon, oxygen, carbon, nitrogen, other suitable material, or combinations thereof (for example, silicon oxide ($SiO_2$), silicon nitride ($Si_3N_4$), silicon oxynitride (SiON), silicon oxycarbide (SiOC), silicon carbon nitride (SiCN), or silicon oxycarbon nitride (SiOCN)).

Referring to FIG. 5, the substrate 102 and the stack 104 are then patterned to form fins 112A and 112B (may be collectively referred to as fins 112) over the substrate 102. As shown in FIG. 5, each of the fins 112 includes a base fin (102A and 102B) formed from a portion of the substrate 102 and a stack portion formed from the stack 104 over the base portion. The fin 112 extends lengthwise in the X-direction and extends vertically in the Z-direction over the substrate 102. The fins 112A and 112B are arranged in the Y-direction.

The fin 112 may be patterned using suitable processes including double-patterning or multi-patterning processes. For example, in some embodiments, a material layer is formed over a substrate and patterned using a photolithography process. Spacers are formed alongside the patterned material layer using a self-aligned process. The material layer is then removed, and the remaining spacers, or mandrels, may then be used to pattern the fin 112 by etching the stack 104 and the substrate 102. The etching process may include dry etching, wet etching, reactive ion etching (RIE), and/or other suitable processes.

Figure 6A:
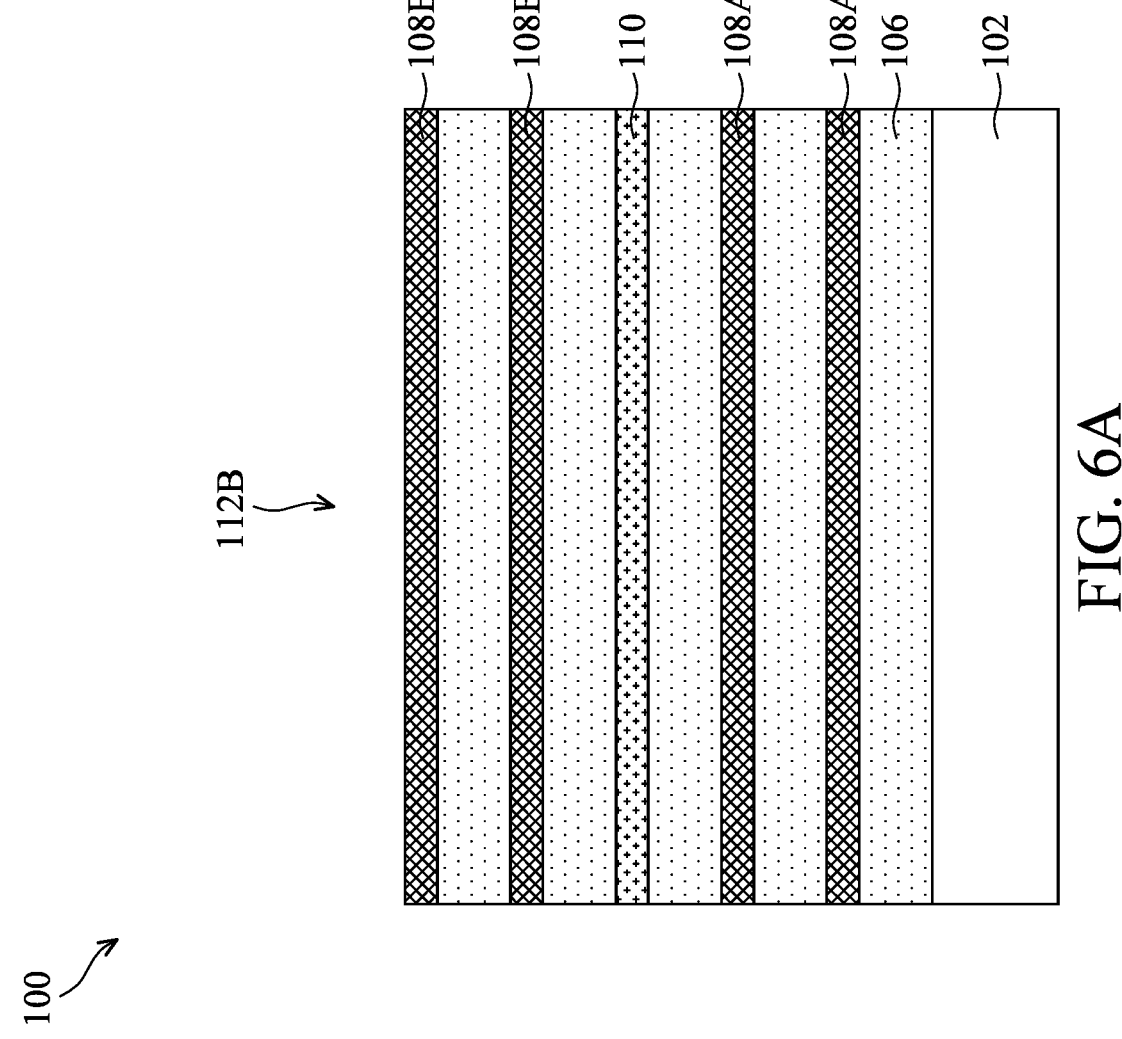
FIGS. 6A and 7A are X-Z cross-sectional views of the SRAM cell at various fabrication stages along a line A-A' of FIG. 5, in accordance with some embodiments of the present disclosure.
Figure 6B:
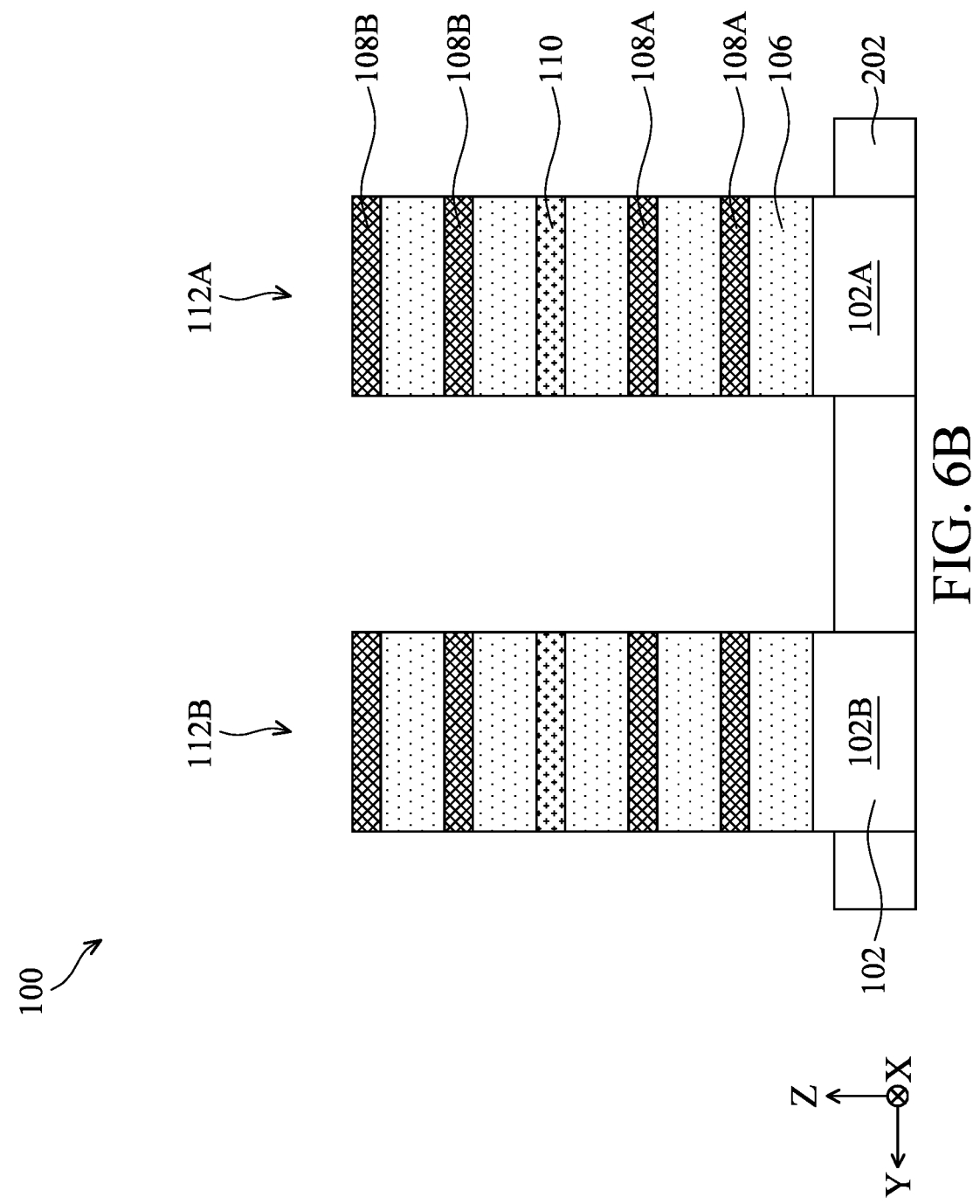
FIGS. 6B and 7B are Y-Z cross-sectional views of the SRAM cell at various fabrication stages along a line B-B' of FIG. 5, in accordance with some embodiments of the present disclosure.
Figure 7A:
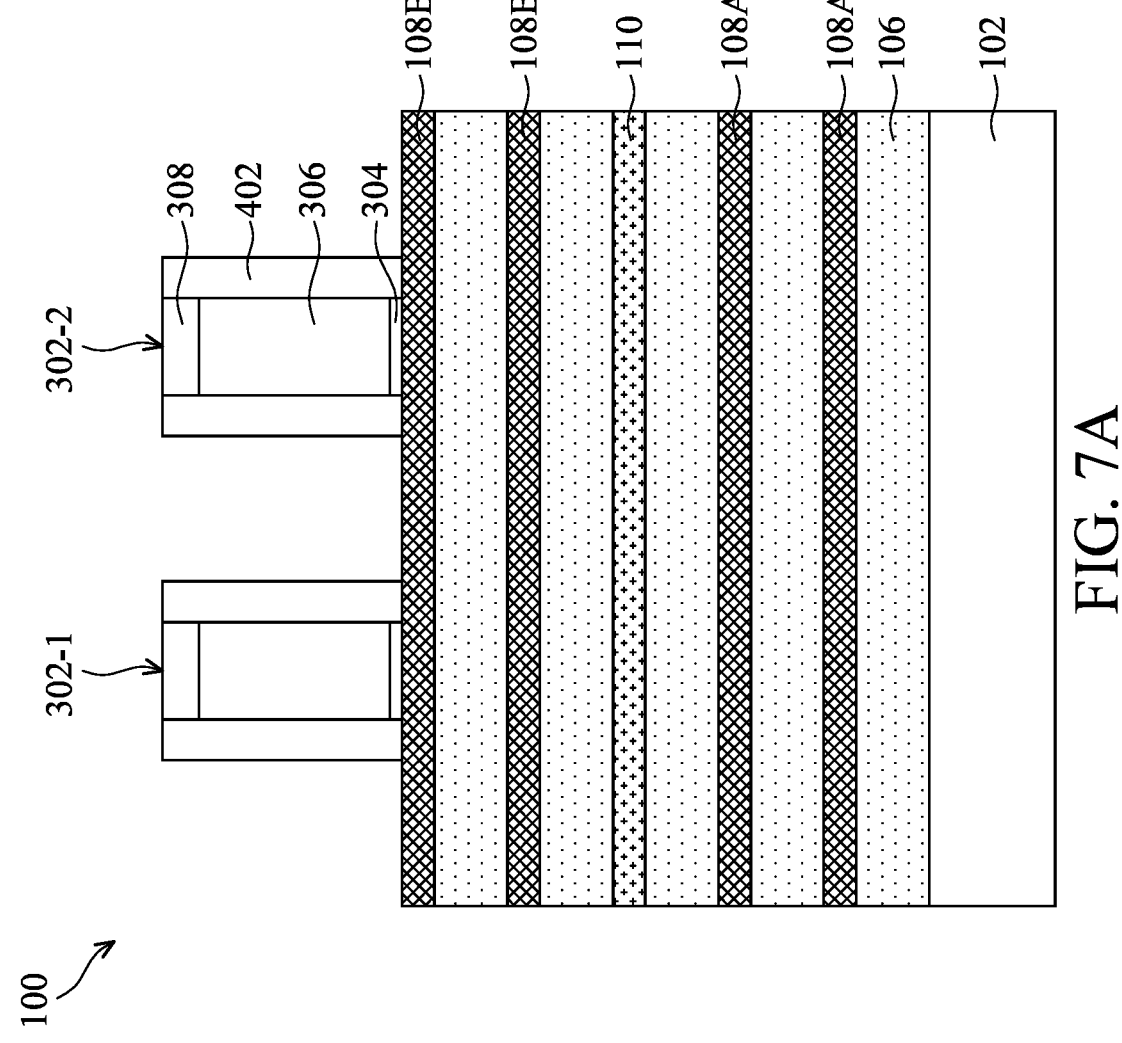
Figure 7A:
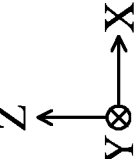
Figure 7B:
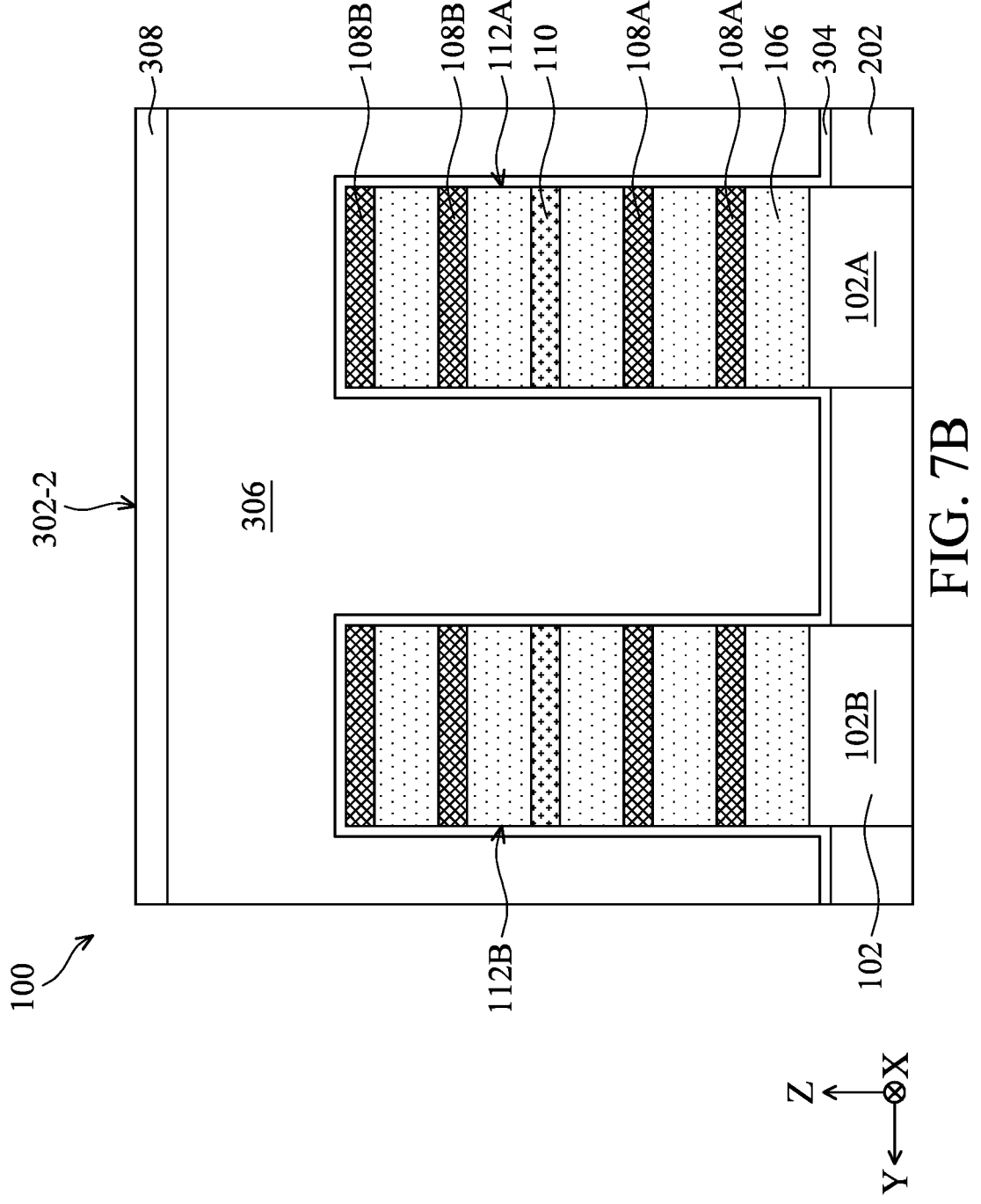

FIGS. 6A and 7A are X-Z cross-sectional views of the SRAM cell 100 at various fabrication stages along a line A-A' of FIG. 5, in accordance with some embodiments of the present disclosure. FIGS. 6B and 7B are Y-Z cross-sectional views of the SRAM cell 100 at various fabrication stages along a line B-B' of FIG. 5, in accordance with some embodiments of the present disclosure.

It should be noted that cross-sectional views of the SRAM cell 100 along a line C-C' and a line D-D' of FIG. 5 are similar to the cross-sectional views of the SRAM cell 100 along the line A-A' and the line B-B' of FIG. 5, except that the cross-sectional views of the SRAM cell 100 along the line C-C' and the line D-D' of FIG. 5 are respectively flip horizontal images of the cross-sectional views of the SRAM cell 100 along the line A-A' and the line B-B' of FIG. 5, and are omitted herein for the purpose of simplicity, unless otherwise illustrated.

Referring to FIGS. 6A and 6B, isolation structures 202 are formed. After the fins 112 are formed, the isolation structures 202 are formed over the substrate 102. In some embodiments, the isolation structure 202 extends in the X-direction (not shown) and is arranged with the fins 112 in the Y-direction. In some other aspects, the isolation structure 202 is formed around the fins 112. The isolation structures 202 may also be referred to as shallow trench isolation (STI) feature. In some embodiments, a dielectric material for the isolation structures 202 is first deposited over the substrate 102 and fins 112. In some embodiments, the dielectric material may include silicon oxide, silicon nitride, silicon oxynitride, fluorine-doped silicate glass (FSG), a low-k dielectric, combinations thereof, and/or other suitable materials. In various embodiments, the dielectric material may be deposited by a CVD, a subatmospheric CVD (SACVD), a flowable CVD (FCVD), an ALD, spin-on coating, and/or other suitable process. The deposited dielectric material is then thinned and planarized, for example by a chemical mechanical polishing (CMP) process. The planarized dielectric material is further recessed by a dry etching process, a wet etching process, and/or a combination thereof to form the isolation structures 202. As shown in FIG. 6B, the stack portions of the fins 112 rise above the isolation structures 202 while the base portions 102A and 102B are surrounded by the isolation structures 202. In other words, a top surface of the substrate 102 is higher than top surfaces of the isolation structures 202. In some embodiments, before the formation of the isolation structures 202, liner layers may be conformally deposited over the substrate 102 using ALD or CVD.

Referring to FIGS. 7A and 7B, dummy gate structures 302-1 and 302-2 (may be collectively referred to as dummy gate structures 302) may be formed over the fins 112 and over the isolation structure 202. The dummy gate structures 302 may be configured to extend lengthwise in the Y-direction and wrap around top surfaces and side surfaces of the fins 112, as shown in FIG. 7B. In some embodiments, to form the dummy gate structures 302, a dummy interfacial material for dummy interfacial layers 304 is first formed over fins 112 and over the isolation structure 202. More specifically, the dummy interfacial material is conformally formed on sidewalls of the fins 112 and over the top surfaces of the fins 112 and the isolation structure 202, as shown in FIG. 7B. In some embodiments, the dummy interfacial layer 304 may include, for example, a dielectric material such as a nitride (e.g., silicon nitride, silicon oxynitride), a carbide (e.g., silicon carbide), an oxide (e.g., silicon oxide), or some other suitable material. Then, in some embodiments, a dummy gate material for dummy gate electrodes 306 is formed over the dummy interfacial material. The dummy gate material may include a conductive material selected from a group comprising of polysilicon, W, Al, Cu, AlCu, Ti, TiAlN, TaC, TaCN, TaSiN, Mn, Zr, TiN, Ta, TaN, Co, Ni, and/or combinations thereof. The dummy gate material and/or the dummy interfacial material may be formed by way of a thermal oxidation process and/or a deposition process (e.g., physical vapor deposition (PVD), CVD, PECVD, and ALD).

Then, hard mask layers 308 are formed over the dummy gate material. In some embodiments, the hard mask layers 308 may be formed using photolithography and removal (e.g., etching) processes. In some embodiments, the hard mask layers 308 may include photoresist materials or hard mask materials. In some embodiments, each of the hard mask layers 308 may include multiple layers, such as a silicon nitride layer and a silicon oxide layer. After the formation of the hard mask layers 308, a removal process (e.g., etching) may be performed to remove portions of the dummy gate material for the dummy gate electrodes 306 and the dummy interfacial material for the dummy interfacial layers 304 that do not directly underlie the hard mask layers 308, thereby forming the dummy gate structures 302 each having the dummy interfacial layer 304, the dummy gate electrode 306, and the hard mask layer 308. The dummy interfacial layers 304 may also be referred to as dummy gate dielectrics. The dummy gate structures 302 may undergo a gate replacement process through subsequent processing to form metal gates, such as a high-k metal gate, as discussed in greater detail below.

Still referring to FIGS. 7A and 7B, after the formation of the dummy gate structures 302, gate spacers 402 are formed on sidewalls of the dummy gate structures 302, and over the top surfaces of the fins 112. More specifically, the gate spacers 402 are formed on opposite sidewalls of the dummy gate structures 302, as shown in FIG. 7A. The gate spacers 402 may include silicon nitride ($Si_3N_4$), silicon oxide ($SiO_2$), silicon carbide (SiC), silicon oxycarbide (SiOC), silicon oxynitride (SiON), silicon carbon nitride (SiCN), silicon oxycarbon nitride (SiOCN), carbon doped oxide, nitrogen doped oxide, porous oxide, or combinations thereof. The gate spacers 402 may include a single layer or a multi-layer structure. In some embodiments, the gate spacers 402 may be formed by conformally depositing a spacer layer (containing the dielectric material) over the isolation structure 202, the fins 112, and dummy gate structures 302, followed by an anisotropic etching process to remove top portions of the spacer layer from the top surfaces of the isolation structure 202, the fins 112, and dummy gate structures 302. After the etching process, portions of the spacer layer on the sidewall surfaces of the fins 112 and the dummy gate structures 302 substantially remain and become the gate spacers 402. In some embodiments, the anisotropic etching process is a dry (e.g., plasma) etching process. Additionally or alternatively, the formation of the gate spacers 402 may also involve chemical oxidation, thermal oxidation, ALD, CVD, and/or other suitable methods. The gate spacers 402 may also be interchangeably referred to as top spacers.

Figure 8:
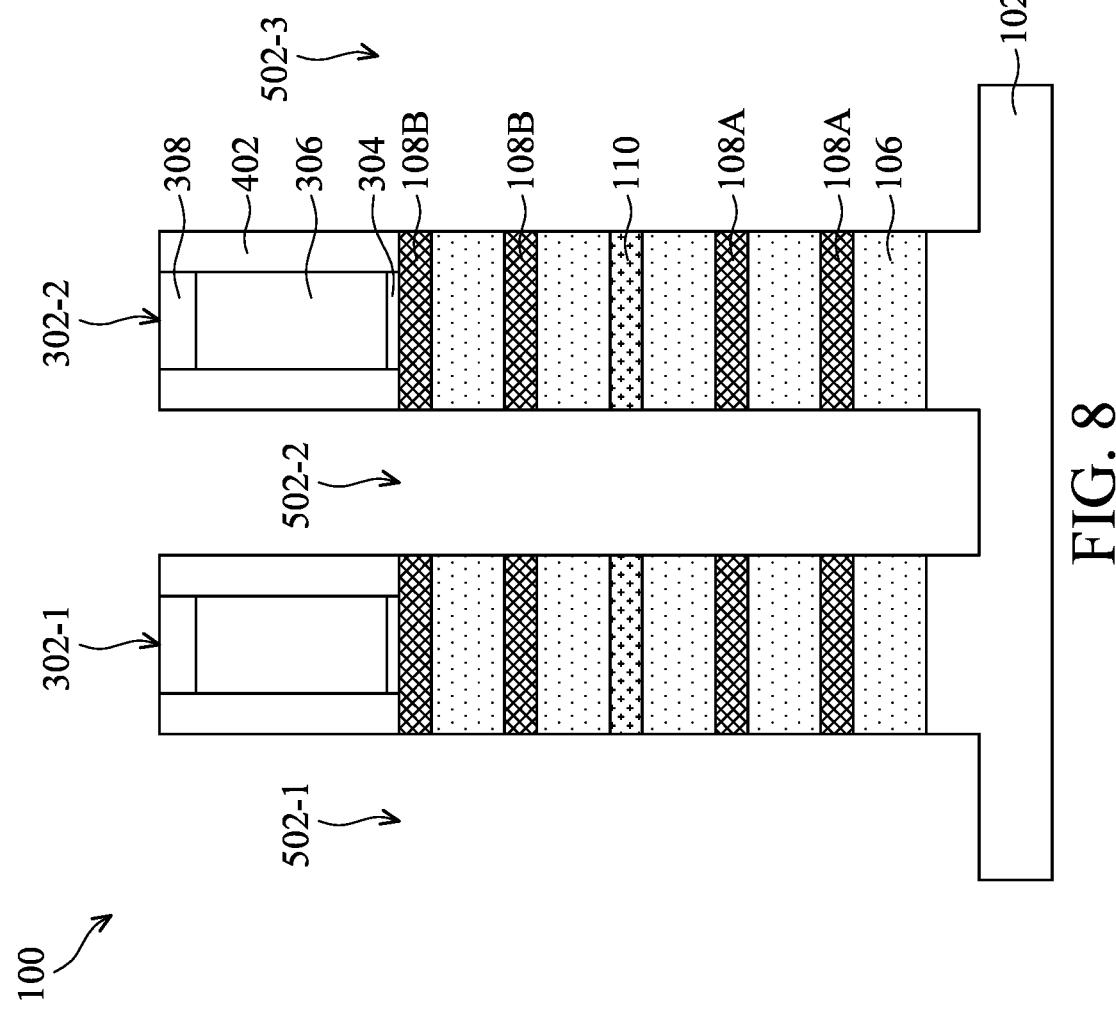

FIGS. 8 to 15 are X-Z cross-sectional views of the SRAM cell 100 at various fabrication stages along a line A-A' of FIG. 5, in accordance with some embodiments of the present disclosure. Referring to FIG. 8, the fins 112 are recessed to form source/drain trenches 502-1 to 502-3 (may be collectively referred to as source/drain trenches 502) in the fins 112 (or passing through the semiconductor layers 106 and 108, and the dielectric layer 110). Specifically, the source/drain trenches 502 may be formed by performing one or more etching processes to remove portions of the semiconductor layers 106, the semiconductor layers 108, the dielectric layer 110, and the substrate 102 that do not vertically overlap or be covered by the dummy gate structures 302 and the gate spacers 402. In some embodiments, a single etchant may be used to remove the semiconductor layers 106, the semiconductor layers 108, the dielectric layer 110, and the substrate 102, whereas in other embodiments, multiple etchants may be used to perform the etching process.

Figure 9:
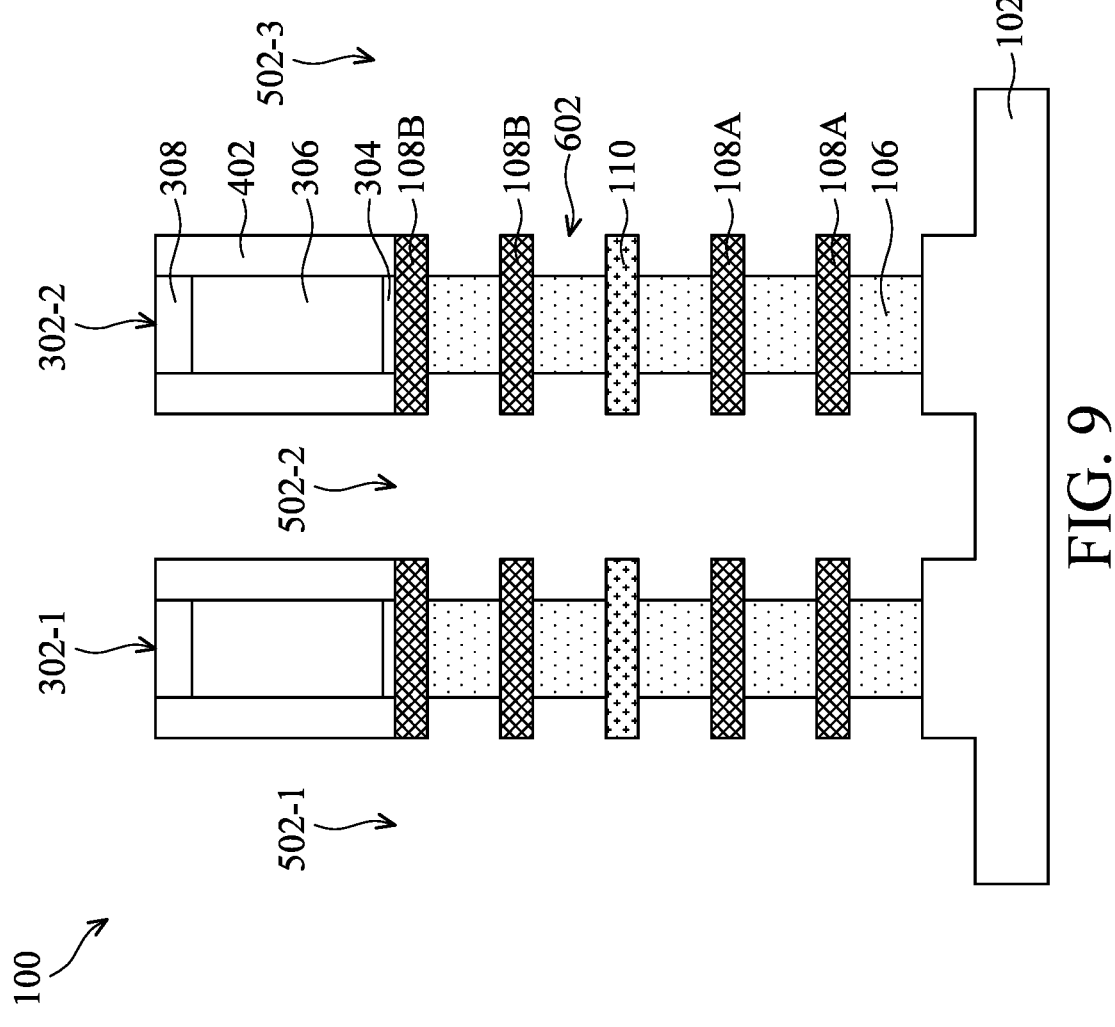

Referring to FIG. 9, side portions of the semiconductor layers 106 are removed via a selective etching process. Specifically, the selective etching process is performed that selectively etches the side portions of the semiconductor layers 106 below the gate spacers 402 through the source/drain trenches 502, with minimal (or no) etching of the semiconductor layers 108 and the dielectric layer 110, so that gaps 602 may be formed between the semiconductor layers 108, between the semiconductor layers 108 and the dielectric layer 110, and between the semiconductor layers 108 and the substrate 102, which are below the gate spacers 402. The etching process is configured to laterally etch (e.g., along the X-direction) the semiconductor layers 106 below the gate spacers 402. The selective etching process is a dry etching process, a wet etching process, other suitable etching process, or combinations thereof.

Figure 10:
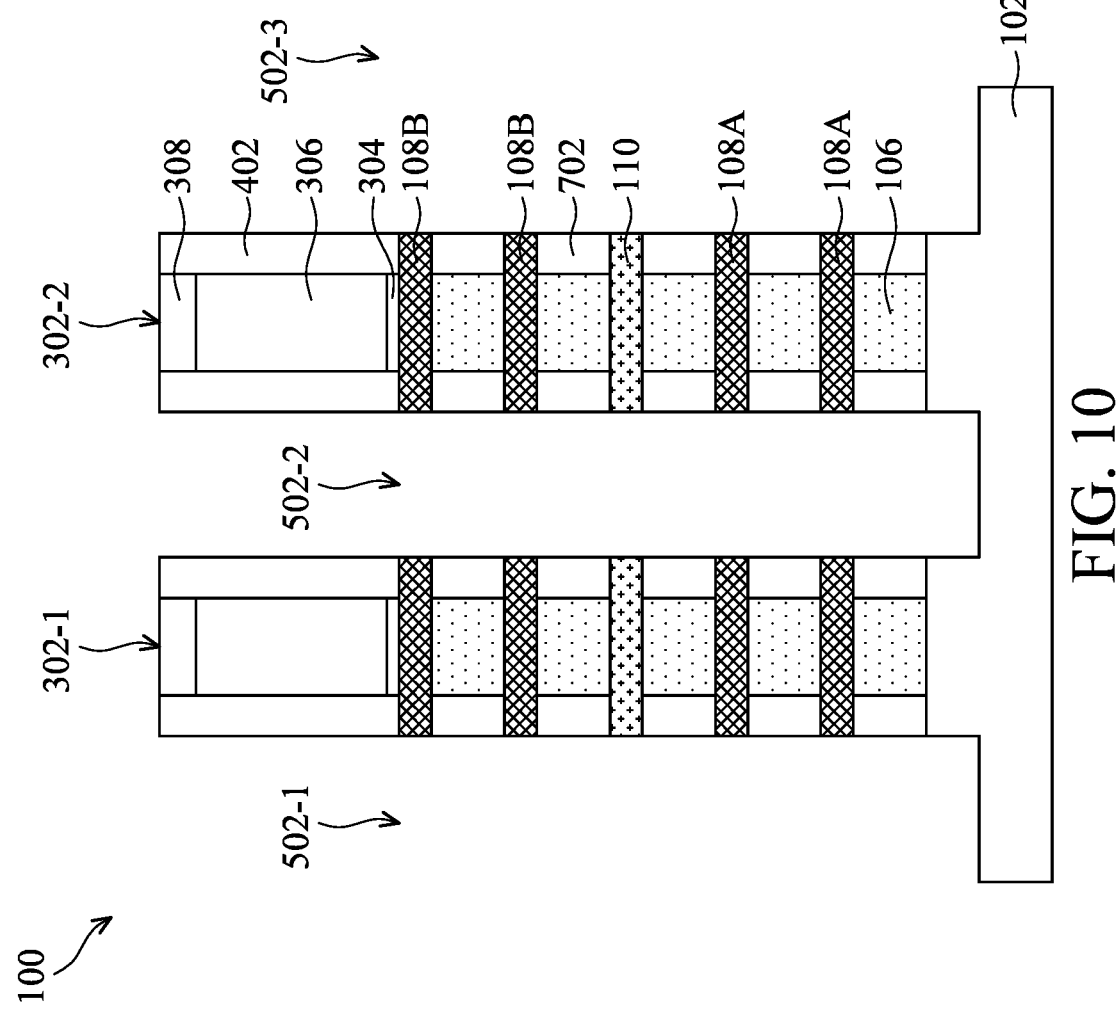

Referring to FIG. 10, inner spacers 702 are formed to fill the gaps 602. In some embodiments, sidewalls of the inner spacers 702 are aligned to sidewalls of the gate spacers 402, the semiconductor layers 108, and the dielectric layer 110, as shown in FIG. 10. In order to form the inner spacers 702, a deposition process forms a spacer layer into the source/drain trenches 502 and the gaps 602, such as CVD, PVD, ALD, HDPCVD, MOCVD, RPCVD, PECVD, LPCVD, ALCVD, APCVD, other suitable methods, or combinations thereof. The spacer layer partially (and, in some embodiments, completely) fills the source/drain trenches 502. The deposition process is configured to ensure that the spacer layer fills the gaps 602 between the semiconductor layers 108, between the semiconductor layers 108 and the dielectric layer 110, and between the semiconductor layers 108 and the substrate 102, which are below the gate spacers 402. An etching process is then performed that selectively etches the spacer layer to form inner spacers 702 (as shown in FIG. 10) with minimal (to no) etching of the semiconductor layer 108, the dielectric layer 110, the substrate 102, the dummy gate structures 302, and the gate spacers 402. The spacer layer (and thus inner spacers 702) includes a material that is different than a material of the semiconductor layers 108, a material of the dielectric layer 110, and a material of the gate spacers 402 to achieve desired etching selectivity during the etching process. In some embodiments, the inner spacers 702 include a dielectric material that includes silicon, oxygen, carbon, nitrogen, other suitable material, or combinations thereof (for example, silicon oxide ($SiO_2$), silicon oxynitride (SiON), silicon oxycarbide (SiOC), silicon carbon nitride (SiCN), silicon oxycarbon nitride (SiOCN)). In some embodiments, the inner spacers 702 include a low-k dielectric material, such as those described herein.

Figure 11:
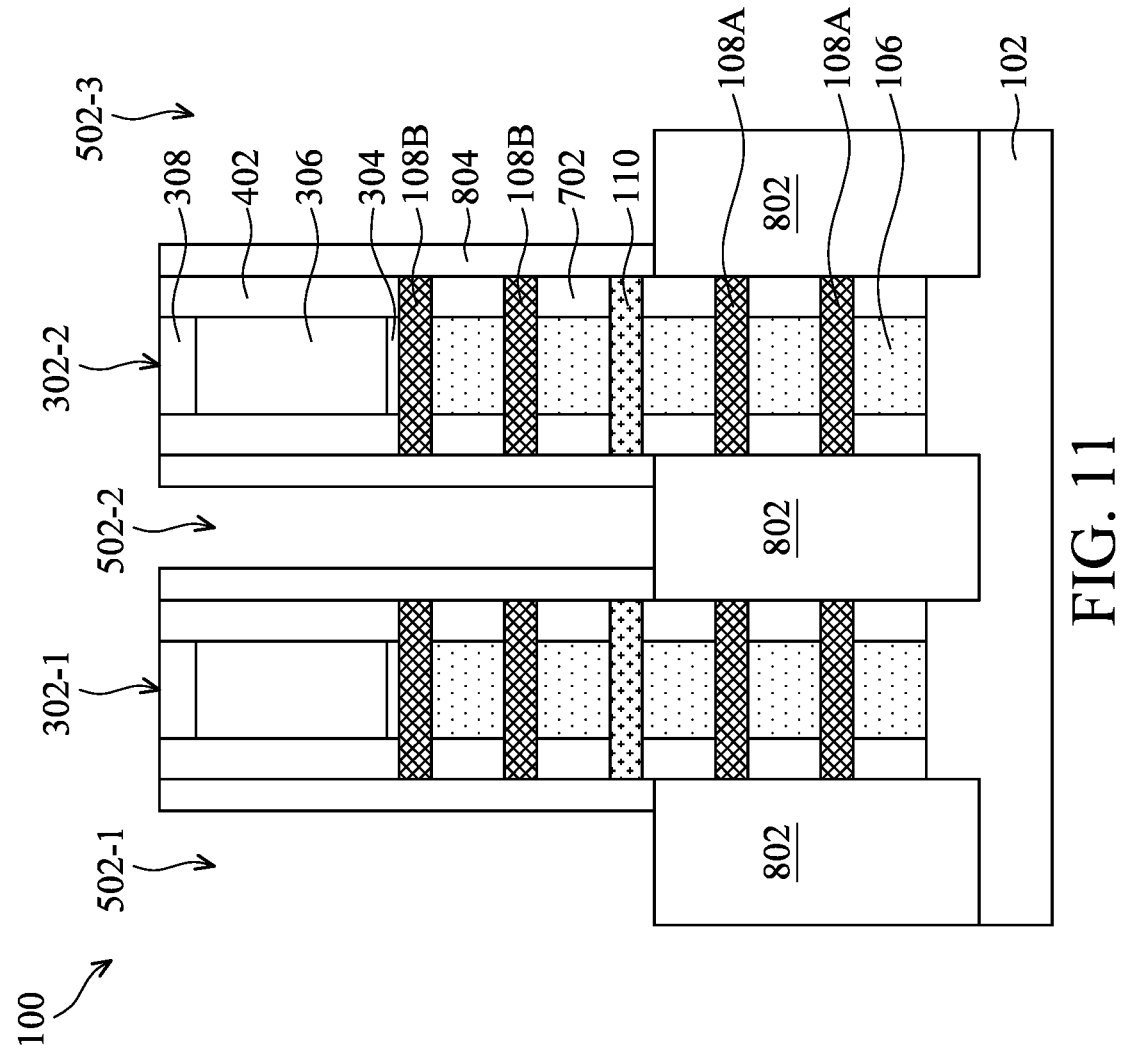

Referring to FIG. 11, polymer layers 802 and dielectric layers 804 are formed in the source/drain trenches 502. More specifically, the polymer layers 802 are first formed in lower parts of the source/drain trenches 502 to cover a bottom surface of the substrate 102 and the sidewalls of the semiconductor layers 108A (which are used for the NFET of the CFET, such as the pull-down transistors PD-1 and PD-2, and the pass-gate transistors PG-1 and PG-2 shown in FIGS. 26 and 27A to 27D) and the inner spacers 702 (which are between the semiconductor layers 108A). In some embodiments, top surfaces of the polymer layers 802 are lower than the dielectric layer 110 and the semiconductor layers 108B. After the formation of the polymer layers 802, the dielectric layers 804 are formed over the polymer layers 802 and on the sidewalls of the semiconductor layers 108B (which are used for the PFET of the CFET, such as the dummy transistors DM1 and DM2, and the pull-up transistors PU-1 and PU-2 shown in FIGS. 26 and 27A to 27D), the dielectric layer 110, the gate spacers 402, and the inner spacers 702 (which are between the semiconductor layers 108B). The polymer layers 802 are formed of fluorine-containing polymer and its molecular structure includes silicon (Si), carbon (C), nitrogen (N), or fluorine (F). In one example, the polymer layers 802 include fluorinated silicone or fluorinated polysilane. The polymer layers 802 may be deposited using CVD, flowable CVD (FCVD), or spin-on coating. The dielectric layers 804 may include aluminum oxide ($Al_2O_3$).

Figure 27A:
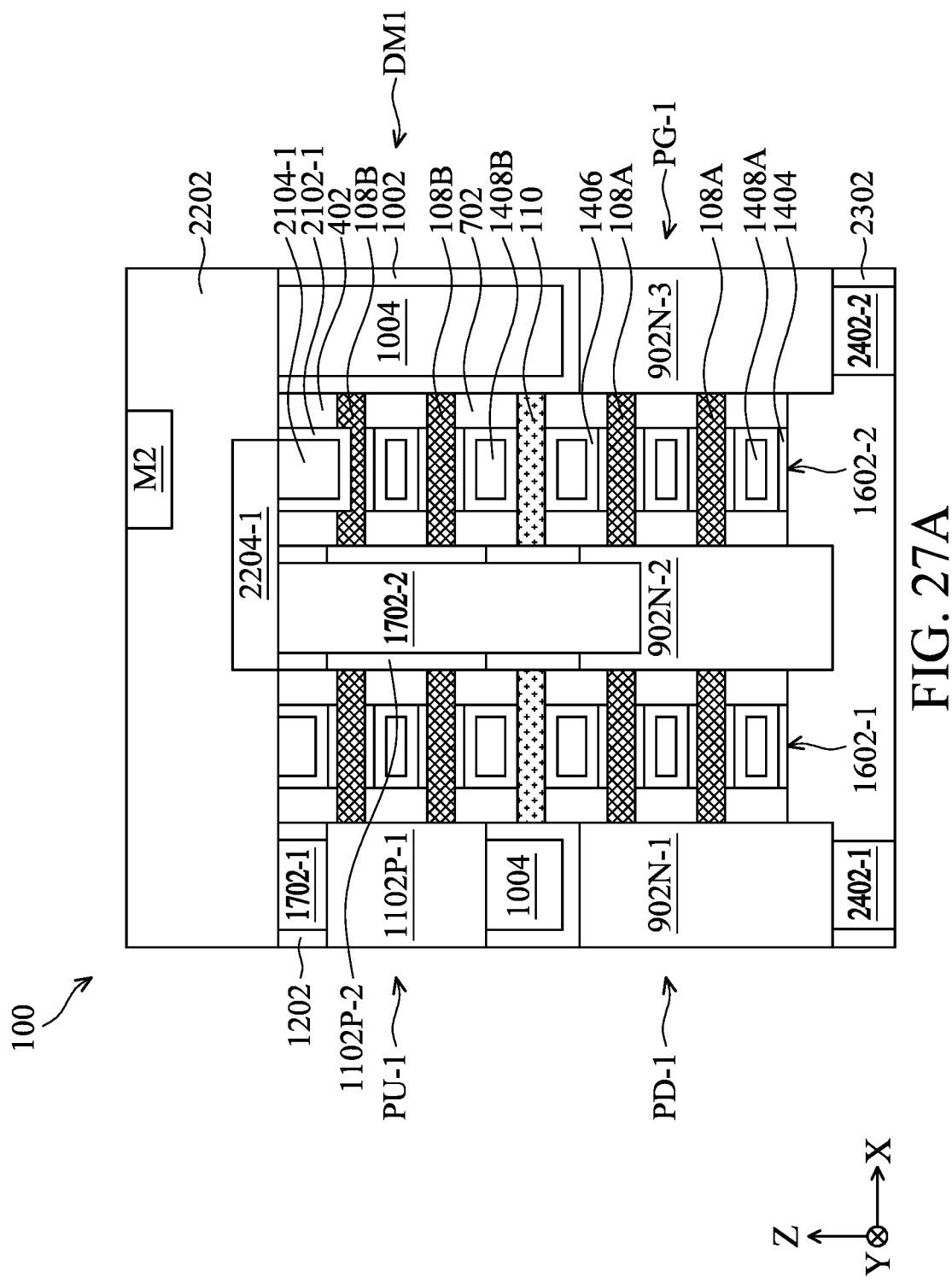
FIG. 27A is an X-Z cross-sectional view of the SRAM cell at the fabrication stages along a line A-A' of FIGS. 5 and 26, in accordance with some embodiments of the present disclosure.
Figure 27B:
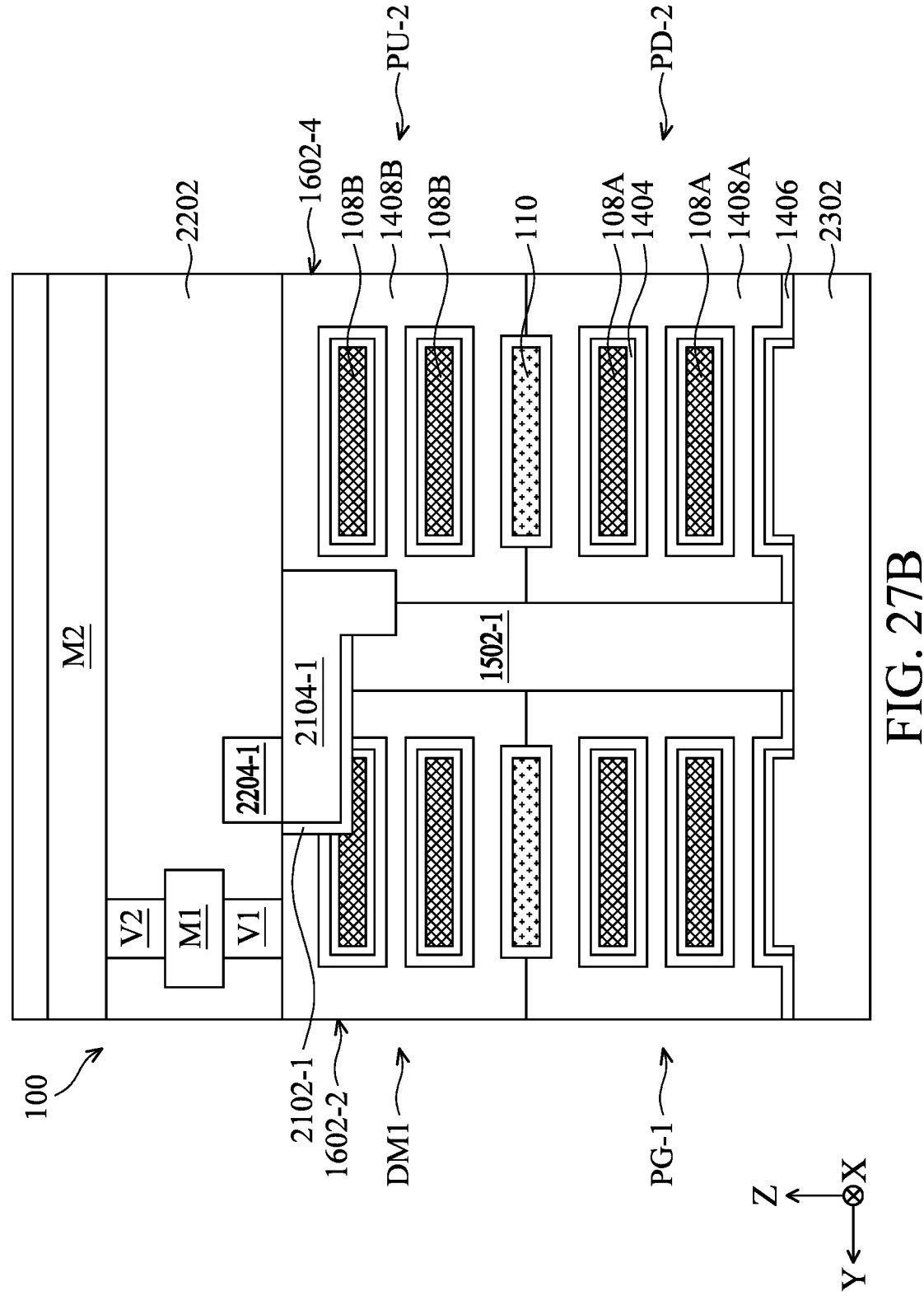
FIG. 27B is a Y-Z cross-sectional view of the SRAM cell at the fabrication stages along a line B-B' of FIGS. 5 and 26, in accordance with some embodiments of the present disclosure.
Figure 27C:
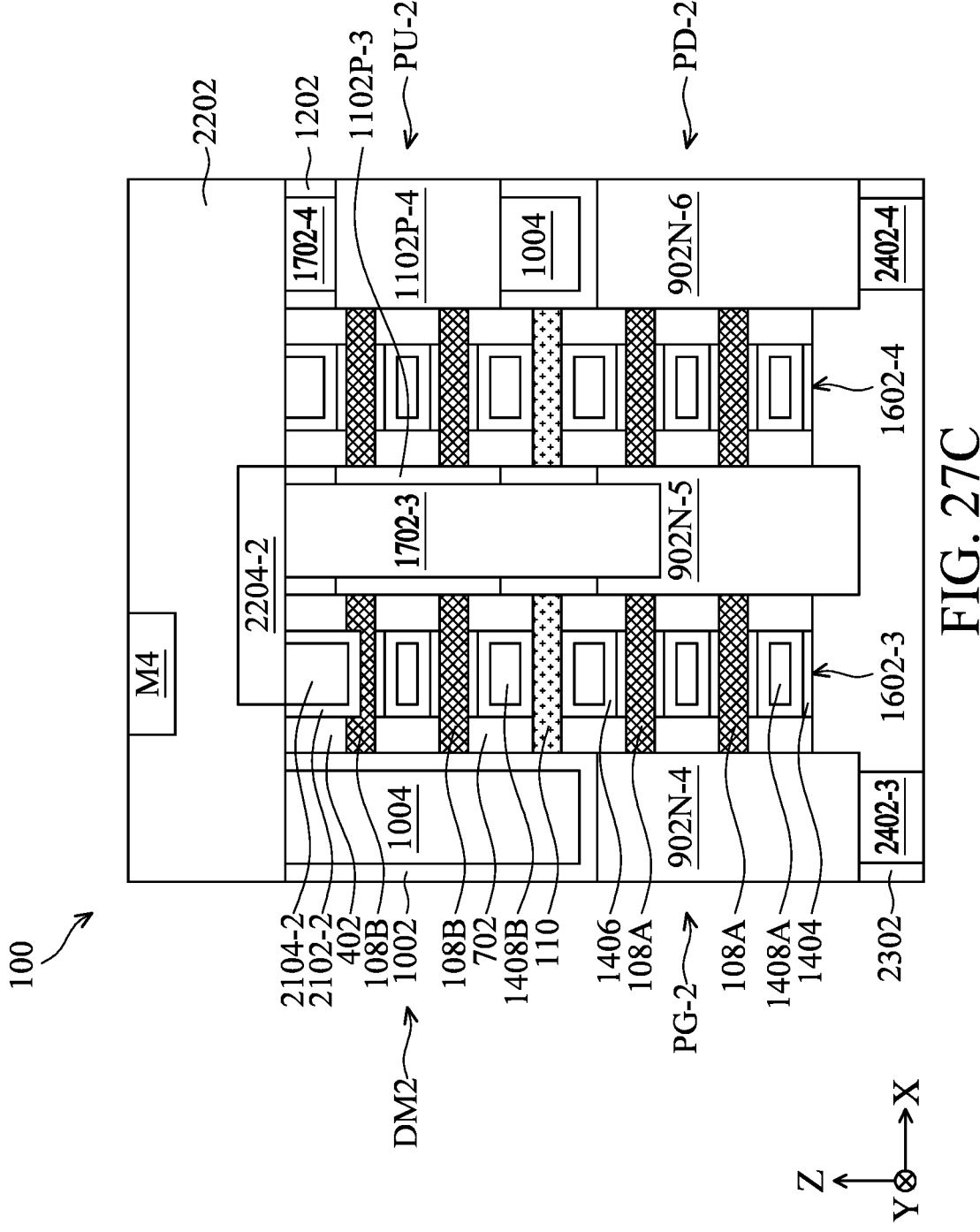
FIG. 27C is an X-Z cross-sectional view of the SRAM cell at the fabrication stages along a line C-C' of FIGS. 5 and 26, in accordance with some embodiments of the present disclosure.

Referring to FIG. 12, the polymer layers 802 are removed via a selective etching process and source/drain features 902N (including source/drain features 902N-1 to 902P-6 (the source/drain features 902N-4 to 902P-6 are shown in FIG. 27C)) are formed in the source/drain trenches 502. Specifically, the selective etching process is performed that selectively etches the polymer layers 802 below the dielectric layers 804 through the source/drain trenches 502, with minimal (or no) etching of the semiconductor layers 108A, the substrate 102, and the inner spacers 702. The selective etching process is a dry etching process, a wet etching process, other suitable etching process, or combinations thereof. After the removal of the polymer layers 802, the source/drain features 902N are formed in the lower parts of the source/drain trenches 502 and below the dielectric layers 804. The source/drain features 902N are also formed on opposite sides of the dummy gate structures 302 in the X-direction (and thus will be formed on opposite sides of gate structures, as shown in FIGS. 27A and 27C). For example, the source/drain features 902N-1 and 902N-2 are formed on opposite sides of the dummy gate structure 302-1, as shown in FIG. 12. The source/drain feature 902N-2 is formed between the dummy gate structures 302-1 and 302-2 (it should be noted that the source/drain feature 902N-5 shown in FIG. 27C is also formed between the dummy gate structures 302-1 and 302-2). The source/drain features 902N are connected to and in contact with the semiconductor layers 108A. In some aspects, the semiconductor layers 108A connect one source/drain feature 902N to another source/drain feature 902N. In some embodiments, the source/drain features 902N may have top surfaces that extend higher than top surfaces of the topmost semiconductor layers 108A (e.g., in the Z-direction). In other embodiments, the top surfaces of the source/drain features 902N are substantially level with the top surfaces of the topmost semiconductor layers 108A. Furthermore, top surfaces of the source/drain features 902N are lower than the bottom surfaces of the dielectric layers 804, the dielectric layer 110, and the semiconductor layers 108B.

One or more epitaxy processes may be employed to grow the source/drain features 902N. Epitaxy processes can implement CVD deposition techniques (for example, vapor-phase epitaxy (VPE), UHVCVD, LPCVD, and/or PECVD), molecular beam epitaxy, other suitable SEG processes, or combinations thereof. The source/drain features 902N are grown from the substrate 102 and the semiconductor layers 108A rather than the semiconductor layers 108B due to the dielectric layers 804 cover the sidewalls of the semiconductor layers 108B. The source/drain features 902N may include any suitable semiconductor materials. For example, the source/drain features 902N used for the NFET of the CFET (e.g., the pull-down transistors PD-1 and PD-2, and the pass-gate transistors PG-1 and PG-2 shown in FIGS. 26 and 27A to 27D) may include epitaxially-grown material selected from a group consisting of SiP, SiC, SiPC, SiAs, Si, or a combination thereof. In some embodiments, the epitaxially-grown material of the source/drain features 326N may be doped with n-type dopants (such as phosphorus, arsenic, other n-type dopant, or combinations thereof) having a doping concentration in a range from about $2\times10^{19}/cm^3$ to $3\times10^{21}/cm^3$. The source/drain features 902N may also be referred to as source/drain, or source/drain regions. In some embodiments, source/drain feature(s) 902N may refer to a source or a drain, individually or collectively dependent upon the context. In some embodiments, the source/drain features 902N may be referred to as n-type source/drain features. The source/drain features 902N may be doped in-situ or ex-situ. One or more annealing processes may be performed to activate the dopants in the source/drain features 902N. The annealing processes may include rapid thermal annealing (RTA) and/or laser annealing processes.

Figure 13:
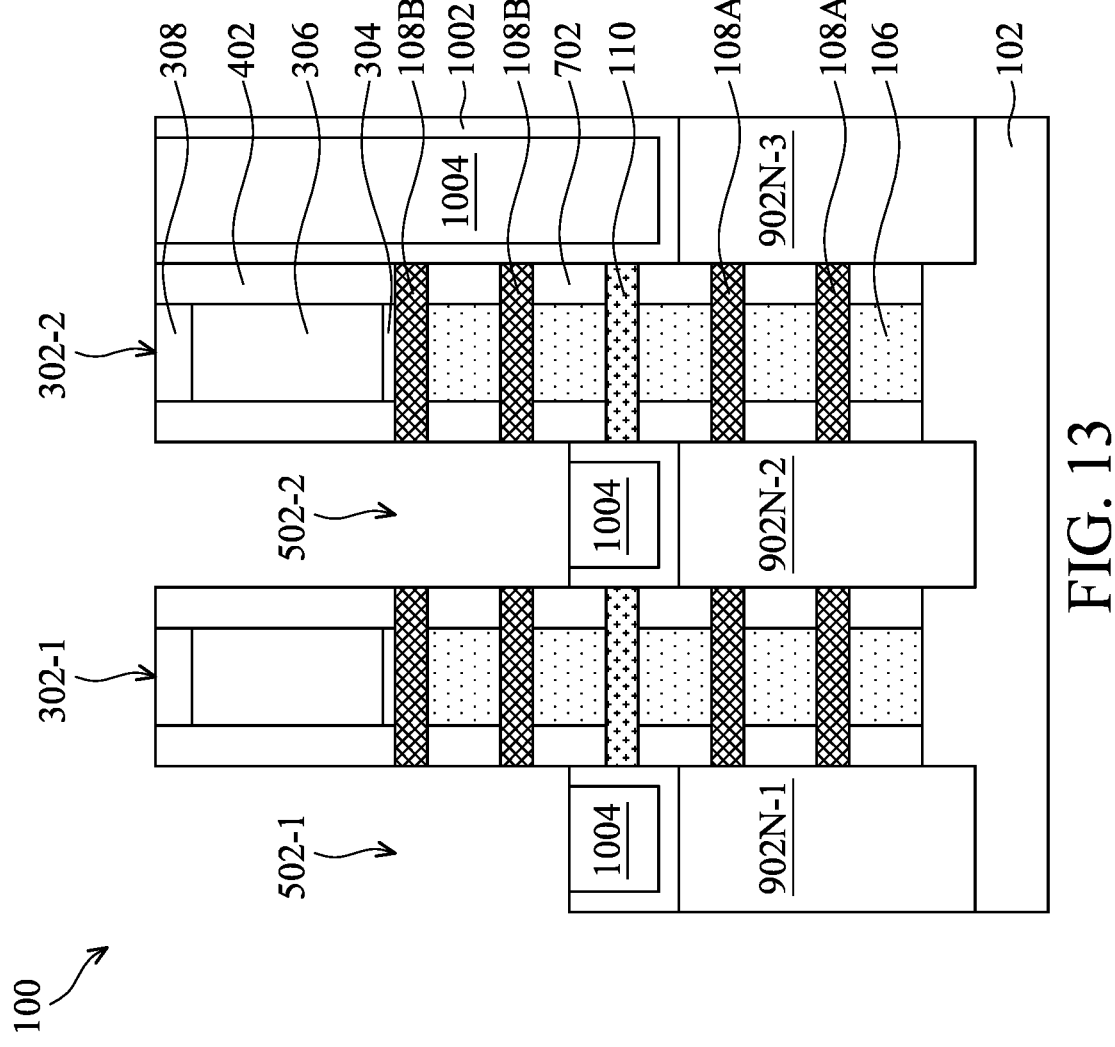

Referring to FIG. 13, the dielectric layers 804 are removed via a selective etching process, and then a contact etch stop layers (CESLs) 1002 over the source/drain features 902N and an interlayer dielectric (ILD) layer 1004 over the CESLs 1002 are formed in the source/drain trenches 502. Specifically, the selective etching process is performed that selectively etches the dielectric layers 804 over the source/drain features 902N through the source/drain trenches 502, with minimal (or no) etching of the dielectric layer 110, the semiconductor layers 108B, the gate spacers 402, and the inner spacers 702. The selective etching process is a dry etching process, a wet etching process, other suitable etching process, or combinations thereof.

After the removal of the dielectric layers 804, the CESLs 1002 are first conformally formed on the top surfaces of the source/drain features 902N and on the sidewalls of the semiconductor layers 108B and the dielectric layer 110. After the formation of the CESLs 1002, the ILD layer 1004 is then formed over the CESLs 1002 and between the CESLs 1002. Then, the CESLs 1002 and the ILD layer 1004 over the source/drain features 902N-1, 902N-2, 902N-5, and 902N-6 are recessed (The source/drain features 902N-5 and 902N-6 are referred to FIG. 27C) by performing one or more lithography and etching processes, so that the sidewalls of the semiconductor layers 108B over the source/drain features 902N-1, 902N-2, 902N-5, and 6 are exposed.

The CESLs 1002 include a material that is different than ILD layer 1004. The CESLs 1002 may include $La_2O_3$, $Al_2O_3$, SiOCN, SiOC, SiCN, $SiO_2$, SiC, ZnO, ZrN, $Zr_2Al_3O_9$, $TiO_2$, $TaO_2$, $ZrO_2$, $HfO_2$, $Si_3N_4$, $Y_2O_3$, AlON, TaCN, ZrSi, or other suitable material(s); and may be formed by CVD, PVD, ALD, or other suitable methods. The ILD layer 1304 may comprise tetraethylorthosilicate (TEOS) formed oxide, un-doped silicate glass, or doped silicon oxide such as borophosphosilicate glass (BPSG), fluoride-doped silica glass (FSG), phosphosilicate glass (PSG), boron doped silicon glass (BSG), a low-k dielectric material, other suitable dielectric material, or combinations thereof. The ILD layer 1004 may be formed by PECVD (plasma enhanced CVD), FCVD (flowable CVD), or other suitable methods.

Figure 14:
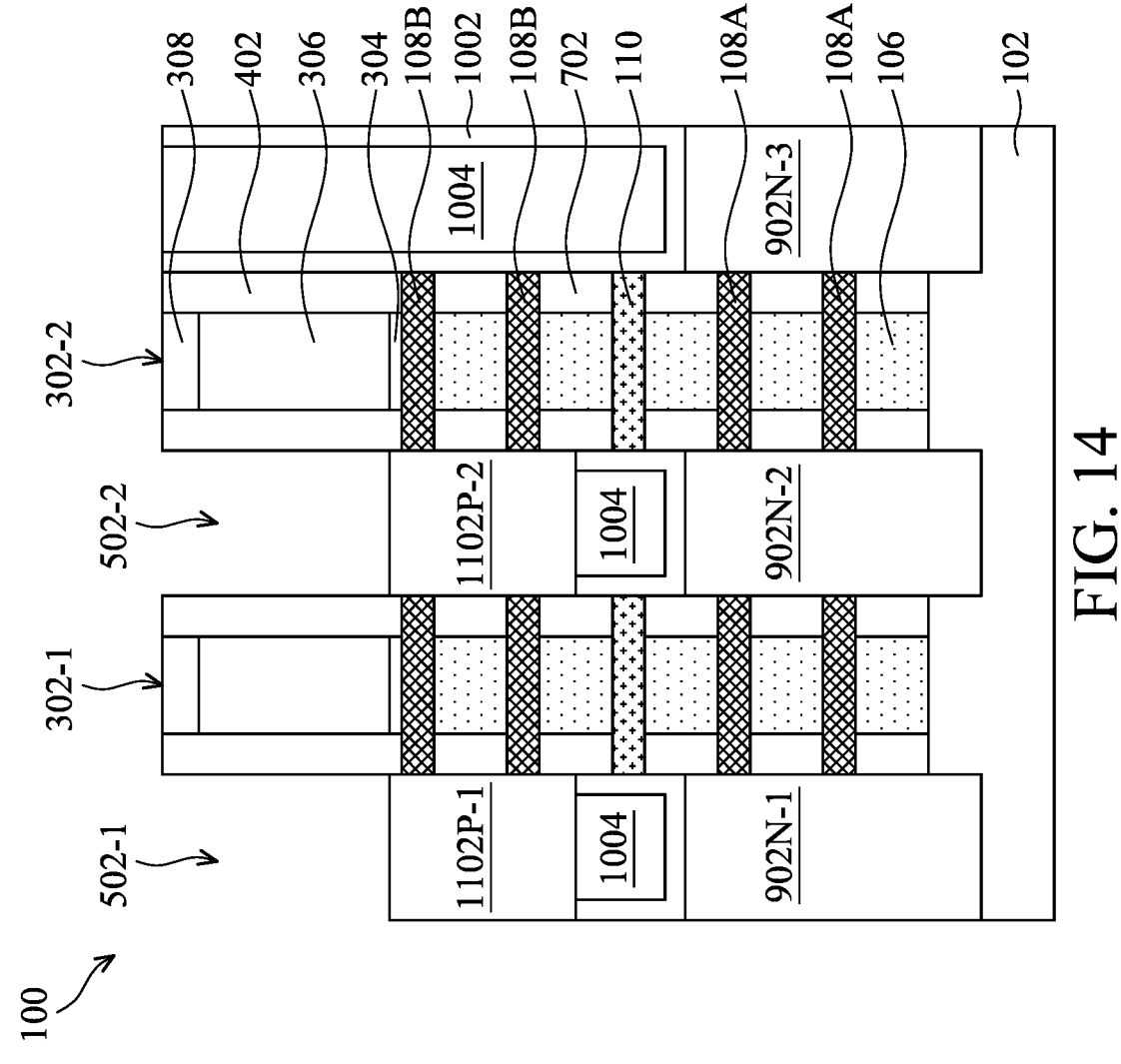

Referring to FIG. 14, source/drain features 1102P (including source/drain features 1102P-1 to 1102P-4 (the source/drain features 1102P-3 to 1102P-4 are shown in FIG. 27C)) are formed in the source/drain trenches 502. Specifically, the source/drain features 1102P are formed over the CESLs 1002 and the ILD layer 1004 in the source/drain trenches 502. The source/drain features 1102P are also formed on opposite sides of the dummy gate structures 302 in the X-direction. For example, the source/drain features 1102P-1 and 1102P-2 are formed on opposite sides of the dummy gate structure 302-1, as shown in FIG. 14. The source/drain feature 1102P-2 is formed between the dummy gate structures 302-1 and 302-2 (it should be noted that the source/drain feature 1102P-3 shown in FIG. 27C is also formed between the dummy gate structures 302-1 and 302-2). Furthermore, the source/drain features 1102P-1 and 1102P-2 are directly over the source/drain features 902N-1 and 902N-2, respectively. The source/drain features 1102P-3 and 1102P-4 are directly over the source/drain features 902N-5 and 902N-6, respectively. The source/drain features 1102P are connected to and in contact with the semiconductor layers 108B. In some aspects, the semiconductor layers 108B connect one source/drain feature 1102P to another source/drain feature 1102P. In some embodiments, the source/drain features 1102P may have top surfaces that extend higher than top surfaces of the topmost semiconductor layers 108B (e.g., in the Z-direction). In other embodiments, the top surfaces of the source/drain features 1102P are substantially level with the top surfaces of the topmost semiconductor layers 108B. Furthermore, bottom surfaces of the source/drain features 1102P are higher than the top surfaces of the dielectric layer 110. In some embodiments, the bottom surfaces of the source/drain features 1102P are lower than bottom surfaces of the bottommost semiconductor layers 108B. In other embodiments, the bottom surfaces of the source/drain features 1102P are substantially level with the bottom surfaces of the bottommost semiconductor layers 108B.

One or more epitaxy processes may be employed to grow the source/drain features 1102P. Epitaxy processes can implement CVD deposition techniques (for example, vapor-phase epitaxy (VPE), UHVCVD, LPCVD, and/or PECVD), molecular beam epitaxy, other suitable SEG processes, or combinations thereof. The source/drain features 1102P are grown from the semiconductor layers 108C. The source/drain features 1102P may include any suitable semiconductor materials. For example, the source/drain features 1102P used for the PFET of the CFET (e.g., the dummy transistors DM1 and DM2, and the pull-up transistors PU-1 and PU-2 shown in FIGS. 26 and 27A to 27D) may include epitaxially-grown material selected from a group consisting of boron-doped SiGe, boron-doped SiGeC, boron-doped Ge, boron-doped Si, boron and carbon doped SiGe, or a combination thereof. In some embodiments, the epitaxially-grown material of the source/drain features 1102P may be doped with p-type dopants (such as boron, indium, other p-type dopant, or combinations thereof) having a doping concentration in a range from about $1\times10^{19}/cm^3$ to $6\times10^{20}/cm^3$. The source/drain features 1102P may also be referred to as source/drain, or source/drain regions. In some embodiments, source/drain feature(s) 1102P may refer to a source or a drain, individually or collectively dependent upon the context. In some embodiments, the source/drain features 1102P may be referred to as p-type source/drain features. The source/drain features 1102P may be doped in-situ or ex-situ. One or more annealing processes may be performed to activate the dopants in the source/drain features 1102P. The annealing processes may include rapid thermal annealing (RTA) and/or laser annealing processes.

Referring to FIG. 15, contact etch stop layers (CESLs) 1202 over the source/drain features 1102P and an interlayer dielectric (ILD) layer 1204 over the CESLs 1202 are formed to fill the space between the gate spacers 402 and in the source/drain trenches 502. Specifically, the CESLs 1202 are conformally formed on the sidewalls of the gate spacers 402. In some embodiments, the CESLs 1202 are also conformally formed on the top surfaces of the source/drain features 1102P, as shown in FIG. 15. The ILD layer 1204 is formed over and between the CESLs 1202 to fill the space between the CESLs 1202, between the gate spacers 402 and in the source/drain trenches 502. After the formation of the CESLs 1202 and the ILD layer 1204, a CMP process is performed to reduce heights of the CESLs 1202 and the ILD layer 1204 and remove the hard mask layers 308 of the dummy gate structures 302 until top surfaces of the dummy gate electrodes 306 of the dummy gate structures 302 are exposed.

The CESLs 1202 include a material that is different than ILD layer 1204. The CESLs 1202 may include La$_2$O$_3$, Al$_2$O$_3$, SiOCN, SiOC, SiCN, SiO$_2$, SiC, ZnO, ZrN, Zr$_2$Al$_3$O$_9$, TiO$_2$, TaO$_2$, ZrO$_2$, HfO$_2$, Si$_3$N$_4$, Y$_2$O$_3$, AlON, TaCN, ZrSi, or other suitable material(s); and may be formed by CVD, PVD, ALD, or other suitable methods. The ILD layer 1204 may comprise tetraethylorthosilicate (TEOS) formed oxide, un-doped silicate glass, or doped silicon oxide such as borophosphosilicate glass (BPSG), fluoride-doped silica glass (FSG), phosphosilicate glass (PSG), boron doped silicon glass (BSG), a low-k dielectric material, other suitable dielectric material, or combinations thereof. The ILD layer 1204 may be formed by PECVD (plasma enhanced CVD), FCVD (flowable CVD), or other suitable methods.

FIGS. 16A to 25A are X-Z cross-sectional views of the SRAM cell 100 at various fabrication stages along a line A-A' of FIG. 5, in accordance with some embodiments of the present disclosure. FIGS. 16B to 25B are Y-Z cross-sectional views of the SRAM cell 100 at various fabrication stages along a line B-B' of FIG. 5, in accordance with some embodiments of the present disclosure.

Figure 16A:
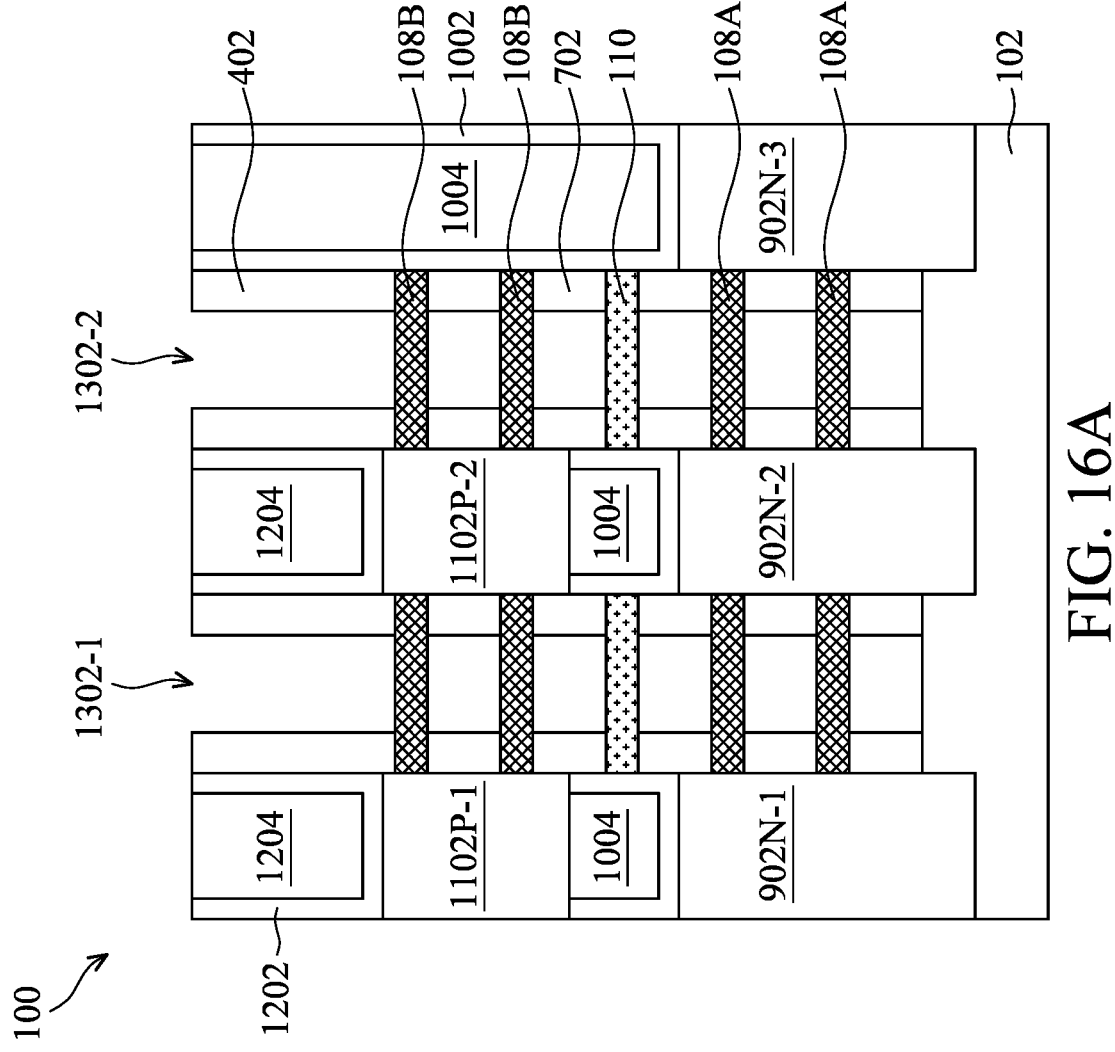
FIGS. 16A, 17A, 18A, 19A, 20A, 21A, 22A, 23A, 24A, and 25A are X-Z cross-sectional views of the SRAM cell at various fabrication stages along a line A-A' of FIG. 5, in accordance with some embodiments of the present disclosure.
Figure 16B:
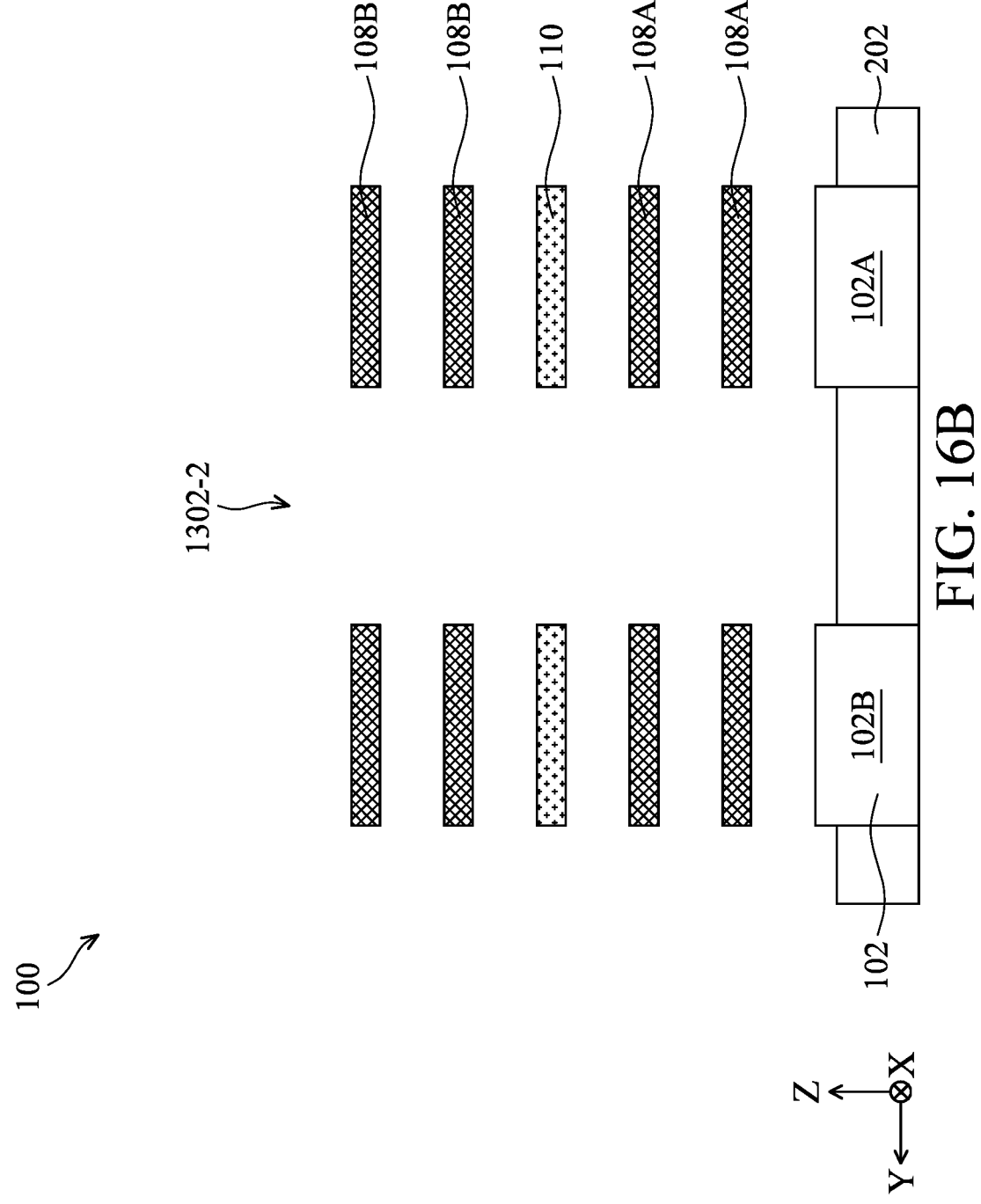
FIGS. 16B, 17B, 18B, 19B, 20B, 21B, 22B, 23B, 24B, and 25B are Y-Z cross-sectional views of the SRAM cell at various fabrication stages along a line B-B' of FIG. 5, in accordance with some embodiments of the present disclosure.

Referring to FIGS. 16A and 16B, the dummy gate structures 302 are selectively removed through any suitable lithography and etching processes. In some embodiments, the lithography process may include forming a photoresist layer (resist), exposing the resist to a pattern, performing a post-exposure bake process, and developing the resist to form a masking element, which exposes a region including the dummy gate structures 302. Then, the dummy gate structures 302 are selectively etched through the masking element. The gate spacers 402 may be used as the masking element or a part thereof. Etch selectivity may be achieved by selecting the appropriate etching chemicals, and the dummy gate structures 302 may be removed without substantially affecting the CESLs 1202 and the ILD layer 1204. The removal of the dummy gate structures 302 creates gate trenches 1302-1 and 1302-2 (may be collectively referred to as gate trenches 1302). The gate trenches 1302 expose the top surfaces of the topmost semiconductor layers 108 that underlies the dummy gate structures 302.

Still referring to FIGS. 16A and 16B, the semiconductor layers 106 of the fins 112 are selectively removed through the gate trenches 1302, using a wet or dry etching process for example, so that the semiconductor layers 108 and are exposed in the gate trench 1302 to form nanostructures stacked over each other. As such, the semiconductor layers

108 may be referred to as nanostructures. Specifically, the semiconductor layers 108A are stacked vertically in the Z-direction, and the semiconductor layers 108B are directly over the semiconductor layers 108A and are stacked vertically in the Z-direction. Such a process may also be referred to as a wire release process, a nanowire release process, a nanosheet release process, a nanowire formation process, a nanosheet formation process, or a wire formation process. In some embodiments, the removal of the semiconductor layers 106 causes the exposed semiconductor layers 108A or 108B to be spaced apart from each other in the vertical direction (e.g., in the Z-direction). The exposed semiconductor layers 108 extend longitudinally in the horizontal direction (e.g., in the X-direction). Furthermore, each of the semiconductor layers 108A connects one source/drain feature 902N to another source/drain feature 902N, and each of the semiconductor layers 108B connects one source/drain feature 1102P to another source/drain feature 1102P.

Figure 17A:
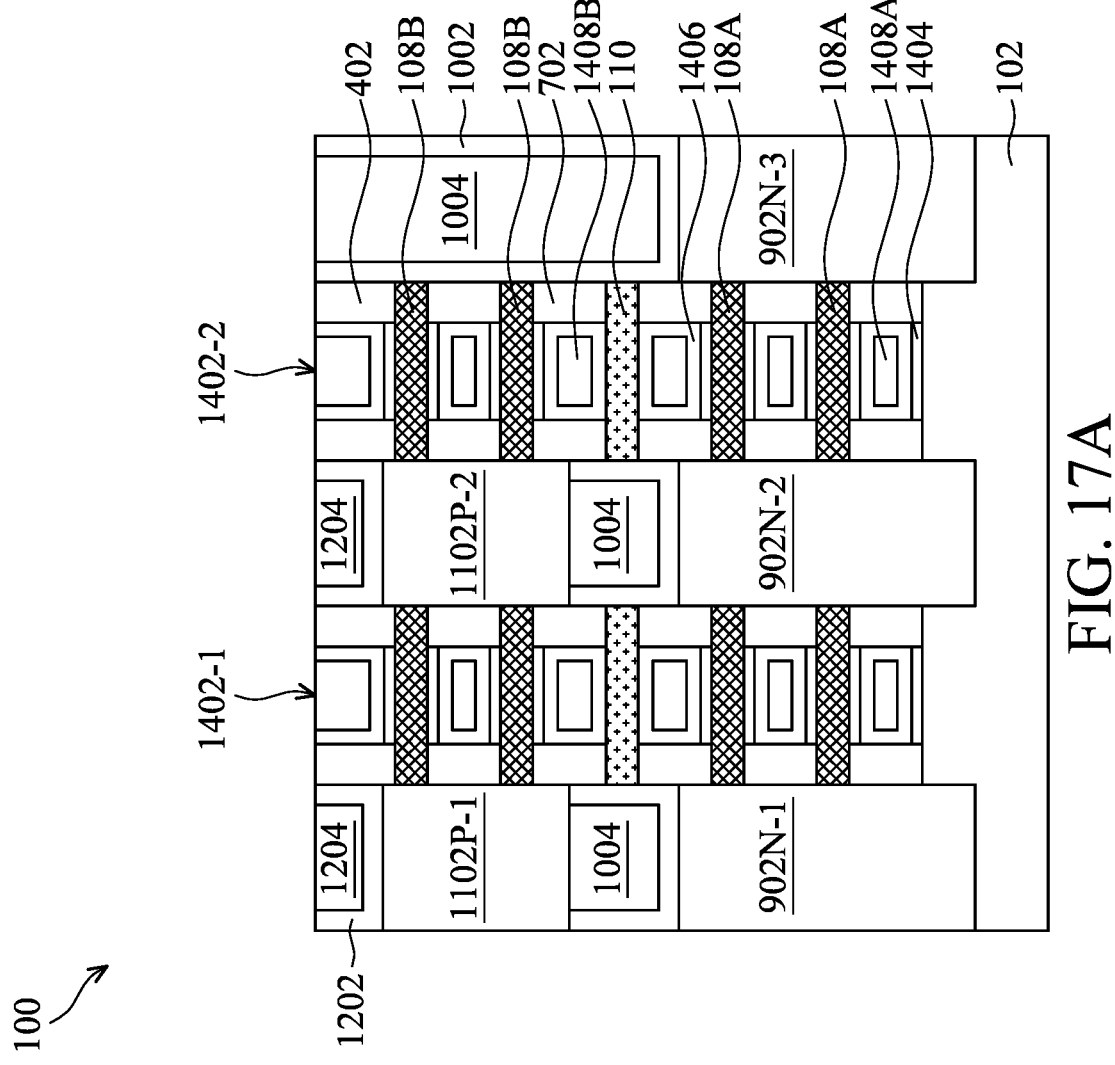
Figure 17B:
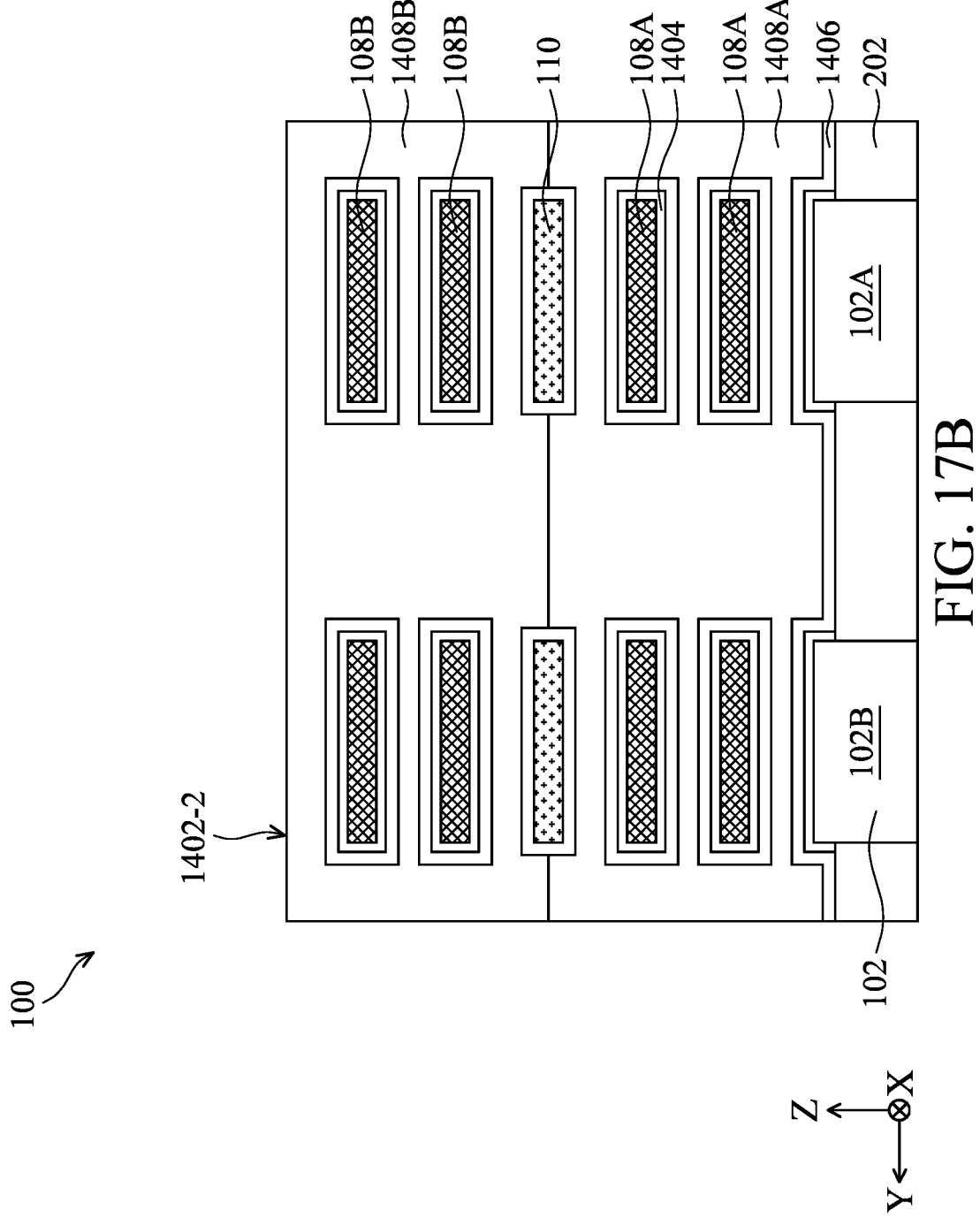

Referring to FIGS. 17A and 17B, gate structures 1402 (including gate structures 1402-1 to 1402-2) are formed in the gate trenches 1302 to wrap around the semiconductor layers 108 and the dielectric layer 110. As such, the gate structures 1402 replace the dummy gate structures 302. As shown in FIGS. 17A and 17B, the source/drain features 902N are formed on opposite sides of the gate structure 1402 in the X-direction, and the source/drain features 1102P are formed on opposite sides of the gate structure 1402 in the X-direction. The gate structures 1402 each includes gate dielectric layers 1406 and gate electrodes 1408 (including gate electrodes 1408A and 1408B) over the gate dielectric layer 1406. In some embodiments, the gate dielectric layers 1406 are formed to wrap around the semiconductor layers 108 and the dielectric layer 110, as shown in FIGS. 17A and 17B. Additionally, the gate dielectric layers 1406 also formed on the sidewalls of the inner spacers 702 and the gate spacers 402 (shown in FIG. 17A), as well as over the top surfaces of the isolation structures 202 (shown in FIG. 17B). The gate dielectric layers 1406 may include a dielectric material having a dielectric constant greater than a dielectric constant of SiO$_2$, which is approximately 3.9. For example, the gate dielectric layers 1406 may include hafnium oxide (HfO$_2$), which has a dielectric constant in a range from about 18 to about 40. Alternatively, the gate dielectric layers 1406 may include other high-K dielectrics, such as TiO$_2$, HfZrO, Ta$_2$O$_3$, HfSiO$_4$, ZrO$_2$, ZrSiO$_2$, LaO, AlO, ZrO, TiO, Ta$_2$O$_5$, Y$_2$O$_3$, SrTiO$_3$ (STO), BaTiO$_3$ (BTO), BaZrO, HfLaO, HfSiO, LaSiO, AlSiO, HfTaO, HfTiO, (Ba,Sr)TiO$_3$ (BST), Al$_2$O$_3$, Si$_3$N$_4$, oxynitrides (SiON), combinations thereof, or other suitable material. The gate dielectric layers 1406 may be formed by ALD, PVD, CVD, oxidation, and/or other suitable methods.

In some embodiments, the gate structures 1402 may further include interfacial layers 1404 to wrap around the exposed semiconductor layers 108 before the formation of the gate dielectric layer 1406, so that the gate dielectric layers 1406 are separated from the semiconductor layers 108 by the interfacial layers 1404, as shown in FIGS. 17A and 17B. Therefore, the gate dielectric layers 1406 wrap around the interfacial layer 1404 and the semiconductor layers 108. It should be noted that the interfacial layers 1404 are not formed to wrap around the exposed the dielectric layer 110, so that the gate dielectric layers 1406 are directly in contact with and wrap around the dielectric layer 110. In some embodiments, the interfacial layer 1404 may include a dielectric material such as silicon oxide (SiO$_2$), HfSiO, or silicon oxynitride (SiON). The interfacial layer may be formed by chemical oxidation, thermal oxidation, ALD, CVD, and/or other suitable method.

The gate electrodes 1408 are formed to fill the remaining spaces of the gate trenches 1302, and over the gate dielectric layers 1406 in such a way that the gate electrodes 1408 wrap around the semiconductor layers 108, the gate dielectric layer 1406, and the interfacial layers 1404 (if present). The gate electrodes 1408 each may include a single layer or alternatively a multi-layer structure. In some embodiments, the gate electrodes 1408 each may include a capping layer, a barrier layer, work function metal layers, and a fill material. As shown in FIGS. 17A and 17B, the gate electrodes 1408 each include a gate electrode 1408A and a gate electrode 1408B. The gate electrodes 1408A are used for the NFET of the CFET (e.g., the pull-down transistors PD-1 and PD-2, and the pass-gate transistors PG-1 and PG-2 shown in FIGS. 26 and 27A to 27D) to wrap around the semiconductor layers 108A and the gate dielectric layer 1406. The gate electrodes 1408B are used for the PFET of the CFET (e.g., the dummy transistors DM1 and DM2, and the pull-up transistors PU-1 and PU-2 shown in FIGS. 26 and 27A to 27D) to wrap around the semiconductor layers 108B and the gate dielectric layer 1406. In some embodiments, the gate electrode 1408B is directly over and in contact with the gate electrode 1408A, as shown in FIG. 17B.

The gate electrodes 1408A include n-type work function metal layer. In an embodiment, the n-type work function metal layer is a material such as Ti, Al, Ag, Mn, Zr, TiAl, TiAlC, TaC, TaCN, TaSiN, TaAl, TaAlC, TiAlN, other suitable n-type work function materials, or combinations thereof. For example, the n-type work function metal layer may be deposited utilizing ALD, CVD, or the like. However, any suitable materials and processes may be utilized to form the n-type work function metal layer.

The gate electrodes 1408B include p-type work function metal layer. In an embodiment, the p-type work function metal layer may be a material such as TiN, TaN, Ru, Mo, Al, WN, ZrSi2, MoSi2, TaSi2, NiSi2, WN, other metal oxides, metal nitrides, metal silicates, transition metal-oxides, transition metal-nitrides, transition metal-silicates, oxynitrides of metals, metal aluminates, zirconium silicate, zirconium aluminate, other suitable p-type work function materials, combinations of these, or the like. Additionally, the p-type work function metal layer may be deposited using a deposition process such as ALD, CVD, or the like, although any suitable deposition process may be used.

Figure 18A:
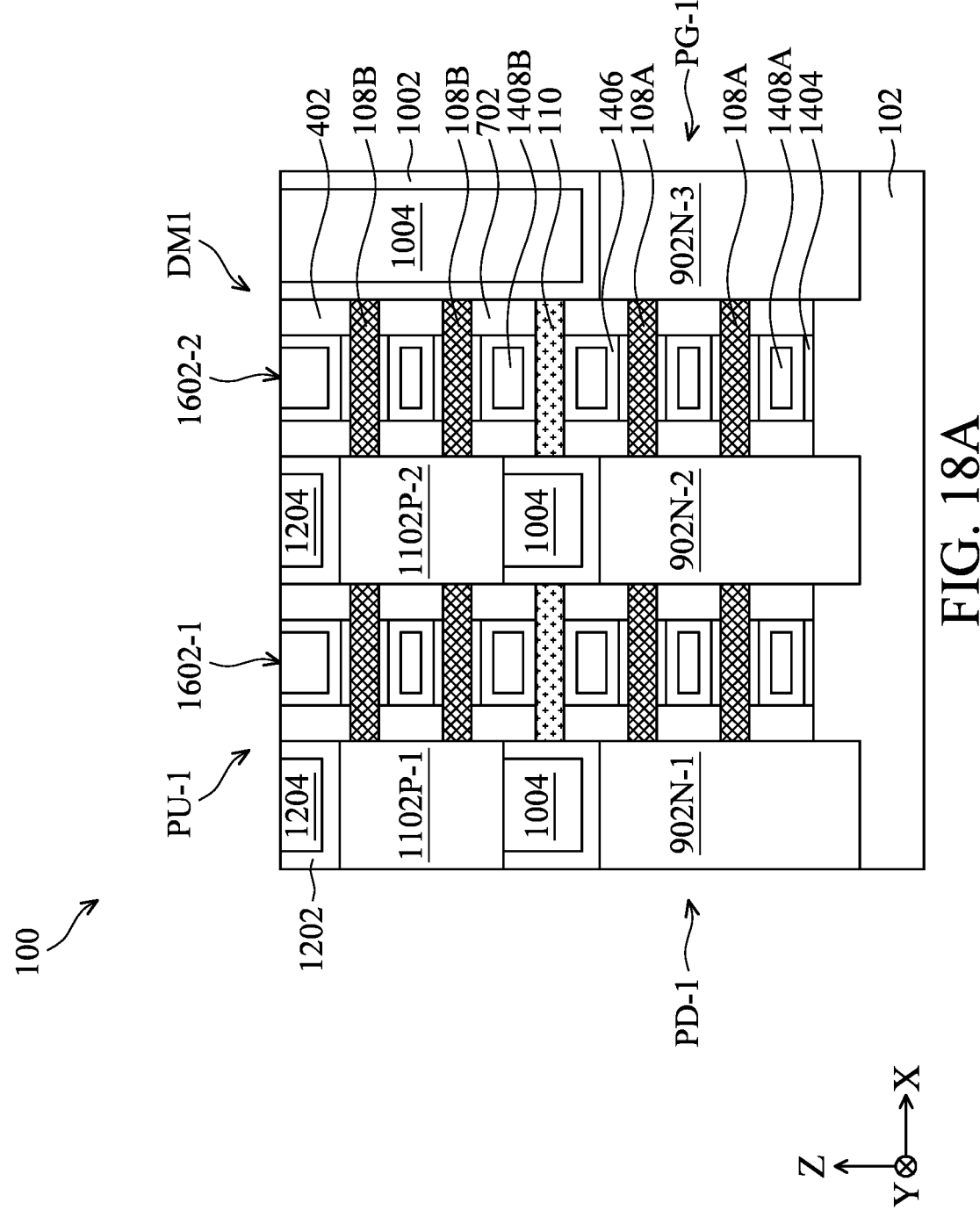
Figure 18B:
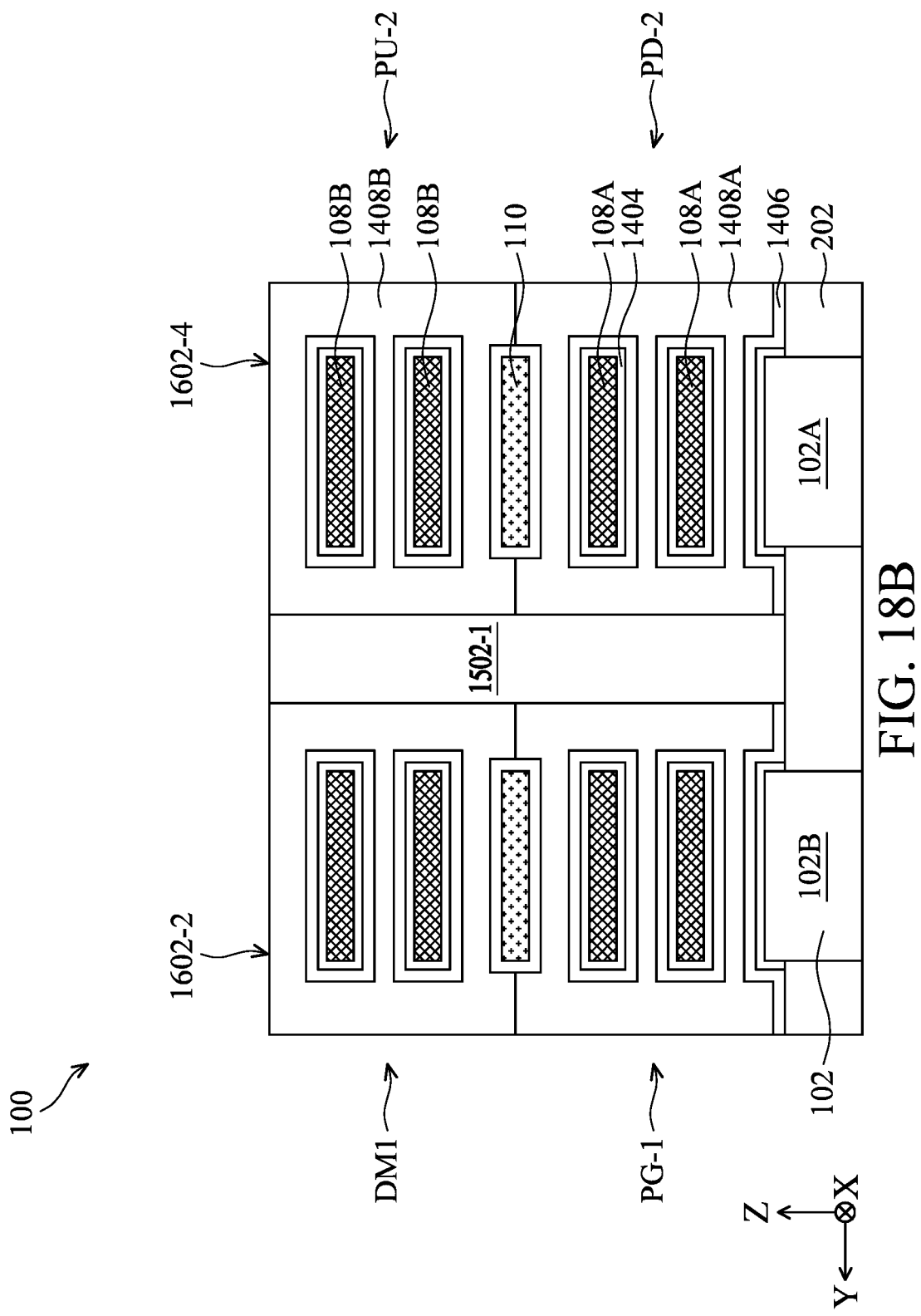
Figure 27D:
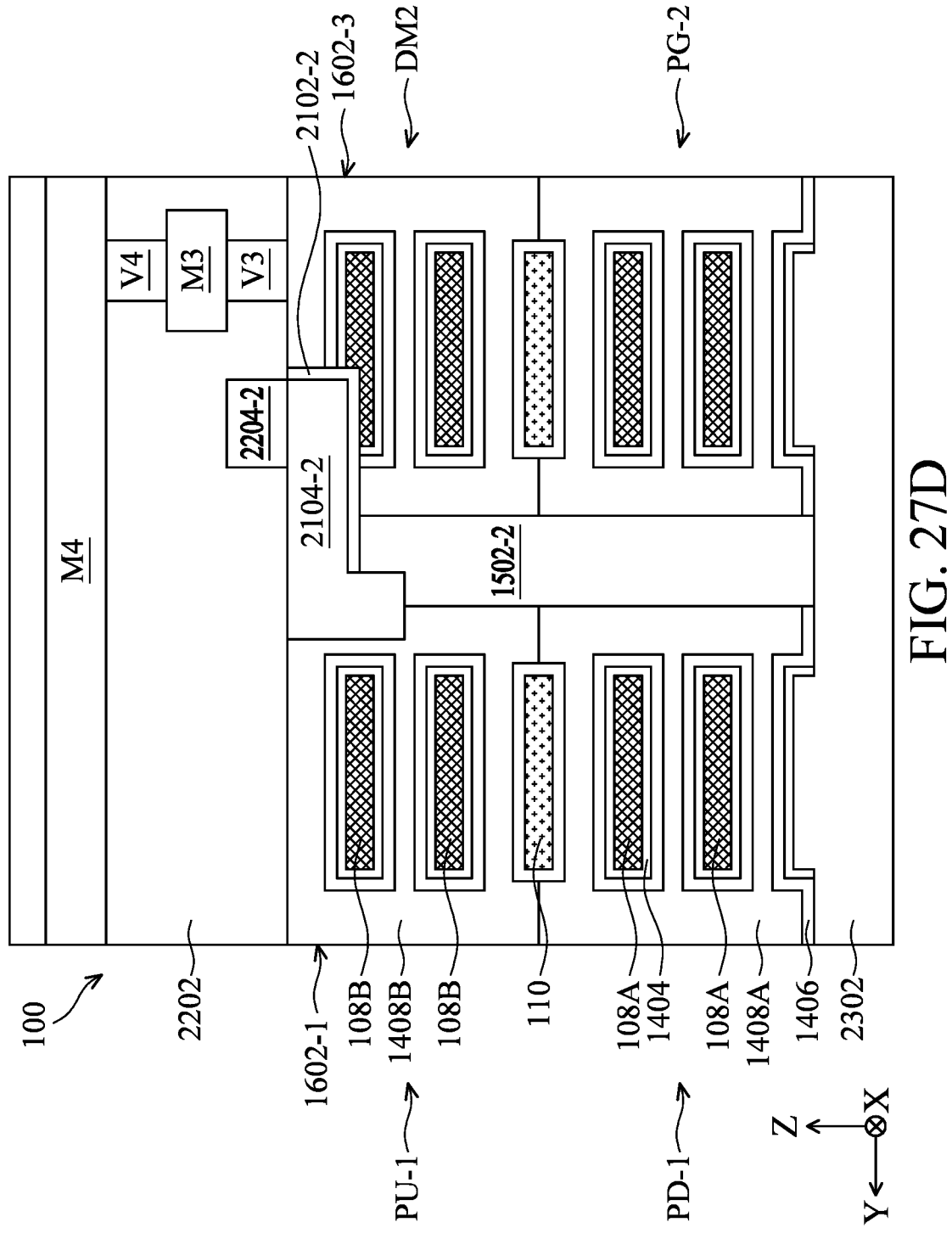
FIG. 27D is a Y-Z cross-sectional view of the SRAM cell at the fabrication stages along a line D-D' of FIGS. 5 and 26, in accordance with some embodiments of the present disclosure.

Referring to FIGS. 18A and 18B, dielectric structures 1502 (including dielectric structures 1502-1 and 1502-2 (the dielectric structures 1502-2 is referred to FIG. 27D)) are formed in the gate structures 1402 to cut each of the gate structures 1402 into two gate structures. For examples, the dielectric structure 1502-1 is form in the gate structure 1402-2 to cut the gate structure 1402-2 into a gate structure 1602-2 and a gate structure 1602-4, as shown in FIG. 18B. It should be noted that the dielectric structure 1502-2 shown in FIG. 27D is form in the gate structure 1402-1 to cut the gate structure 1402-1 into a gate structure 1602-1 and a gate structure 1602-3. As such, the dielectric structure 1502-1 is between the gate structures 1602-2 and 1602-4 in the Y-direction, and the dielectric structure 1502-2 is between the gate structures 1602-1 and 1602-3 in the Y-direction. Further, the dielectric structures 1502 are formed between the semiconductor layers 108 in the Y-direction and over the isolation structures 202, as shown in FIG. 18B. The material of the dielectric structures 1502 may be single dielectric layer or multiple layers and selected from a group consisting of $Si_3N_4$, oxide, SiOC, SiON, SiOCN, carbon content oxide, nitrogen content oxide, Hf oxide ($HfO_2$), Ta oxide ($Ta_2O_5$), Ti oxide ($TiO_2$), Zr oxide ($ZrO_2$), Al oxide ($Al_2O_3$), Y oxide ($Y_2O_3$), multiple metal content oxide, high K material (K>=9), or combinations thereof.

After the dielectric structures 1502 are formed to cut the gate structures 1402, transistors of the SRAM cell 100 are formed. As shown in FIG. 18A, the gate structure 1602-1 engaging (or wrapping around) the semiconductor layers 108A and source/drain features 902N-1 and 902N-2 form the pull-down transistor PD-1; the gate structure 1602-1 engaging (or wrapping around) the semiconductor layers 108B and source/drain features 1102P-1 and 1102P-2 form the pull-up transistor PU-1; the gate structure 1602-2 engaging (or wrapping around) the semiconductor layers 108A and source/drain features 902N-2 and 902N-3 form the pass-gate transistor PG-1; and the gate structure 1602-2 engaging (or wrapping around) the semiconductor layers 108B and source/drain features 1102P-2 form the dummy transistor DM1.

It should be understood that the gate structure 1602-4 engaging (or wrapping around) the semiconductor layers 108A and source/drain features 902N-5 and 902N-6 form the pull-down transistor PD-2; the gate structure 1602-4 engaging (or wrapping around) the semiconductor layers 108B and source/drain features 1102P-3 and 1102P-4 form the pull-up transistor PU-2; the gate structure 1602-3 engaging (or wrapping around) the semiconductor layers 108A and source/drain features 902N-4 and 902N-5 form the pass-gate transistor PG-2; and the gate structure 1602-3 engaging (or wrapping around) the semiconductor layers 108B and source/drain features 1102P-3 form the dummy transistor DM2, as shown in FIG. 27C.

As shown in FIG. 18A, the pull-down transistor PD-1 and the pull-up transistor PU-1 are stacked vertically in the Z-direction and share the gate structure 1602-1, and the pass-gate transistor PG-1 and the dummy transistor DM1 are stacked vertically in the Z-direction and share the gate structure 1602-2. It should be understood that the pull-down transistor PD-2 and the pull-up transistor PU-2 are stacked vertically in the Z-direction and share the gate structure 1602-4, and the pass-gate transistor PG-2 and the dummy transistor DM2 are stacked vertically in the Z-direction and share the gate structure 1602-3.

In some aspects, the semiconductor layers 108A of the pull-down transistor PD-1 and the semiconductor layers 108B of the pull-up transistor PU-1 are wrapped around the gate structure 1602-1; the semiconductor layers 108A of the pass-gate transistor PG-1 and the semiconductor layers 108B of the dummy transistor DM1 are wrapped around the gate structure 1602-2; the semiconductor layers 108A of the pull-down transistor PD-2 and the semiconductor layers 108B of the pull-up transistor PU-2 are wrapped around the gate structure 1602-4; and the semiconductor layers 108A of the pass-gate transistor PG-2 and the semiconductor layers 108B of the dummy transistor DM2 are wrapped around the gate structure 1602-3, as shown in FIGS. 18A, 18B and 27A to 27D.

Figure 19A:
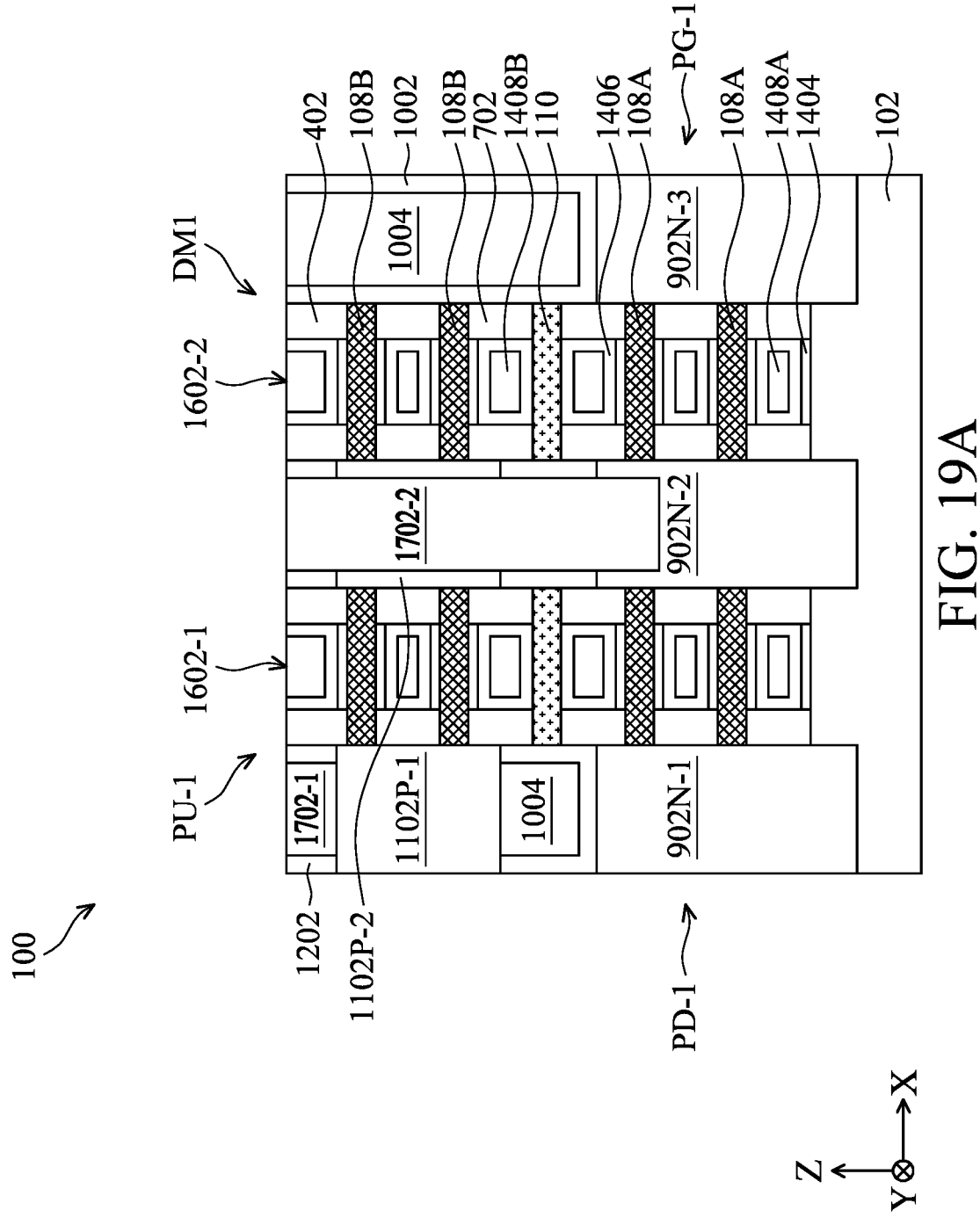
Figure 19B:
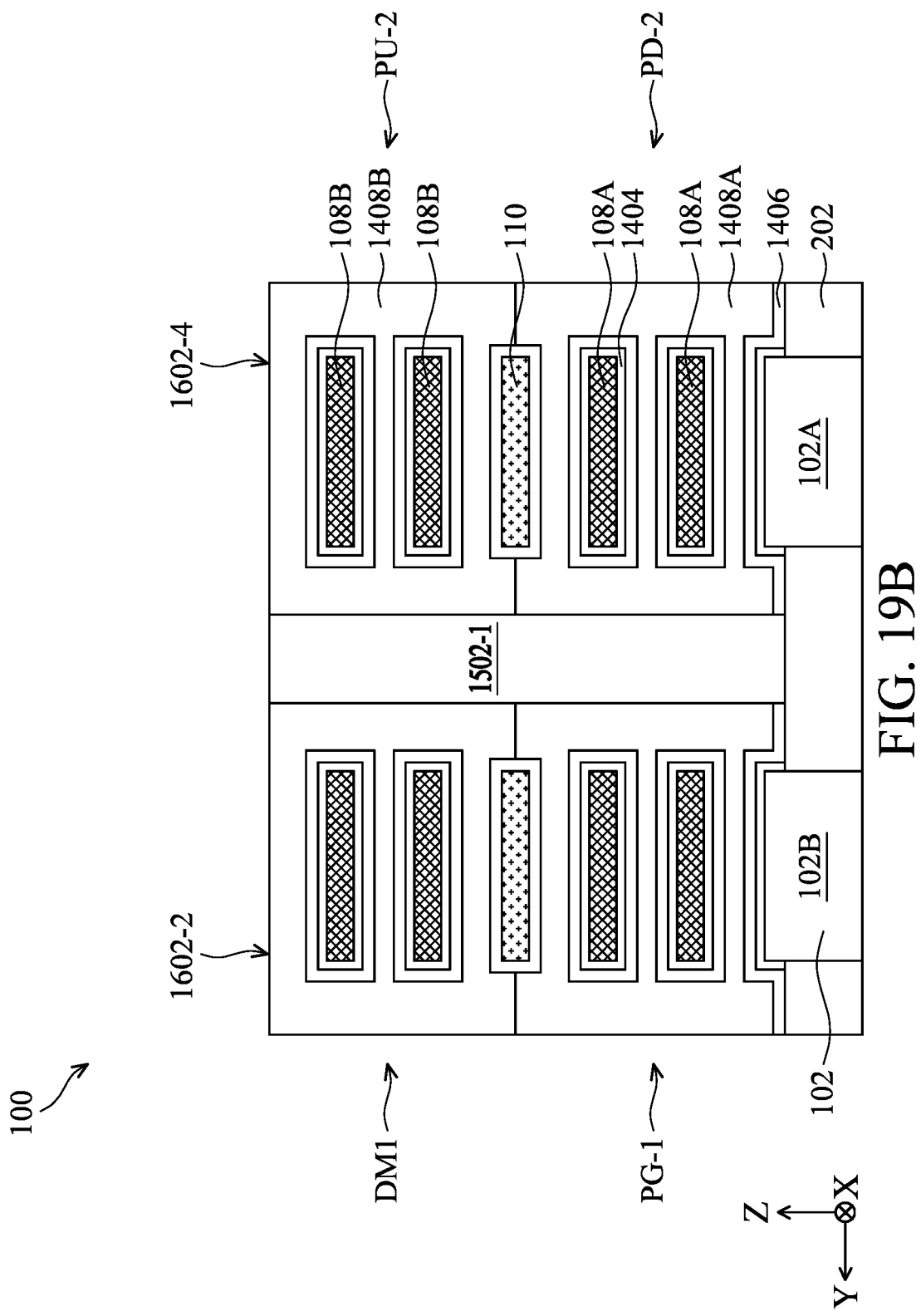

Referring to FIGS. 19A and 19B, the source/drain contacts 1702 (including source/drain contacts 1702-1 to 1702-4 (the source/drain contacts 1702-3 and 1702-4 are referred to FIG. 27C)) is formed over the source/drain features. More specifically, the source/drain contact 1702-1 and 1702-4 are formed over and electrically connected to the source/drain feature 1102P-1 of the pull-up transistor PU-1 and the source/drain feature 1102P-4 of the pull-up transistor PU-2, respectively, as shown in FIGS. 19A and 27C. The source/drain contacts 1702-2 and 1702-3 are formed over the source/drain features 902N-2 and 902N-5, respectively, as shown in FIGS. 19A and 27C. The source/drain contact 1702-2 further passes through the CESL 1202, the ILD layer 1204, the source/drain feature 1102P-2, the CESL 1002, and the ILD layer 1004, and the source/drain contact 1702-3 further passes through the CESL 1202, the ILD layer 1204, the source/drain feature 1102P32, the CESL 1002, and the ILD layer 1004. The source/drain contact 1702-2 is electrically connected to the source/drain feature 1102P-2 of the pull-up transistor PU-1 (or shared by the pull-up transistor PU-1 and the dummy transistor DM1) and the source/drain feature 902N-2 shared by the pull-down transistor PD-1 and the pass-gate transistor PG-1 to construct the common drain (CD1) and the storage node SN discussed above. The source/drain contact 1702-3 is electrically connected to the source/drain feature 1102P-3 of the pull-up transistor PU-2 (or shared by the pull-up transistor PU-2 and the dummy transistor DM2) and the source/drain feature 902N-5 shared by the pull-down transistor PD-2 and the pass-gate transistor PG-2 to construct the common drain (CD2) and the storage node SNB discussed above. In some embodiments, portions of the source/drain feature 902N-2 and 902N-5 are removed during the formation of the source/drain contacts 1702-2 and 1702-3. The source/drain contacts 1702 may include conductive material, such as Al, Cu, W, Co, Ti, Ta, Ru, Rh, Ir, Pt, TiN, TiAl, TiAlN, TaN, TaC, combinations of these, or the like, although any suitable material may be deposited using a deposition process such as sputtering, CVD, electroplating, electroless plating, or the like. In some embodiments, the source/drain contacts 1702 may include single conductive material layer or multiple conductive layers.

Figure 20A:
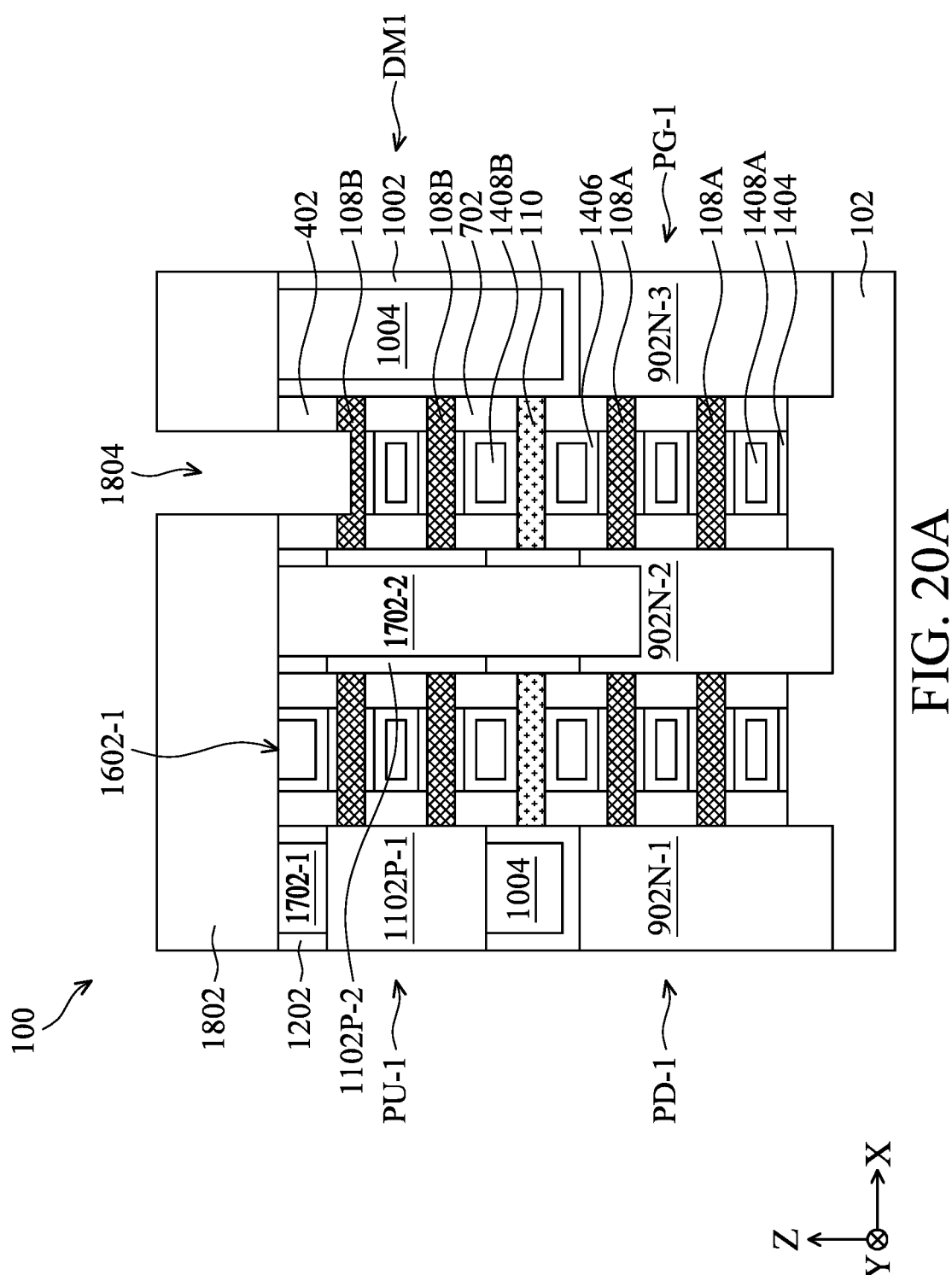
Figure 20B:
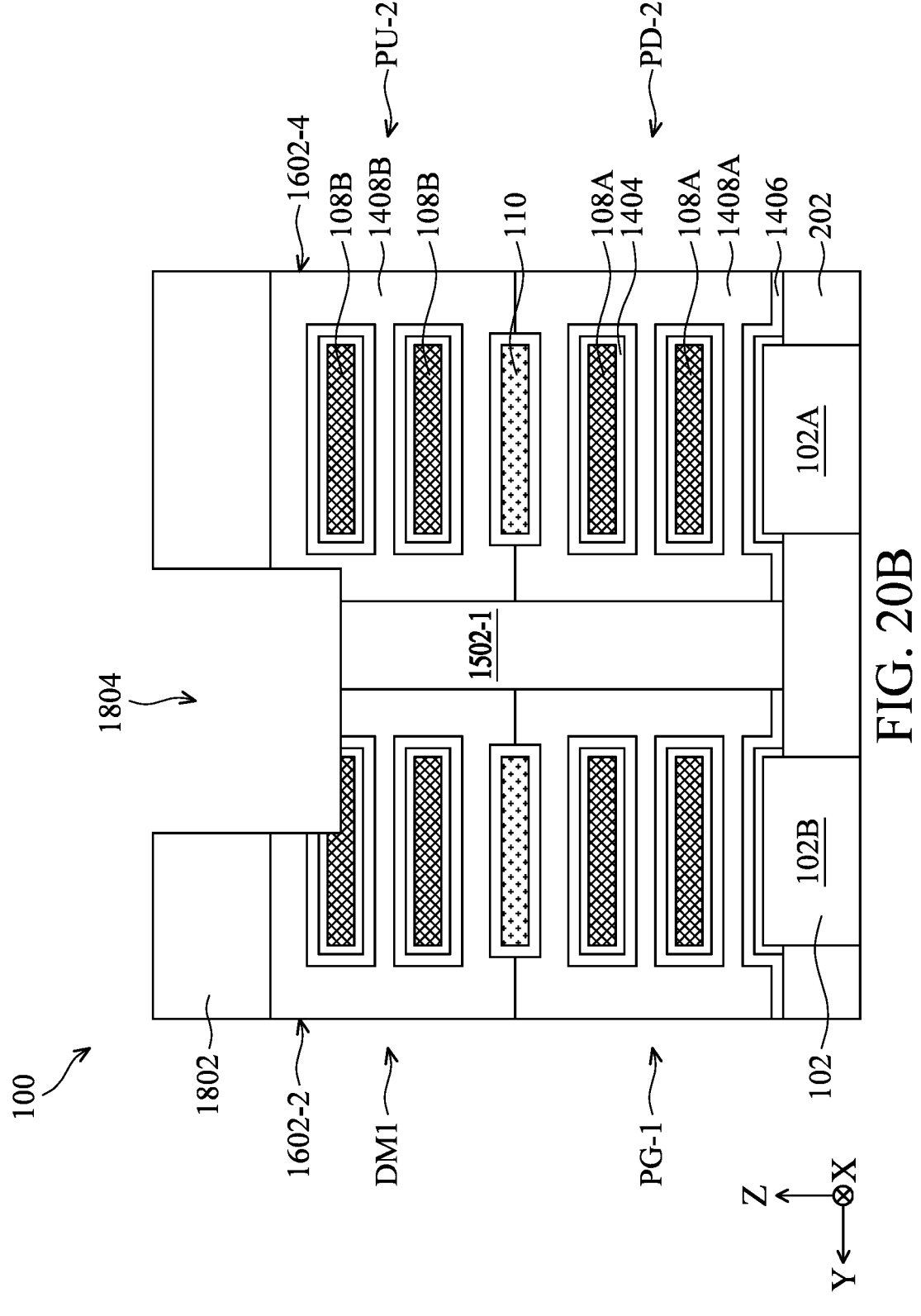

Referring to FIGS. 20A and 20B, portions of the dielectric structure 1502-1, the gate structures 1602-2 and 1602-4 are recessed by performing one or more lithography and etching processes to form a trench 1804. In some embodiments, the lithography and etching processes may include forming a photoresist layer 1802 over the dielectric structure 1502-1, the gate structures 1602-2 and 1602-4, exposing the photoresist layer 1802 to a pattern corresponding to the trench 1804, performing a post-exposure bake process, and developing the photoresist layer 1802 to form an opening, which exposes a region to be recessed for the trench 1804. Then, the portions of the dielectric structure 1502-1, the gate structures 1602-2 and 1602-4 exposed by the opening of the photoresist layer 1802 are etched to form the trench 1804. As shown in FIGS. 20A and 20B, portions of the semiconductor layer 108B, the interfacial layers 1404, and gate dielectric layer 1406 of the dummy transistor DM1 are removed. It should be understood that portions of the dielectric structure 1502-2, the gate structures 1602-1 and 1602-3 are also recessed by performing the lithography and etching processes to form a trench.

Figure 21A:
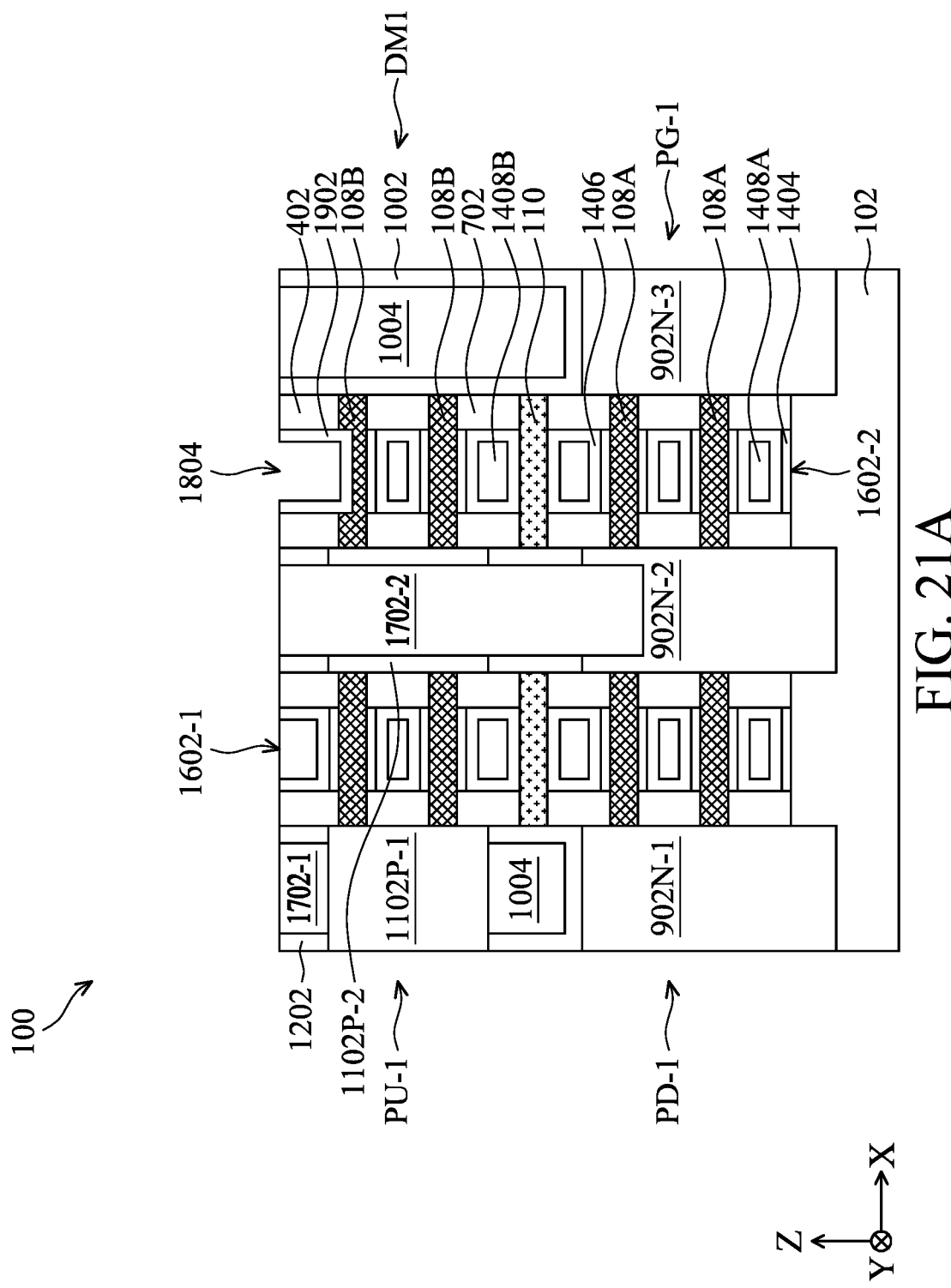
Figure 21B:
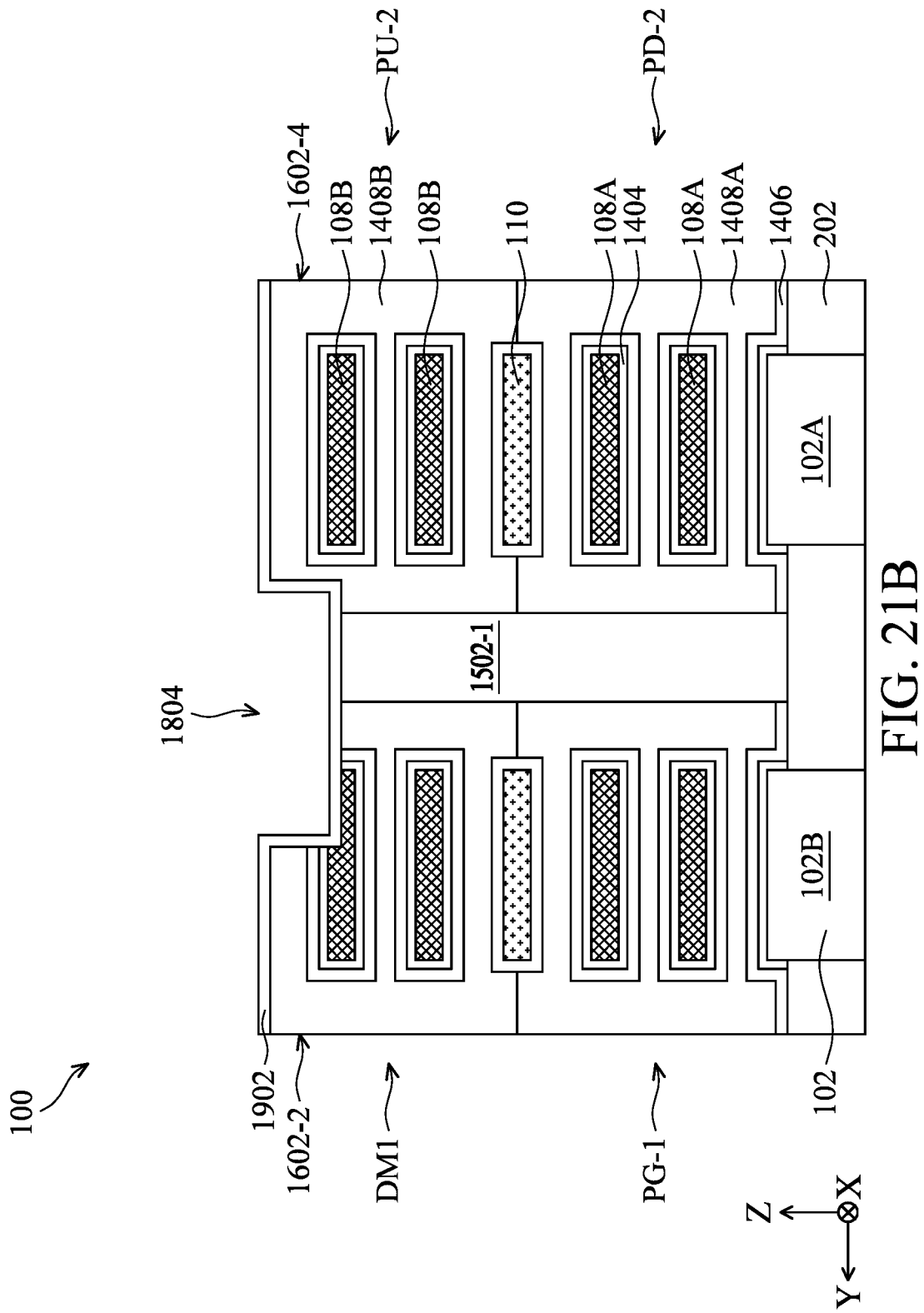

Referring to FIGS. 21A and 21B, the photoresist layer 1802 is removed and an insulating material 1902 is conformally formed in the trench 1804. More specifically, the insulating material 1902 for liner layers 2102-1 and 2102-2 (discussed in below) are conformally formed over the dielectric structure 1502-1, the gate structures 1602-2 and 1602-4 exposed by the trench 1804, as shown in FIGS. 21A and 21B. It should be understood that the insulating material 1902 is also conformally formed over the dielectric structure 1502-2, the gate structures 1602-1 and 1602-3 exposed by the trench discussed above. The insulating material 1902 of the liner layers 2102-1 and 2102-2 include silicon nitride (Si$_3$N$_4$), silicon oxide (SiO$_2$), silicon carbide (SiC), silicon oxycarbide (SiOC), silicon oxynitride (SiON), silicon carbon nitride (SiCN), silicon oxycarbon nitride (SiOCN), carbon doped oxide, nitrogen doped oxide, porous oxide, or combinations thereof.

Figure 22A:
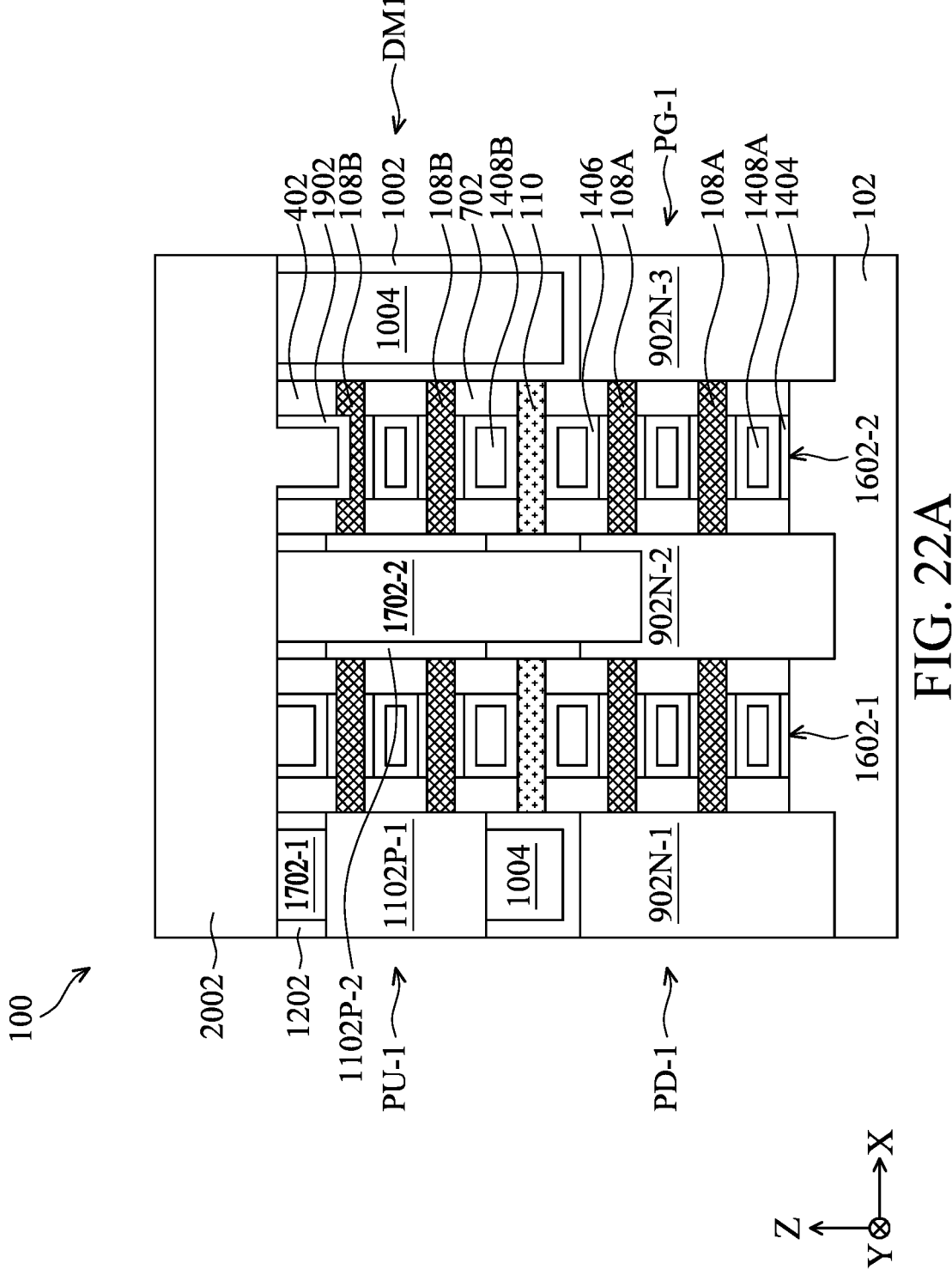
Figure 22B:
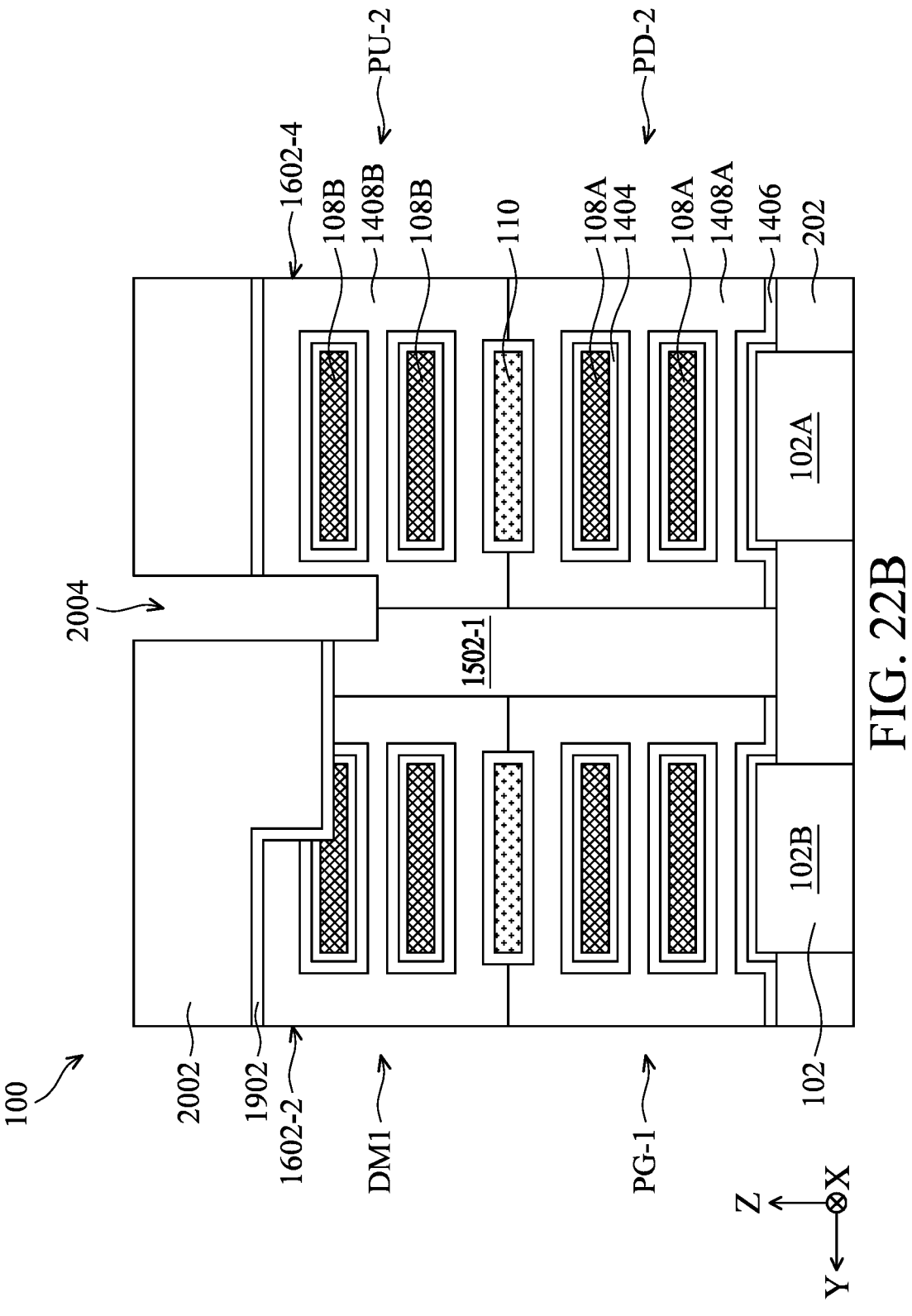

Referring to FIGS. 22A and 22B, portions of the insulating material 1902 over the gate structure 1602-4 in the trench 1804 (and over the gate structure 1602-1 in the trench exposing dielectric structure 1502-2, the gate structures 1602-1 and 1602-3 discussed above) are removed to expose a top surface and a sidewall of the gate structure 1602-4 (and a top surface and a sidewall of the gate structure 1602-1), and then the exposed top surface of the gate structure 1602-4 (and the exposed top surface of the gate structure 1602-1) is further recessed to expend the trench 1804 (and the trench exposing the gate structure 1602-1 discussed above), by performing one or more lithography and etching processes. In some embodiments, the lithography and etching processes may include forming a photoresist layer 2002 over the insulating material 1902, exposing the photoresist layer 2002 to a pattern for removing the portions of the insulating material 1902 and recessing the gate structures 1602, performing a post-exposure bake process, and developing the photoresist layer 2002 to form openings 2004, which exposes the portions of the insulating material 1902. Then, the portions of the insulating material 1902 in the openings 2004 of the photoresist layer 1802 are etched to expend the trench 1804 and the trench exposing the gate structure 1602-1 discussed above. Further, portions of the dielectric structures 1502 are removed, as shown in FIGS. 22B and 27D.

Figure 23A:
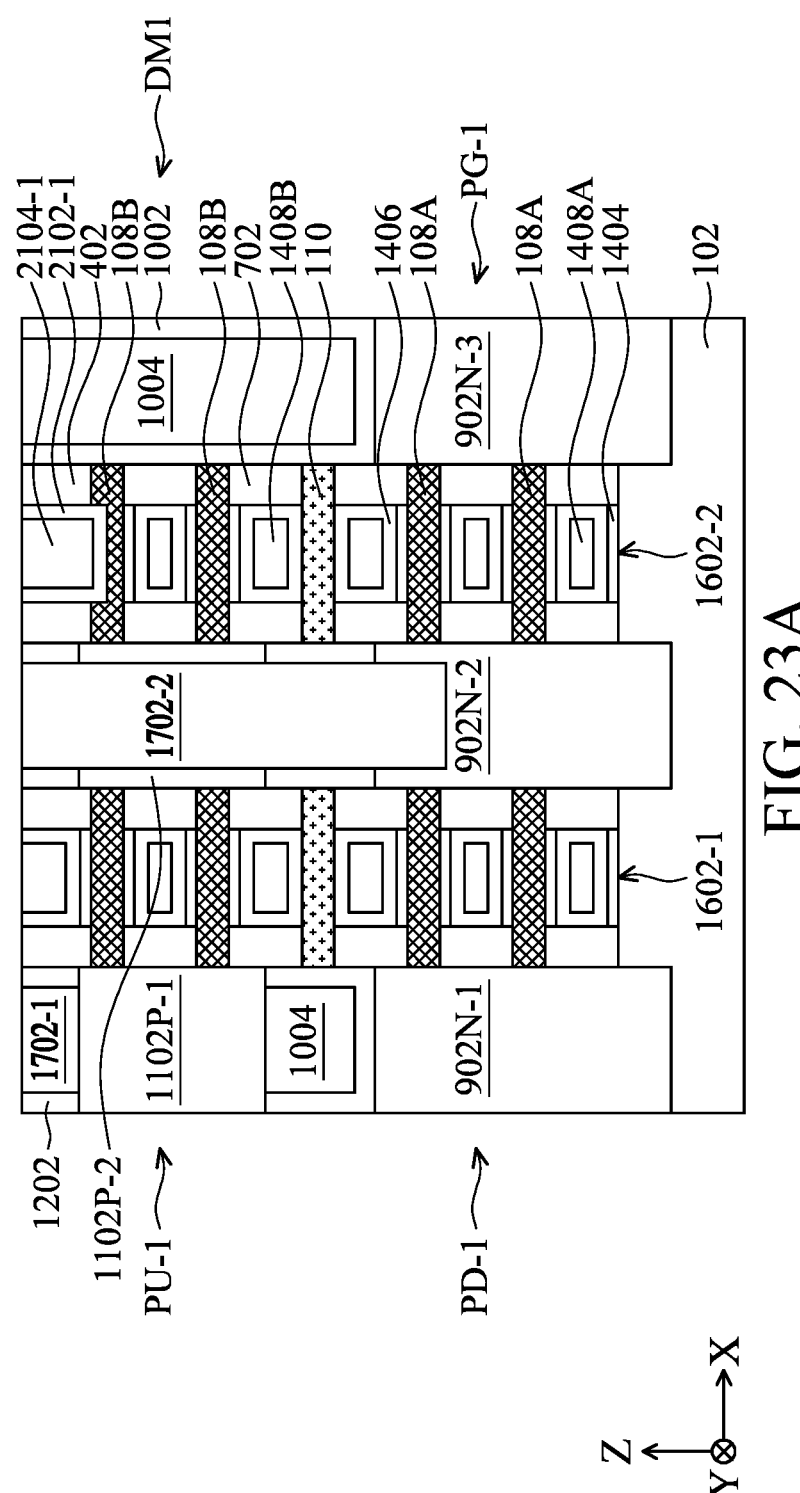
Figure 23B:
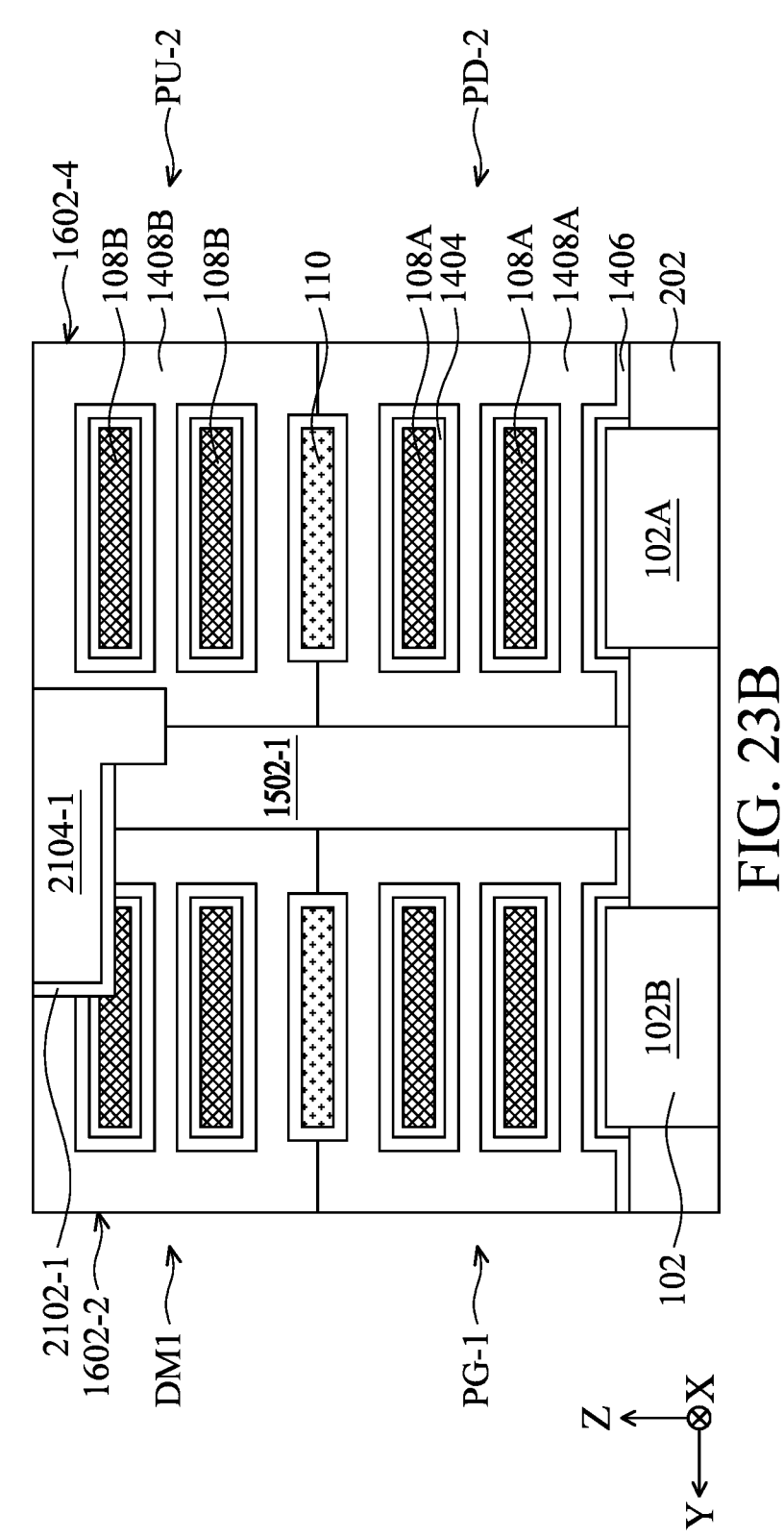

Referring to FIGS. 23A and 23B, the photoresist layer 2002 is removed and connection structures 2104 (including connection structures 2104-1 and 2104-2 (the connection structure 2104-2 is referred to FIG. 27D)) are formed in the trench 1804 and the trench exposing the gate structure 1602-1 discussed above. More specifically, after the removal of the photoresist layer 2002, a conductive material is formed over the insulating material 1902, the gate structure 1602-4, and the gate structure 1602-1 to fill the trench 1804 and the trench exposing the gate structure 1602-1 discussed above. Then, a CMP process is performed to portions of the conductive material and the insulating material 1902 over the trenches until top surface of the gate structures 1602 are exposed to form the liner layers 2102 (including liner layers 2102-1 and 2102-2 (the liner layers 2102-2 is referred to FIG. 27D)) and connection structures 2104 in the trenches. The conductive material of the connection structures 2104-1 and 2104-2 is selected from a group consisting of titanium (Ti), titanium nitride (TiN), tantalum (Ta), tantalum nitride (TaN), titanium aluminum nitride (TiAlN), tungsten nitride (WN), tungsten (W), cobalt (Co), molybdenum (Mo), ruthenium (Ru), platinum (Pt), aluminum (Al), copper (Cu), other conductive materials, or a combination thereof.

As such, the liner layer 2102-1 is formed over the dielectric structure 1502-1 and the gate structure 1602-2, and the liner layer 2102-1 is formed over the dielectric structure 1502-2 and the gate structure 1602-3, as shown in FIGS. 23B and 27D. In some embodiments, thicknesses of the liner layer 2102$s$ are in a range from about 1 nm to about 5 nm. Further, the connection structure 2104-1 is formed over and electrically connected to the gate structure 1602-4, and the connection structure 2104-2 is formed over and electrically connected to the gate structure 1602-3, as shown in FIGS. 23B and 27D.

It should be noted that the liner layer 2102-1 is also formed between the connection structure 2104-1 and gate structure the 1602-2 to separate the connection structure 2104-1 and gate structure the 1602-2, and the liner layer 2102-2 is also formed between the connection structure 2104-2 and gate structure the 1602-3 to separate the connection structure 2104-2 and gate structure the 1602-3. Therefore, the connection structure 2104-1 is also formed over and electrically isolated from the gate structure 1602-2, and the connection structure 2104-2 is also formed over and electrically isolated from the gate structure 1602-3, as shown in FIGS. 23B and 27D.

In some embodiments, each of the connection structures 2104 is an L-shape in the Y-Z cross-sectional view, as shown in FIGS. 23B and 27D. In some embodiments, a bottom surface of the connection structures 2104-1 (or 2104-2) in contact with the liner layer 2102-1 (or 2102-2) are lower than a topmost surface of the semiconductor layers 108 of the dummy transistor DM1 (or DM2), as shown in FIGS. 23A and 23B (or FIGS. 27A to 27D). In some embodiments, the connection structures 2104 are in contact with sidewalls of the dielectric structures 1502. In some embodiments, a bottom surface (or a bottommost surface) of the connection structure 2104-1 (2104-2) is in contact with the dielectric structures 1502-1 (or 1502-2). As shown in FIG. 23B (or FIG. 27D), a height of a sidewall of the connection structure 2104-1 (2104-2) in contact with the gate structures 1602-4 (1602-1) is in a range from about 5 nm to about 20 nm in the Z-direction. In some embodiments, lengths of the connection structures 2104 in the Y-direction are in a range from about 50 nm to about 70 nm. In some embodiments, lengths of bottommost surfaces of the connection structures 2104 in the Y-direction are in a range from about 5 nm to about 10 nm. As shown in FIG. 23B (or FIG. 27D), a distances between the connection structure 2104-1 (or 2104-2) and the topmost semiconductor layer 108B of the pull-up transistor PU-2 (or PU-1) in the Y-direction are in a range from about 1 nm to about 5 nm.

Figure 24A:
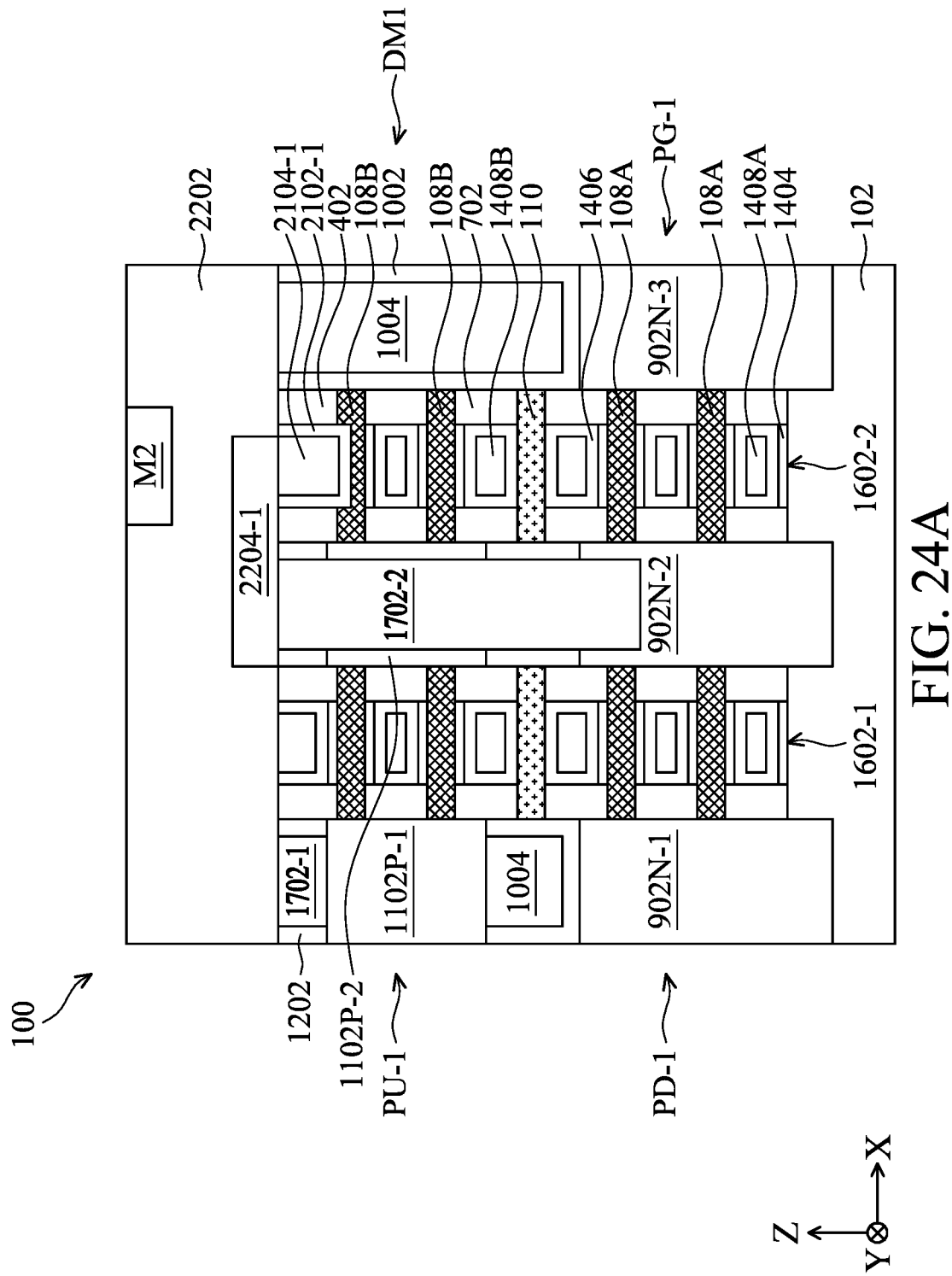
Figure 24B:
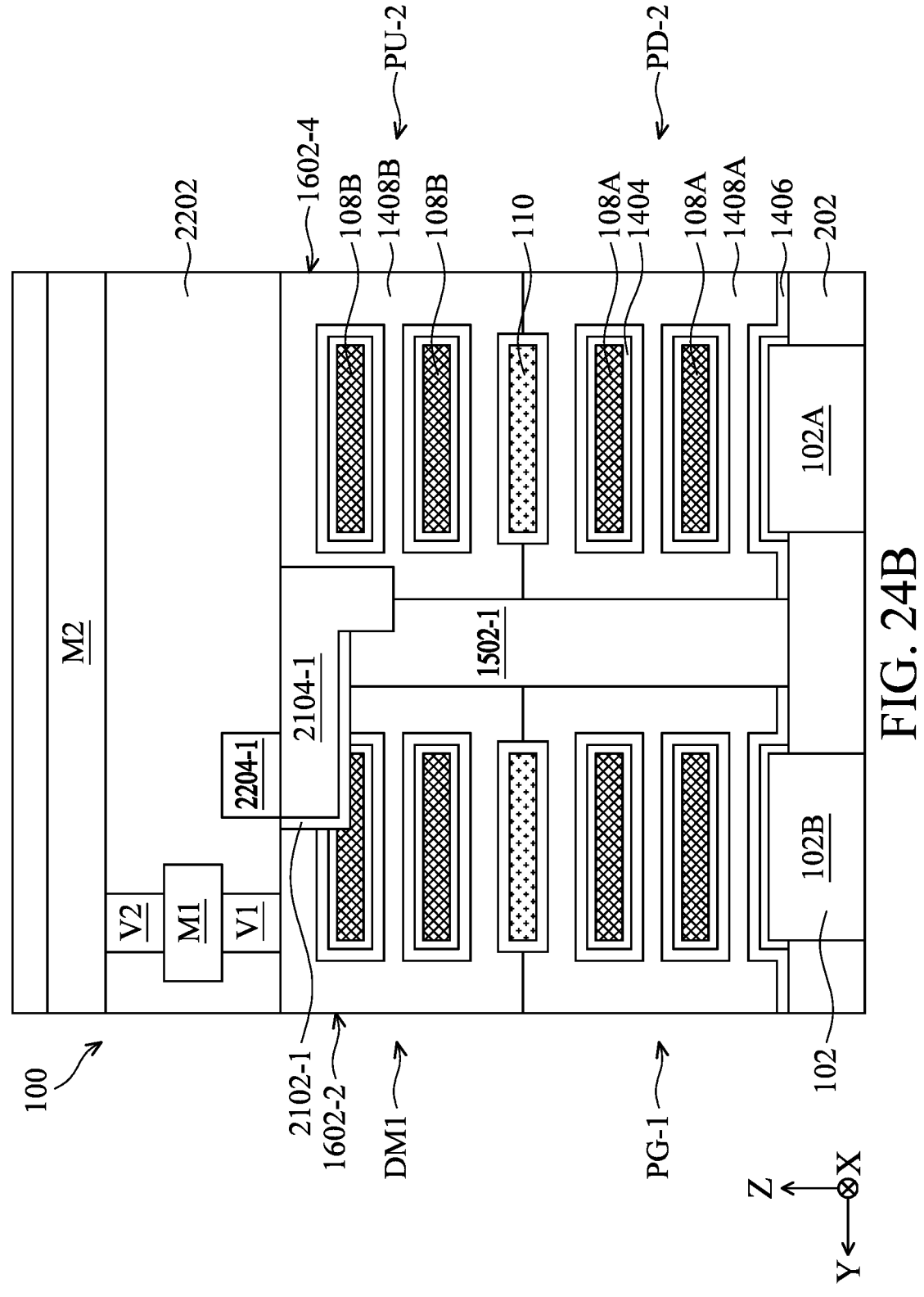

Referring to FIGS. 24A and 24B, a front-side interconnection structure is formed over the SRAM cell 100. The front-side interconnection structure includes an ILD layer 2202, butt contacts 2204 (including butt contacts 2204-1 and 2204-2), vias V1 to V4, and metal conductors M1 to M4. The ILD layer 2202 is formed over the gate structure 1602 and the connection structures 2104. The ILD layer 2202 includes a material similar to the material of the ILD layers 1004 and 1204 discussed above. The butt contacts are formed in the ILD layer 2202 and extend in the X-direction. As shown in FIGS. 24B and 27D, the butt contact 2204-1 is formed directly over the connection structure 2104-1 and the gate structures 1602-2, and the butt contact 2204-2 is formed directly over the connection structure 2104-2 and the gate structures 1602-3. The butt contact 2204-1 is electrically connected to the connection structure 2104-1 and the source/drain contact 1702-2, and the butt contact 2204-2 is electrically connected to the connection structure 2104-2 and the source/drain contact 1702-3. As such, the butt contact 2204-1 is further electrically connected to the source/drain features 1102P-2 and 902N-2, and the butt contact 2204-2 is further electrically connected to the source/drain features 1102P-3 and 902N-5, as shown in FIGS. 24A and 27C. Therefore, the gate structure 1602-4 (shared by the pull-up transistor PU-2 and the pull-down transistor PD-2) is electrically connected to the source/drain features 1102P-2 and 902N-2 through the connection structure 2104-1, butt contact 2204-1, and the source/drain contact 1702-2, and the gate structure 1602-1 (shared by the pull-up transistor PU-1 and the pull-down transistor PD-1) is electrically connected to the source/drain features 1102P-3 and 902N-5 through the connection structure 2104-2, butt contact 2204-2, and the source/drain contact 1702-3, which form circuit connections of the SRAM cell 100 discussed in FIGS. 2 and 3.

The vias V1 to V4 and the metal conductors M1 to M4 are formed in the ILD layer 2202. As shown in FIGS. 24B and 27D, the vias V1 and V2 and the metal conductors M1 and M2 are formed over and electrically connected to the gate structure 1602-2, and the vias V3 and V4 and the metal conductors M3 and M4 are formed over and electrically connected to the gate structure 1602-3. The metal conductors M2 and M4 extend in the Y-direction. Further, the metal conductor M2 overlaps the gate structures 1602-2 and 1602-4, and the connection structure 2104-1 in the Z-direction, and the metal conductor M4 overlaps the gate structures 1602-1 and 1602-3, and the connection structure 2104-2 in the Z-direction. The metal conductors M2 and M4 serve as the word lines WL discussed above that connected to the gate structure 1602-2 of the pass-gate transistor PG-1 and the gate structure 1602-3 of the pass-gate transistor PG-2, respectively. The materials of the vias 2512 and 2514, and the metal conductors 2510 are selected from a group consisting of titanium (Ti), titanium nitride (TiN), tantalum (Ta), tantalum nitride (TaN), titanium aluminum nitride (TiAlN), tungsten nitride (WN), tungsten (W), cobalt (Co), molybdenum (Mo), ruthenium (Ru), platinum (Pt), aluminum (Al), copper (Cu), other conductive materials, or a combination thereof.

Figure 25A:
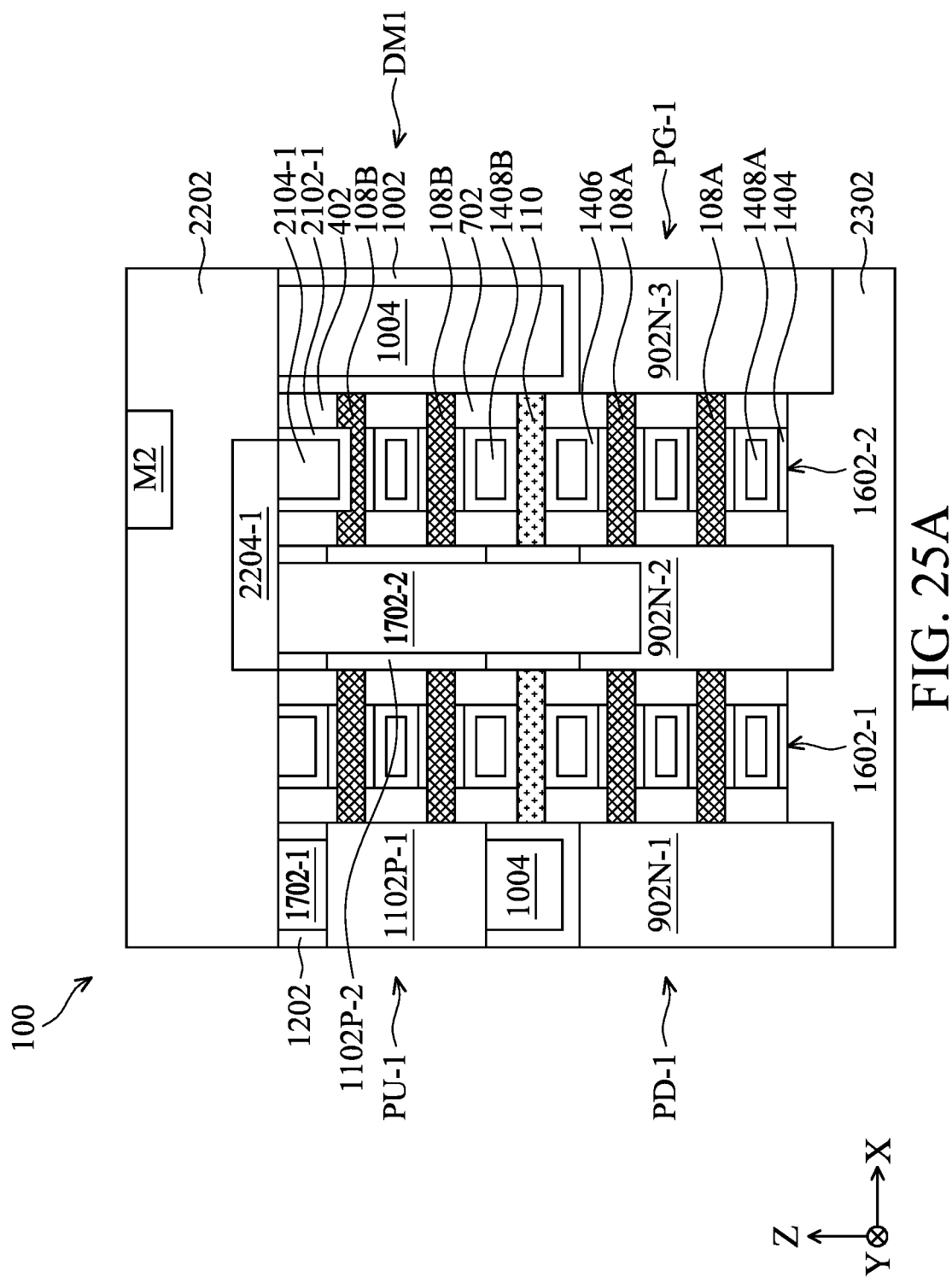
Figure 25B:
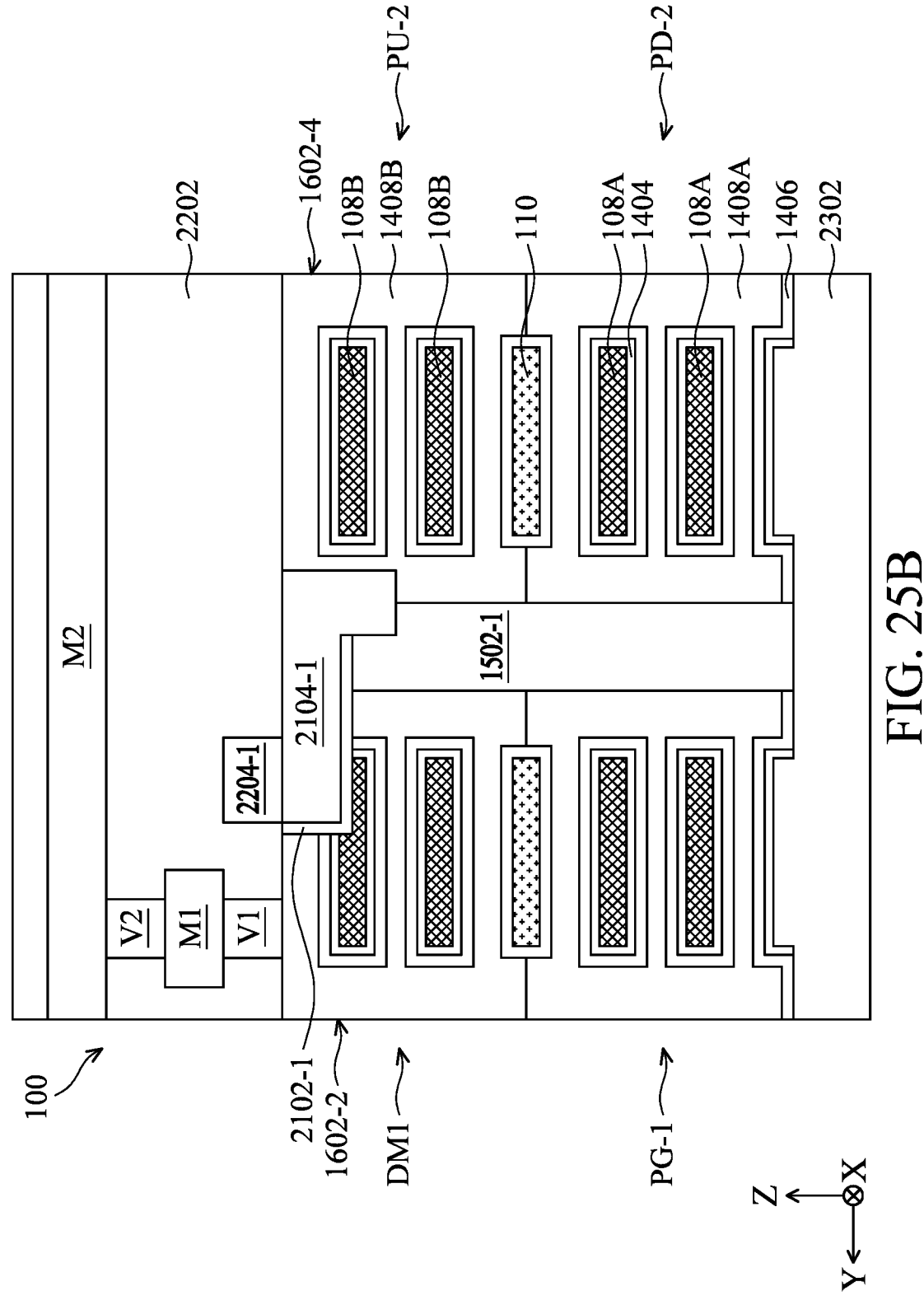

After the formation of the front-side interconnection structure, the SRAM cell 100 may be flipped to form a back-side interconnection structure. For the purpose of simplicity, the sequent figures are shown without being flipped. Referring to FIGS. 25A and 25B, the substrate 102 and the isolation structure 202 are removed. More specifically, one or more selective etching processes are performed that selectively etch the substrate 102 and the isolation structures 202, with minimal (or no) etching of the gate structures 1602, the source/drain features 902N, the inner spacers 702, and the dielectric structures 1502. The selective etching process is a dry etching process, a wet etching process, other suitable etching process, or combinations thereof. Still referring to FIGS. 25A and 25B, a (back-side) ILD layer 2302 is then formed under the gate structures 1602, the source/drain features 902N, the inner spacers 702, and the dielectric structures 1502 after the removal of the substrate 102 and the isolation structure 202. The ILD layer 2302 includes a material similar to the material of the ILD layers 1004 and 1204 discussed above.

Figure 26:
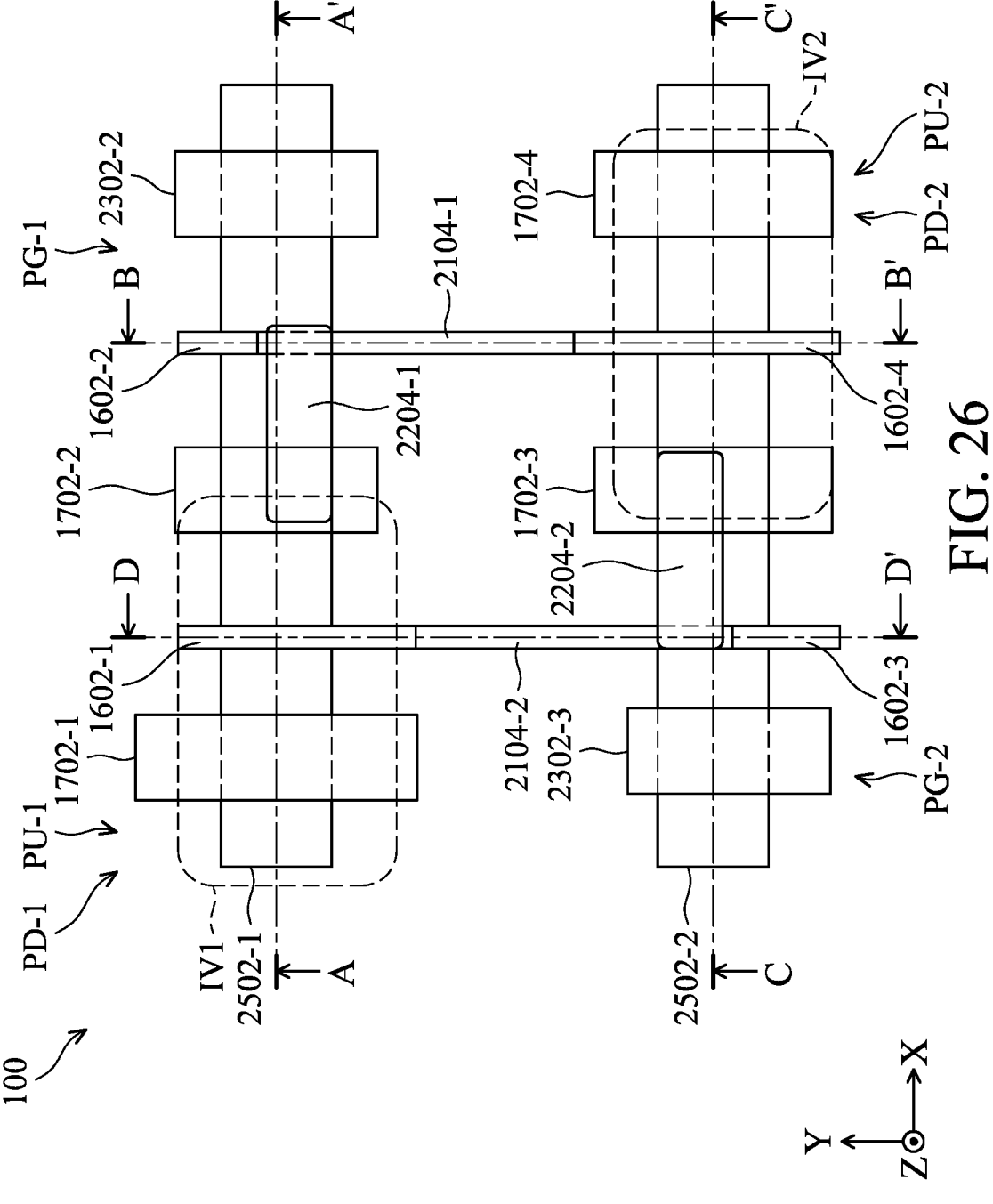
FIG. 26 is a fragmentary diagrammatic top view (or layout) of the SRAM cell at a fabrication stage, in accordance with some embodiments of the present disclosure.

FIG. 26 is a fragmentary diagrammatic top view (or layout) of the SRAM cell 100 at a fabrication stage, in accordance with some embodiments of the present disclosure. FIG. 27A is an X-Z cross-sectional view of the SRAM cell 100 at the fabrication stages along a line A-A' of FIGS. 5 and 26, in accordance with some embodiments of the present disclosure. FIG. 27B is a Y-Z cross-sectional view of the SRAM cell 100 at the fabrication stages along a line B-B' of FIGS. 5 and 26, in accordance with some embodiments of the present disclosure. FIG. 27C is an X-Z cross-sectional view of the SRAM cell 100 at the fabrication stages along a line C-C' of FIGS. 5 and 26, in accordance with some embodiments of the present disclosure. FIG. 27D is a Y-Z cross-sectional view of the SRAM cell 100 at the fabrication stages along a line D-D' of FIGS. 5 and 26, in accordance with some embodiments of the present disclosure.

Referring to FIGS. 26 and 27A to 27D, (back-side) source/drain contacts 2402 (including source/drain contacts 2402-1 to 2402-4) are formed in the ILD layer 2302 and under the SRAM cell 100. More specifically, the source/drain contacts 2402-1, 2402-2, 2402-3, and 2402-4 are respectively formed under and are respectively electrically connected to the source/drain feature 902N-1 of the pull-down transistor PD-1, the source/drain feature 902N-3 of the pass-gate transistor PG-1, the source/drain feature 902N-4 of the pass-gate transistor PG-2, and the source/drain feature 902N-6 of the pull-down transistor PD-2, as shown in FIGS. 27A and 27C. The source/drain contacts 2402 may include conductive material, such as Al, Cu, W, Co, Ti, Ta, Ru, Rh, Ir, Pt, TiN, TiAl, TiAlN, TaN, TaC, combinations of these, or the like, although any suitable material may be deposited using a deposition process such as sputtering, CVD, electroplating, electroless plating, or the like. In some embodiments, the source/drain contacts 2402 may include single conductive material layer or multiple conductive layers. It should be noted that more additional vias and metal conductors may be formed in the ILD layers 2202 and 2302 and electrically connected to the source/drain contacts 1702 and 2402. In some embodiments, metal conductors serving as the bit line BL and the bit line bar BLB discussed above are electrically connected to the source/drain contacts 2402-2 and 2402-3, respectively. In some embodiments, metal conductors electrically coupled to a voltage source $V_{DD}$ are electrically connected to the source/drain contacts 1702-1 and 1702-4, and metal conductors electrically coupled to a voltage source $V_{SS}$ are electrically connected to the source/drain contacts 2402-1 and 2402-4.

As shown in FIG. 26, the gate structure 1602-1 engages an active area 2502-1 to form the pull-down transistor PD-1 and the pull-up transistor PU-1, and the gate structure 1602-2 engages the active area 2502-1 to form the pass-gate transistor PG-1; and the gate structure 1602-4 engages an active area 2502-2 to form the pull-down transistor PD-2 and the pull-up transistor PU-2, and the gate structure 1602-3 engages the active area 2502-2 to form the pass-gate transistor PG-2. In some aspects, the pull-down transistor PD-1 and the pull-up transistor PU-1 share the gate structure 1602-1 to construct a inverter IV1 (as the Inverter-1 discussed above), and the pull-down transistor PD-2 and the pull-up transistor PU-2 share the gate structure 1602-4 to construct a inverter IV2 (as the Inverter-2 discussed above).

In some embodiments, in the top view of FIG. 26, the gate structure 1602-1 is aligned with the gate structure 1602-3 in the Y-direction, and the gate structure 1602-2 is aligned with the gate structure 1602-4 in the Y-direction. Further, the connection structure 2104-1 overlaps the gate structures 1602-2 and 1602-4 in the top view, and the connection structure 2104-2 overlaps the gate structures 1602-1 and 1602-3 in the top view. As shown in the top view of FIG. 26, the butt contact 2204-1 overlaps the connection structure 2104-1 and the gate structure 1602-2, and the butt contact 2204-2 overlaps the connection structure 2104-2 and the gate structure 1602-3.

The connection structures 2104 enable the butt contacts 2204 to be formed directly over the gate structures 1602-2 and 1602-3 rather than over the gate structures 1602-1 and 1602-4. As such, in the top view of FIG. 26, the gate structures 1602-1 and 1602-4 do not require additional extensions in the Y-direction, and the butt contacts 2204 do not require to be formed between the active areas 2502 in the Y-direction. Therefore, the space or distance between the active areas 2502 in the Y-direction may be designed to be smaller, thereby decreasing layout area or footprint of the SRAM cell 100.

Figure 28:
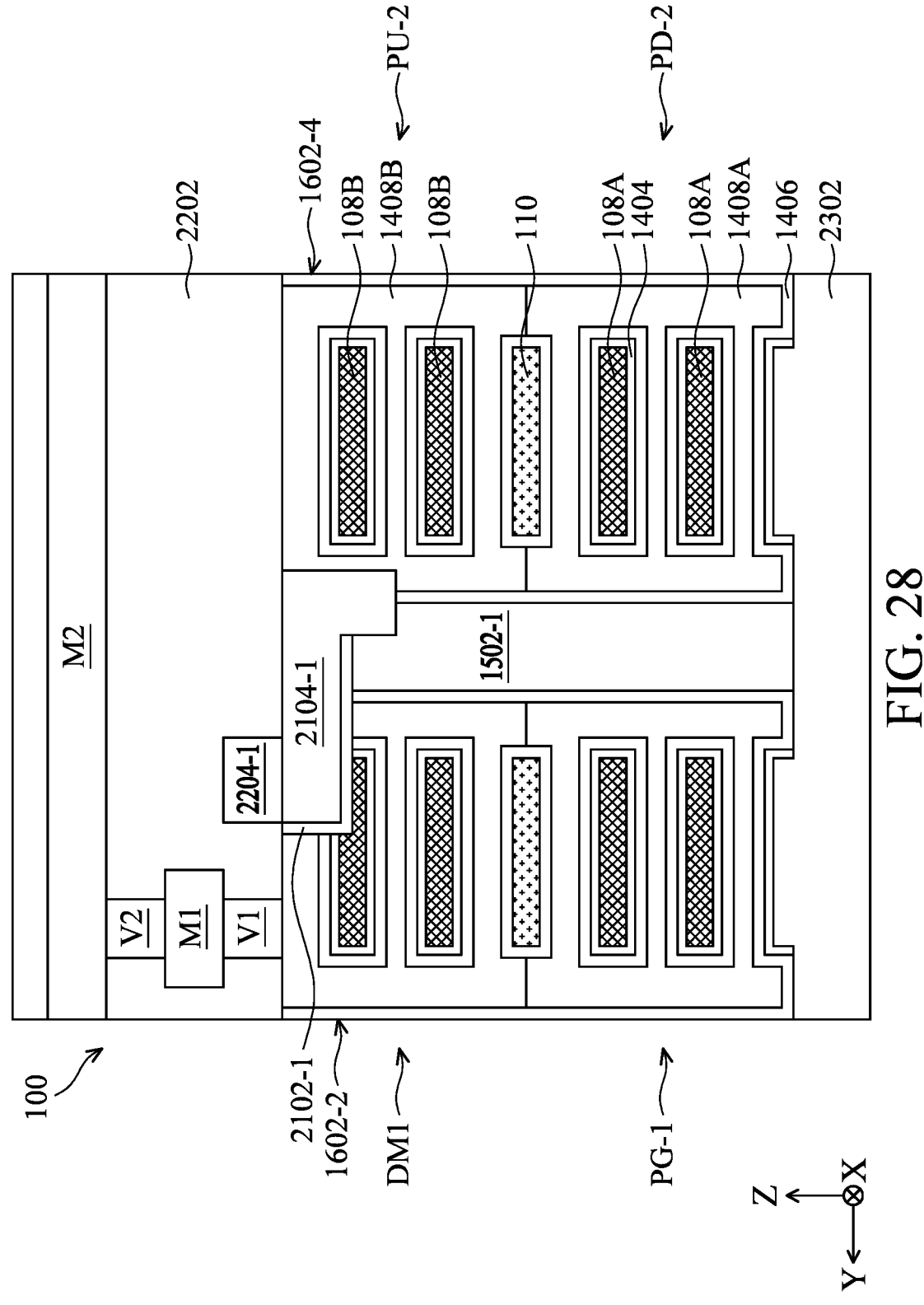
FIG. 28 is a Y-Z cross-sectional view of the SRAM cell at the fabrication stages along a line B-B' of FIGS. 5 and 26, in accordance with some alternative embodiments of the present disclosure.

FIG. 28 is a Y-Z cross-sectional view of the SRAM cell 100 at the fabrication stages along a line B-B' of FIGS. 5 and 26, in accordance with some alternative embodiments of the present disclosure. Referring back to FIGS. 16B and 18B, the dielectric structures 1502 are formed after the formation of the gate structures 1402 and the removal of the dummy gate structures 302. In some embodiments, the dielectric structures 1502 are formed before the removal of the dummy gate structures 302. As such, during the formation of the gate structures 1602, the gate dielectric layers 1406 are further formed on sidewalls of the dielectric structures 1502, as shown in FIG. 28. Further, in such embodiments of FIG. 28, a bottom surface of the connection structure 2104-1 is in contact with the gate dielectric layer 1406 of the gate structure 1602-4. It should be noted that a bottom surface of the connection structure 2104-2 is in contact with the gate dielectric layer 1406 of the gate structure 1602-1 in such embodiments of FIG. 28. As shown in FIG. 28, the liner layer 2102-1 (or 2102-2) may be in contact with the gate dielectric layer 1406 of the gate structure 1602-2 (or 1602-3).

Figure 29A:
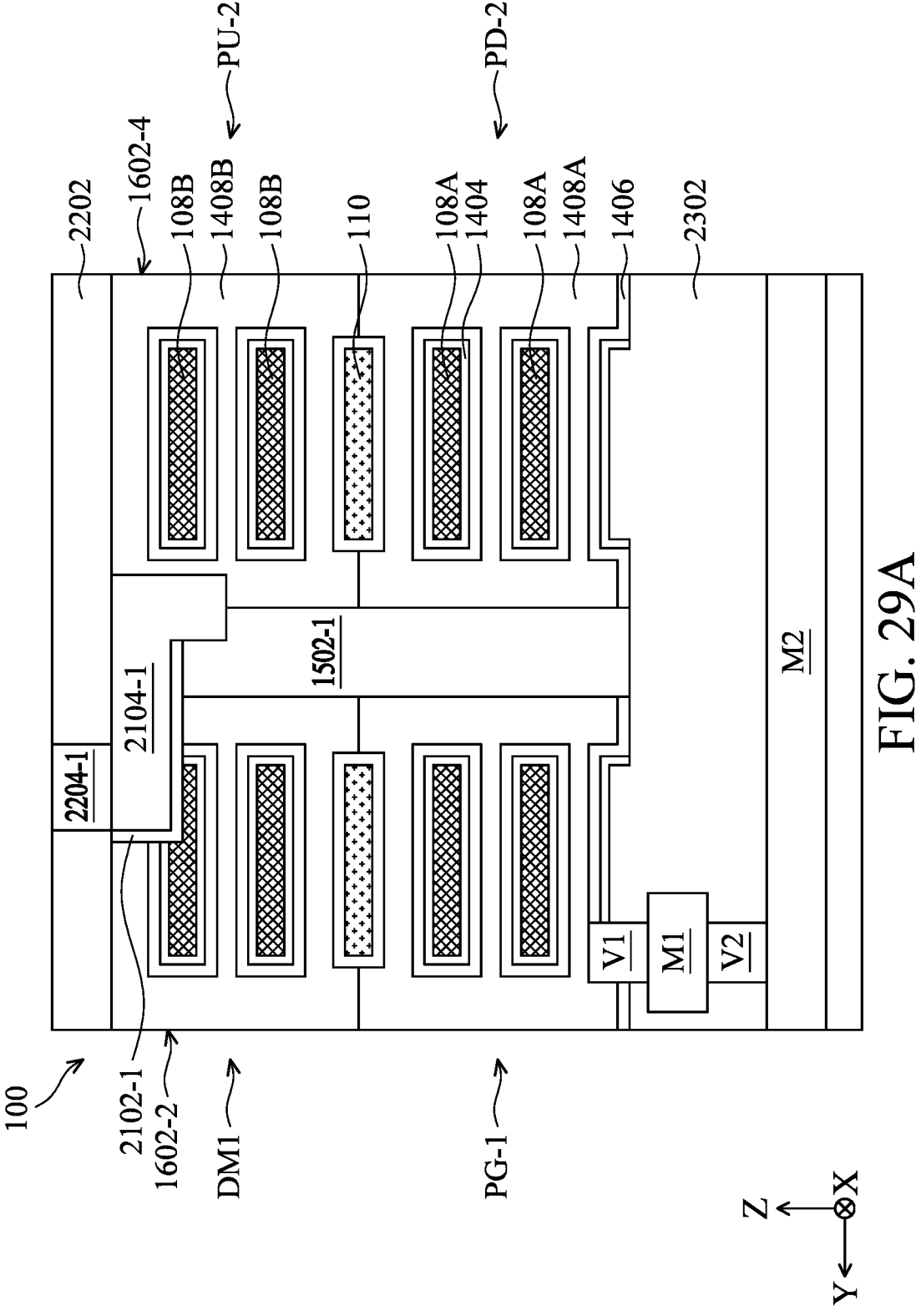
FIGS. 29A, 29B, and 29C are Y-Z cross-sectional views of the SRAM cell at the fabrication stages along a line B-B' of FIGS. 5 and 26, in accordance with some alternative embodiments of the present disclosure.
Figure 29B:
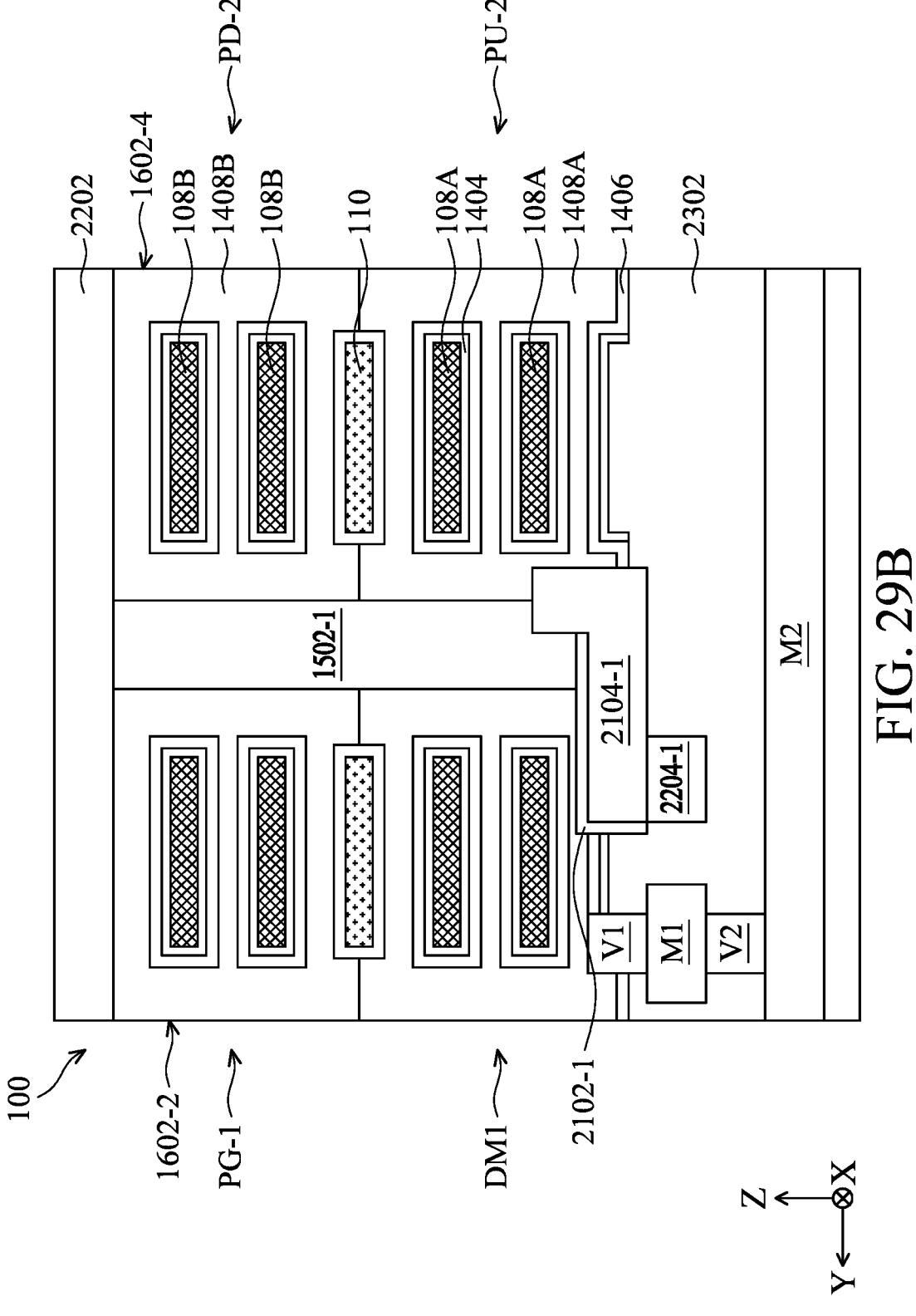
Figure 29C:
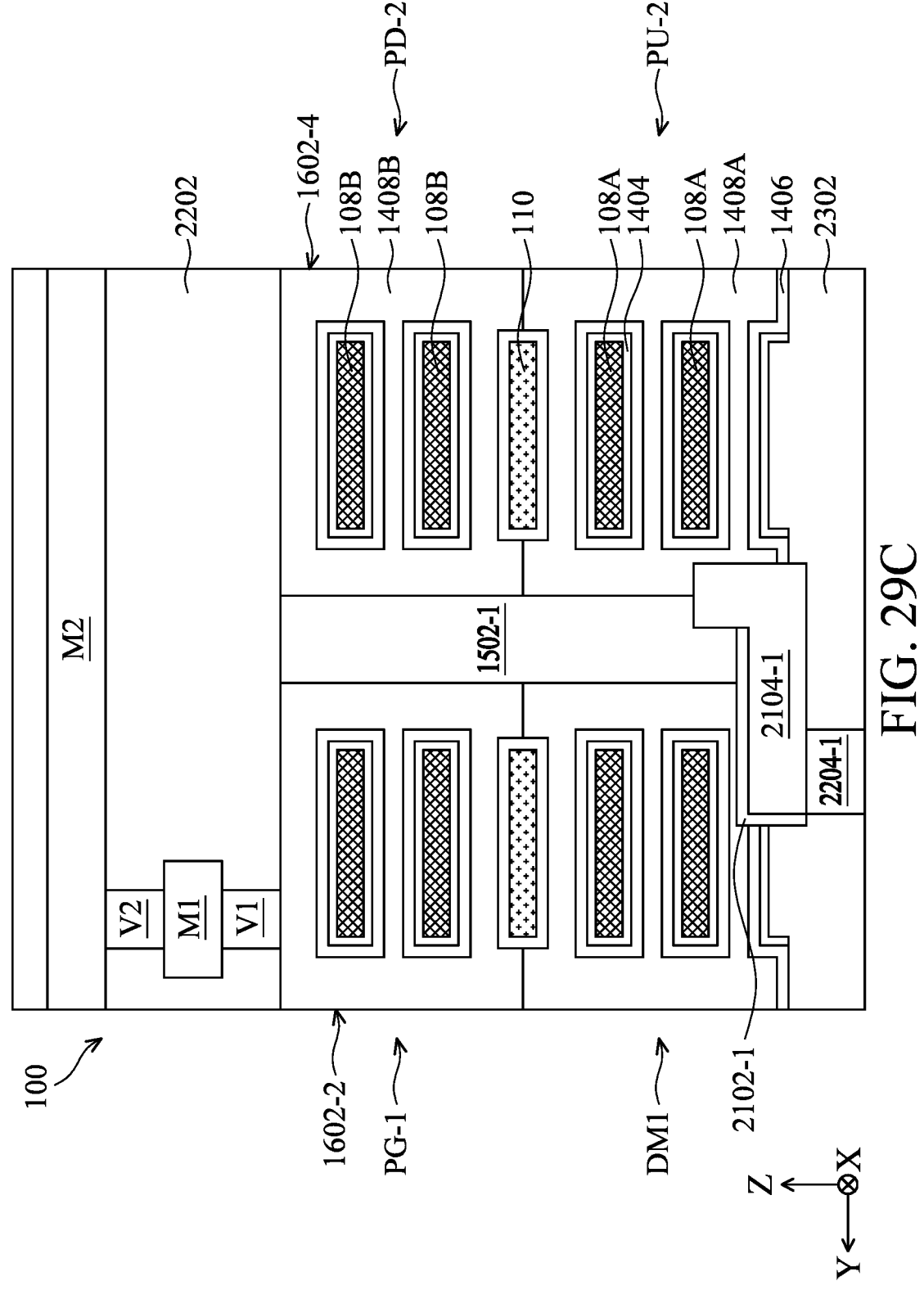

FIGS. 29A to 29C are Y-Z cross-sectional views of the SRAM cell 100 at the fabrication stages along a line B-B' of FIGS. 5 and 26, in accordance with some alternative embodiments of the present disclosure. Referring back to FIGS. 27B and 27D, the connection structure 2104-1 is formed over and in contact with a top surface of the gate structure 1602-4, and the connection structure 2104-2 is formed over and in contact with a top surface of the gate structure 1602-1. The butt contact 2204-1 is formed directly over the connection structure 2104-1 and gate structure 1602-2, and the butt contact 2204-2 is formed directly over the connection structure 2104-2 and gate structure 1602-3. Further, the metal conductor M2 is formed over the gate structures 1602-2 and 1602-4, the connection structure 2104-1, and the butt contact 2204-1, and electrically connected to the gate structure 1602-4 through the via V2, the metal conductor M1, and the via V1; and the metal conductor M4 is formed over the gate structures 1602-1 and 1602-3, the connection structure 2104-2, and the butt contact 2204-2, and electrically connected to the gate structure 1602-3 through the via V4, the metal conductor M3, and the via V3. In other words, these features are formed on the front-side of the SRAM cell 100. Further, as shown in 27B and 27D, the dummy transistors DM1 and DM2 are respectively stacked over the pass-gate transistors PG-1 and PG-2 in the Z-direction, and the pull-up transistors PU-1 and PU-2 are respectively stacked over the pull-down transistors PD-1 and PD-2 in the Z-direction.

In some embodiments, these features may be formed on the front-side or the back-side of the SRAM cell 100. For example, in the FIG. 29A, the metal conductor M2 is formed under the gate structures 1602-2 and 1602-4, the connection structure 2104-1, and the butt contact 2204-1, and electrically connected to the gate structure 1602-4 through the via V2, the metal conductor M1, and the via V1, while the connection structure 2104-1 remains over and in contact with the top surface of the gate structure 1602-4. Further, as shown in FIG. 29A, the dummy transistor DM1 is stacked over the pass-gate transistor PG-1 in the Z-direction, and the pull-up transistor PU-2 is stacked over the pull-down transistor PD-2 in the Z-direction.

For another example, in the FIG. 29B, the metal conductor M2 is formed under the gate structures 1602-2 and 1602-4, the connection structure 2104-1, and the butt contact 2204-1, and electrically connected to the gate structure 1602-4 through the via V2, the metal conductor M1, and the via V1, while the connection structure 2104-1 is also formed under and in contact with a bottom surface of the gate structure 1602-4, and the butt contact 2204-1 is formed under the connection structure 2104-1 and the gate structure 1602-2. Further, as shown in FIG. 29B, the pass-gate transistor PG-1 is stacked over the dummy transistor DM1 in the Z-direction, and the pull-down transistor PD-2 is stacked over the pull-up transistor PU-2 in the Z-direction.

For yet another example, in the FIG. 29C, the metal conductor M2 remains over the gate structures 1602-2 and 1602-4, the connection structure 2104-1, and the butt contact 2204-1, and electrically connected to the gate structure 1602-4 through the via V2, the metal conductor M1, and the via V1, while the connection structure 2104-1 is formed under and in contact with the bottom surface of the gate structure 1602-4, and the butt contact 2204-1 is formed under the connection structure 2104-1 and the gate structure 1602-2. Further, as shown in FIG. 29C, the pass-gate transistor PG-1 is stacked over the dummy transistor DM1 in the Z-direction, and the pull-down transistor PD-2 is stacked over the pull-up transistor PU-2 in the Z-direction. It should be understood that the other metal conductors M4, connection structures 2104-2, and the butt contact 2204-2 may also be formed on the back-side of the SRAM cell 100.

FIGS. 30A to 30D are Y-Z cross-sectional views of the SRAM cell 100 at the fabrication stages along a line B-B' of FIGS. 5 and 26, in accordance with some alternative embodiments of the present disclosure. Referring back to FIG. 27B, the bottom surface (or the bottommost surface) of the connection structure 2104-1 is in contact with the dielectric structure 1502-1 and the gate structure 1602-4.

Figure 30A:
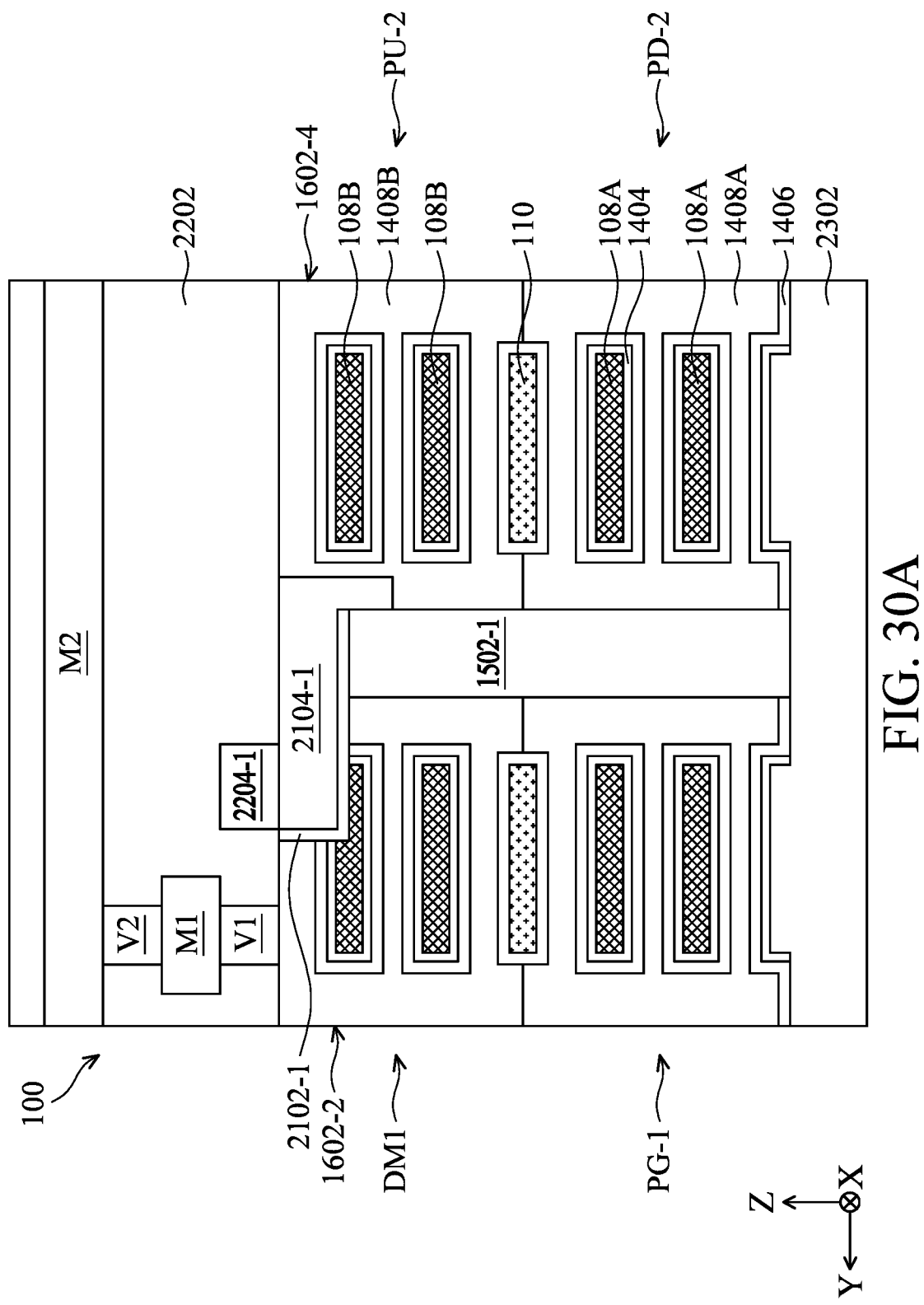
FIGS. 30A, 30B, 30C, and 30D are Y-Z cross-sectional views of the SRAM cell at the fabrication stages along a line B-B' of FIGS. 5 and 26, in accordance with some alternative embodiments of the present disclosure.

In some embodiments of FIG. 30A, the bottommost surface of the connection structure 2104-1 is fully in contact with the gate structure 1602-4 without in contact with the dielectric structure 1502-1.

Figure 30B:
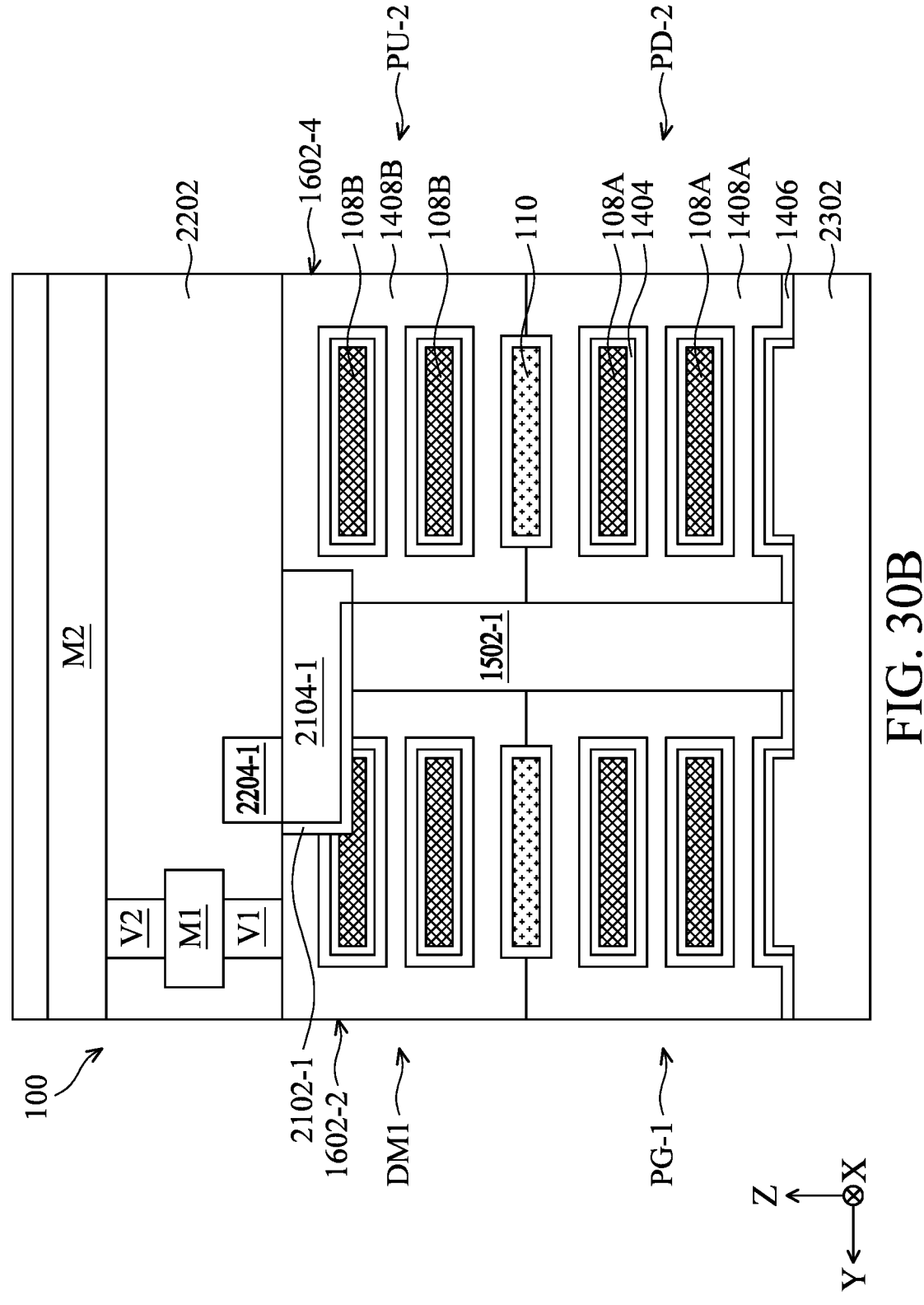

In some embodiments of FIG. 30B, the bottommost surface of the connection structure 2104-1 is substantially level with a bottom surface of the liner layer 2102-1 and the connection structure 2104-1 is not in contact with a sidewall of the dielectric structure 1502-1.

Figure 30C:
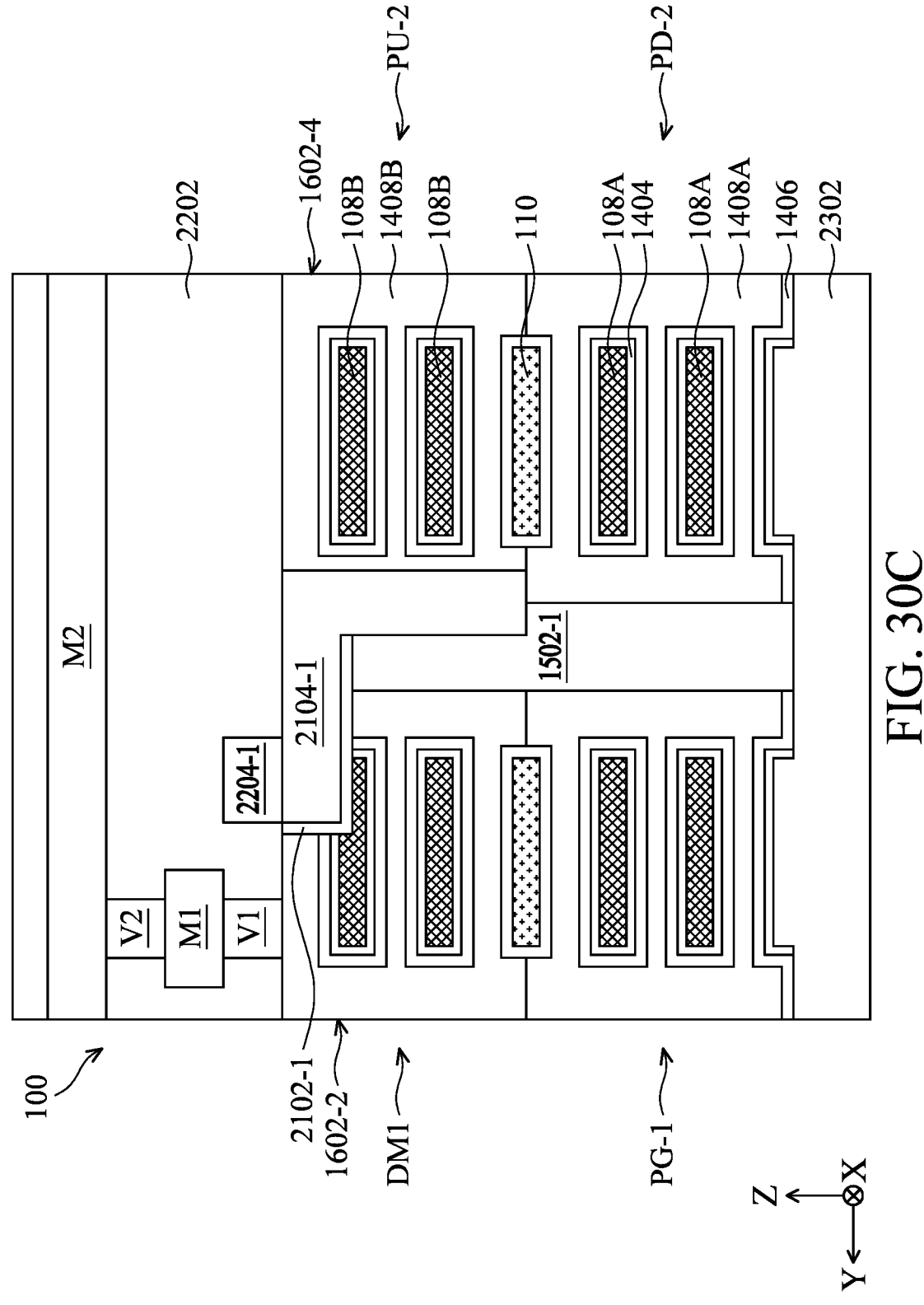

In some embodiments of FIG. 30C, the bottommost surface of the connection structure 2104-1 is in contact with the dielectric structure 1502-1 and a top surface of the gate electrode 1408A of the gate structure 1602-4, and lower than a bottommost surface of the semiconductor layers 108B of the pull-up transistor PU-2.

Figure 30D:
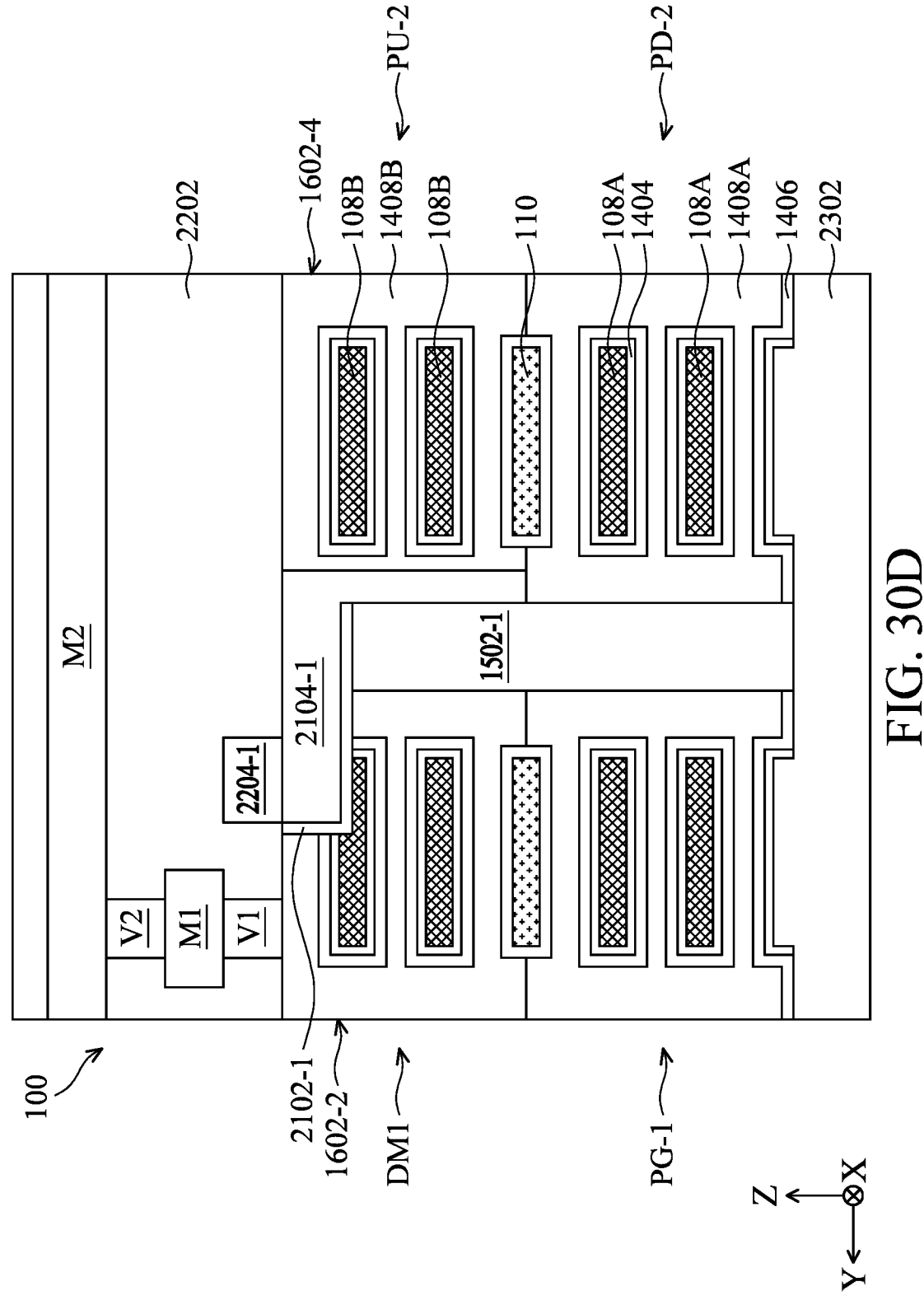

In some embodiments of FIG. 30D, the bottommost surface of the connection structure 2104-1 is fully in contact with the top surface of the gate electrode 1408A of the gate structure 1602-4, and lower than a bottommost surface of the semiconductor layers 108B of the pull-up transistor PU-2, without in contact with the dielectric structure 1502-1.

The embodiments disclosed herein relate to memory structures and their manufacturing methods, and more particularly to methods and memory structures including connection structures that enable butt contacts to be formed over gate structures of pass-gate transistors in an SRAM cell constructed by CFETs. Furthermore, the present embodiments provide one or more of the following advantages. The butt contacts formed over the gate structures of the pass-gate transistors in the SRAM cell constructed by the CFETs provides smaller layout area or footprint of the SRAM cells, which increasing the device density of the array of the SRAM cells.

Thus, one of the embodiments of the present disclosure describes a memory structure that includes a pull-down transistor and a pull-up transistor stacked vertically in a Z-direction, a pass-gate transistor and a dummy transistor stacked vertically in the Z-direction, a dielectric structure, a connection structure, and a butt contact. The pull-down transistor and the pull-up transistor share a first gate structure. The pass-gate transistor and the dummy transistor share a second gate structure. The dielectric structure is between the first gate structure and the second gate structure in a Y-direction. The connection structure is over and electrically connected to the first gate structure and over and electrically isolated from the second gate structure. The connection structure is an L-shape in a Y-Z cross-sectional view. The butt contact directly is over the connection structure and the second gate structure. The butt contact is electrically connected to the connection structure and a source/drain feature of the pass-gate transistor.

In some embodiments, each of the pull-down transistor, the pull-up transistor, the pass-gate transistor, and the dummy transistor includes nanostructures stacked vertically in the Z-direction. The nanostructures of the pull-down transistor and the pull-up transistor are wrapped around by the first gate structure. The nanostructures of the pass-gate transistor and the dummy transistor are wrapped around by the second gate structure.

In some embodiments, the memory structure further includes a liner layer between the connection structure and the second gate structure.

In some embodiments, a bottom surface of the connection structure in contact with the liner layer is lower than a topmost surface of the nanostructures of the dummy transistor.

In some embodiments, each of the first gate structure and the second gate structure further includes a gate dielectric layer wrapping around the nanostructures and on sidewalls of the dielectric structure. A bottom surface of the connection structure is in contact with the gate dielectric layer of the first gate structure.

In some embodiments, the connection structure is in contact with a sidewall of the dielectric structure.

In some embodiments, a bottom surface of the connection structure is in contact with the dielectric structure.

In some embodiments, the memory structure further includes a metal conductor over the first gate structure, the second gate structure, and the connection structure. The metal conductor is electrically connected to the second gate structure.

In some embodiments, the memory structure further includes a metal conductor under the first gate structure, the second gate structure, and the connection structure. The metal conductor is electrically connected to the second gate structure.

In some embodiments, a height of a sidewall of the connection structure in contact with the first gate structure is in a range from about 5 nm to about 20 nm.

In another of the embodiments, discussed is a memory structure including a first pull-down transistor and a first pull-up transistor sharing a first gate structure, a first pass-gate transistor, a second pull-down transistor and a second pull-up transistor sharing a third gate structure, a second pass-gate transistor, a first connection structure, a second connection structure, a first butt contact, and a second butt contact. The first pull-down transistor and the first pull-up transistor are stacked vertically in a Z-direction. The first pass-gate transistor has a second gate structure. The first gate structure is aligned with the second gate structure in a Y-direction. The second pull-down transistor and the second pull-up transistor are stacked vertically in the Z-direction. The second pass-gate transistor has a fourth gate structure. The third gate structure is aligned with the fourth gate structure in the Y-direction. The first connection structure overlaps the first gate structure and the second gate structure in a top view. The first connection structure is electrically connected to the first gate structure and is electrically isolated from the second gate structure. The second connection structure overlaps the third gate structure and the fourth gate structure in the top view. The second connection structure is electrically connected to the third gate structure and is electrically isolated from the fourth gate structure. The first butt contact overlaps the first connection structure and the second gate structure in the top view. The second butt contact overlaps the second connection structure and the fourth gate structure in the top view. Rach of the first connection structure and the second connection structure is an L-shape in a Y-Z cross-sectional view. The first butt contact is electrically connected to the first connection structure and a source/drain feature between the second gate structure and the third gate structure. The second butt contact is electrically connected to the second connection structure and a source/drain feature between the first gate structure and the fourth gate structure.

In some embodiments, the memory structure further includes a first liner layer separating the first connection structure and the second gate structure, and a second liner layer separating the second connection structure and the fourth gate structure.

In some embodiments, thicknesses of the first liner layer and the second liner layer are in a range from about 1 nm to about 5 nm.

In some embodiments, an insulating material of the first liner layer and the second liner layer comprises $SiO_2$, $Si_3N_4$, SiON, SiCN, or SiOCN.

In some embodiments, lengths of bottommost surfaces of the first connection structure and the second connection structure are in a range from about 5 nm to about 10 nm.

In some embodiments, the first connection structure is over and in contact with a top surface of the first gate structure.

In some embodiments, the first connection structure is under and in contact with a bottom surface of the first gate structure.

In yet another of the embodiments, discussed is a method for manufacturing a memory structure that includes forming a pull-down transistor, a pull-up transistor, a pass-gate transistor, and a dummy transistor, wherein the pull-down transistor and the pull-up transistor are stacked vertically in a Z-direction and share a first gate structure. The pass-gate transistor and the dummy transistor are stacked vertically in the Z-direction and share a second gate structure. The method further includes forming a dielectric structure between the first gate structure and the second gate structure in a Y-direction, recessing portions of the dielectric structure, the first gate structure, and the second gate structure to form a trench, forming a liner layer over the dielectric structure and the second gate structure exposed by the trench, forming a connection structure in the trench, wherein the connection structure is an L-shape in a Y-Z cross-sectional view, and forming a butt contact overlapping the connection structure and the second gate structure in a top view. The butt contact is electrically connected to the connection structure and a source/drain feature of the pass-gate transistor.

In some embodiments, the method further includes conformally forming an insulating material in the trench, removing a portion of the insulating material over the first gate structure to expose a top surface of the first gate structure in the trench, and filling the trench with a conductive material to form the connection structure.

In some embodiments, the method further includes forming a metal conductor extending in the Y-direction and overlapping the first gate structure, the second gate structure, and the connection structure.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A memory structure, comprising:
a pull-down transistor and a pull-up transistor stacked vertically in a Z-direction, wherein the pull-down transistor and the pull-up transistor share a first gate structure;
a pass-gate transistor and a dummy transistor stacked vertically in the Z-direction, wherein the pass-gate transistor and the dummy transistor share a second gate structure;
a dielectric structure between the first gate structure and the second gate structure in a Y-direction;
a connection structure over and electrically connected to the first gate structure and over and electrically isolated from the second gate structure, wherein the connection structure is an L-shape in a Y-Z cross-sectional view; and
a butt contact directly over the connection structure and the second gate structure, wherein the butt contact is electrically connected to the connection structure and a source/drain feature of the pass-gate transistor.

2. The memory structure of claim 1, wherein each of the pull-down transistor, the pull-up transistor, the pass-gate transistor, and the dummy transistor comprises:
nanostructures stacked vertically in the Z-direction,
wherein the nanostructures of the pull-down transistor and the pull-up transistor are wrapped around by the first gate structure, and
wherein the nanostructures of the pass-gate transistor and the dummy transistor are wrapped around by the second gate structure.

3. The memory structure of claim 2, further comprising:
a liner layer between the connection structure and the second gate structure.

4. The memory structure of claim 3, wherein a bottom surface of the connection structure in contact with the liner layer is lower than a topmost surface of the nanostructures of the dummy transistor.

5. The memory structure of claim 2, wherein each of the first gate structure and the second gate structure further comprises:
a gate dielectric layer wrapping around the nanostructures and on sidewalls of the dielectric structure, wherein a bottom surface of the connection structure is in contact with the gate dielectric layer of the first gate structure.

6. The memory structure of claim 1, wherein the connection structure is in contact with a sidewall of the dielectric structure.

7. The memory structure of claim 1, wherein a bottom surface of the connection structure is in contact with the dielectric structure.

8. The memory structure of claim 1, further comprising:

a metal conductor over the first gate structure, the second gate structure, and the connection structure, wherein the metal conductor is electrically connected to the second gate structure.

9. The memory structure of claim 1, further comprising:

a metal conductor under the first gate structure, the second gate structure, and the connection structure, wherein the metal conductor is electrically connected to the second gate structure.

10. The memory structure of claim 1, wherein a height of a sidewall of the connection structure in contact with the first gate structure is in a range from about 5 nm to about 20 nm.

11. A memory structure, comprising:

a first pull-down transistor and a first pull-up transistor sharing a first gate structure extending lengthwise in a first direction, wherein the first pull-down transistor and the first pull-up transistor are stacked vertically in a second direction perpendicular to the first direction;

a first pass-gate transistor having a second gate structure extending lengthwise in the first direction, wherein the first gate structure is aligned with the second gate structure in the first direction;

a second pull-down transistor and a second pull-up transistor sharing a third gate structure extending lengthwise in the first direction, wherein the second pull-down transistor and the second pull-up transistor are stacked vertically in the second direction;

a second pass-gate transistor having a fourth gate structure extending lengthwise in the first direction, wherein the third gate structure is aligned with the fourth gate structure in the first direction;

a first connection structure overlapping the first gate structure and the second gate structure in the second direction, wherein the first connection structure is electrically connected to the first gate structure and is electrically isolated from the second gate structure;

a second connection structure overlapping the third gate structure and the fourth gate structure in the second direction, wherein the second connection structure is electrically connected to the third gate structure and is electrically isolated from the fourth gate structure;

a first butt contact extending lengthwise in a third direction perpendicular to the first direction and the second direction and overlapping the first connection structure and the second gate structure in the top view; and a second butt contact extending lengthwise in the third direction and overlapping the second connection structure and the fourth gate structure in the top view, wherein each of the first connection structure and the second connection structure is an L-shape in a cross-sectional view, wherein the first butt contact is electrically connected to the first connection structure and a source/drain feature between the second gate structure and the third gate structure, and wherein the second butt contact is electrically connected to the second connection structure and a source/drain feature between the first gate structure and the fourth gate structure.

12. The memory structure of claim 11, further comprising:

a first liner layer separating the first connection structure and the second gate structure; and a second liner layer separating the second connection structure and the fourth gate structure.

13. The memory structure of claim 12, wherein thicknesses of the first liner layer and the second liner layer are in a range from about 1 nm to about 5 nm.

14. The memory structure of claim 12, wherein an insulating material of the first liner layer and the second liner layer comprises $SiO_2$, $Si_3N_4$, SiON, SiCN, or SiOCN.

15. The memory structure of claim 11, wherein lengths of bottommost surfaces of the first connection structure and the second connection structure are in a range from about 5 nm to about 10 nm.

16. The memory structure of claim 11, wherein the first connection structure is over and in contact with a top surface of the first gate structure.

17. The memory structure of claim 11, wherein the first connection structure is under and in contact with a bottom surface of the first gate structure.

18. A method for manufacturing a memory structure, comprising:

forming a pull-down transistor, a pull-up transistor, a pass-gate transistor, and a dummy transistor, wherein the pull-down transistor and the pull-up transistor are stacked vertically in a Z-direction and share a first gate structure, wherein the pass-gate transistor and the dummy transistor are stacked vertically in the Z-direction and share a second gate structure;

forming a dielectric structure between the first gate structure and the second gate structure in a Y-direction;

recessing portions of the dielectric structure, the first gate structure, and the second gate structure to form a trench;

forming a liner layer over the dielectric structure and the second gate structure exposed by the trench;

forming a connection structure in the trench, wherein the connection structure is an L-shape in a Y-Z cross-sectional view; and forming a butt contact overlapping the connection structure and the second gate structure in a top view, wherein the butt contact is electrically connected to the connection structure and a source/drain feature of the pass-gate transistor.

19. The method of claim 18, further comprising:

conformally forming an insulating material in the trench;

removing a portion of the insulating material over the first gate structure to expose a top surface of the first gate structure in the trench; and filling the trench with a conductive material to form the connection structure.

20. The method of claim 18, further comprising:

forming a metal conductor extending in the Y-direction and overlapping the first gate structure, the second gate structure, and the connection structure.

\* \* \* \* \*